(12) United States Patent
Suzuki et al.

(10) Patent No.: US 12,443,019 B2
(45) Date of Patent: Oct. 14, 2025

(54) DISPLAY DEVICE

(71) Applicant: Sony Group Corporation, Tokyo (JP)

(72) Inventors: Tomoaki Suzuki, Kanagawa (JP);
Yoshinori Uchida, Kanagawa (JP);
Tomohiko Shimatsu, Kanagawa (JP);
Keiji Sugi, Kanagawa (JP)

(73) Assignee: SONY GROUP CORPORATION, Tokyo (JP)

( * ) Notice: Subject to any disclaimer, the term of this patent is extended or adjusted under 35 U.S.C. 154(b) by 835 days.

(21) Appl. No.: 17/287,311

(22) PCT Filed: Nov. 27, 2019

(86) PCT No.: PCT/JP2019/046315
§ 371 (c)(1),
(2) Date: Apr. 21, 2021

(87) PCT Pub. No.: WO2020/111101
PCT Pub. Date: Jun. 4, 2020

(65) Prior Publication Data
US 2022/0115629 A1    Apr. 14, 2022

(30) Foreign Application Priority Data

Nov. 30, 2018  (JP) ................................. 2018-224586

(51) Int. Cl.
*H10K 59/38* (2023.01)
*G02B 19/00* (2006.01)
(Continued)

(52) U.S. Cl.
CPC ....... *G02B 19/0014* (2013.01); *H10K 50/858* (2023.02); *H10K 59/879* (2023.02);
(Continued)

(58) Field of Classification Search
CPC .. H10K 50/858; H10K 50/865; H10K 59/122; H10K 59/38; H10K 59/121;
(Continued)

(56) References Cited

U.S. PATENT DOCUMENTS 7,276,737 B2 * 10/2007 Camras ................ G08G 5/21
257/E33.068
2002/0084952 A1 * 7/2002 Morley ................. H10K 59/35
345/32

(Continued)

FOREIGN PATENT DOCUMENTS

CN   101262044 A   9/2008
CN   101447506 A   6/2009
(Continued)

OTHER PUBLICATIONS

International Search Report (PCT/ISA/210), International Application No. PCT/JP2019/046315, dated Jan. 8, 2020.
(Continued)

*Primary Examiner* — Sheikh Maruf
(74) *Attorney, Agent, or Firm* — Michael Best & Friedrich LLP

(57) ABSTRACT

A display device has a display panel provided with a plurality of light emitting elements 10 including a light emitting part 30, and a lens member 50 through which light emitted from the light emitting part 30 passes, in which when a distance (an offset amount) between a normal LN passing through a center of the light emitting part 30 and a normal LN' passing through a center of the lens member 50 is defined as $D_0$, a value of the distance (offset amount) $D_0$ is not 0 in at least some of the light emitting elements 10 provided in the display panel.

20 Claims, 37 Drawing Sheets

(51) Int. Cl.
*H10K 50/858* (2023.01)
*H10K 59/80* (2023.01)
*H10K 50/86* (2023.01)
*H10K 59/122* (2023.01)

(52) U.S. Cl.
CPC ....... *H10K 59/8792* (2023.02); *H10K 50/865* (2023.02); *H10K 59/122* (2023.02); *H10K 59/38* (2023.02)

(58) Field of Classification Search
CPC ............. H10K 59/879; H10K 59/8792; G02B 3/0056; G02B 19/0066; G02B 27/0172; G02B 19/0014; G02B 5/201; H05B 33/12
USPC .......................................................... 257/40
See application file for complete search history.

(56) References Cited

U.S. PATENT DOCUMENTS

| | | | | |
|---|---|---|---|---|
| 2004/0239236 | A1* | 12/2004 | Morley | H10K 59/30 |
| | | | | 313/500 |
| 2004/0263451 | A1* | 12/2004 | Muto | G02B 6/005 |
| | | | | 345/87 |
| 2005/0259193 | A1* | 11/2005 | Sumiyoshi | G02F 1/1323 |
| | | | | 349/62 |
| 2007/0268427 | A1* | 11/2007 | Uehara | G02B 6/0038 |
| | | | | 349/86 |
| 2008/0130316 | A1* | 6/2008 | Kinoshita | G02B 6/0038 |
| | | | | 430/321 |
| 2010/0085510 | A1* | 4/2010 | Okuyama | G02F 1/133615 |
| | | | | 349/187 |
| 2011/0249221 | A1* | 10/2011 | Uchida | G02F 1/133615 |
| | | | | 362/606 |
| 2012/0206916 | A1* | 8/2012 | Ohta | H10K 59/879 |
| | | | | 445/25 |
| 2012/0257139 | A1* | 10/2012 | Shinkai | G02F 1/133615 |
| | | | | 349/61 |
| 2014/0340930 | A1* | 11/2014 | Nakagome | G02B 6/0043 |
| | | | | 362/606 |
| 2015/0084026 | A1* | 3/2015 | Miyamoto | H10K 50/858 |
| | | | | 257/40 |
| 2016/0043145 | A1* | 2/2016 | Choi | H10K 50/865 |
| | | | | 257/40 |
| 2016/0064694 | A1* | 3/2016 | Choi | H10K 50/865 |
| | | | | 257/40 |
| 2016/0079311 | A1* | 3/2016 | Lim | H10K 50/858 |
| | | | | 257/40 |
| 2016/0218325 | A1* | 7/2016 | Choi | H10K 59/35 |
| 2016/0336379 | A1 | 11/2016 | Choi | |
| 2017/0133637 | A1* | 5/2017 | Kim | G02B 3/0087 |
| 2018/0182814 | A1 | 6/2018 | Kim | |
| 2018/0374905 | A1* | 12/2018 | Choi | H10K 59/35 |
| 2019/0198576 | A1* | 6/2019 | Schubert | H10K 19/20 |
| 2019/0319074 | A1* | 10/2019 | Choi | H10K 59/35 |
| 2020/0105170 | A1* | 4/2020 | Dai | H10K 59/122 |
| 2021/0184179 | A1* | 6/2021 | Kim | H10K 59/123 |
| 2021/0217995 | A1* | 7/2021 | Wang | H10K 59/12 |
| 2021/0293993 | A1* | 9/2021 | Kim | G02B 1/04 |
| 2021/0391513 | A1* | 12/2021 | Choi | G02B 19/0014 |
| 2022/0158134 | A1* | 5/2022 | Hinata | G02B 3/0043 |

FOREIGN PATENT DOCUMENTS

| | | |
|---|---|---|
| CN | 102856349 A | 1/2013 |
| CN | 103682145 A | 3/2014 |
| CN | 104049370 A | 9/2014 |
| CN | 203826395 U | 9/2014 |
| CN | 106896501 A | 6/2017 |
| CN | 107358216 A | 11/2017 |
| CN | 107852787 A | 3/2018 |
| CN | 108027528 A | 5/2018 |
| CN | 108598125 A | 9/2018 |
| JP | 2004-517488 A | 6/2004 |
| JP | 2013-16272 A | 1/2013 |
| JP | 2013-114772 A | 6/2013 |
| JP | 2013-120731 A | 6/2013 |
| JP | 2018014492 | 1/2018 |
| JP | 2019-133816 A | 8/2019 |
| KR | 20040020873 A | 3/2004 |
| KR | 20160017397 A | 2/2016 |
| KR | 20170124031 A | 11/2017 |
| KR | 20180036842 A | 4/2018 |
| WO | 2019/159641 A1 | 8/2019 |
| WO | WO-2019151278 A1 | 8/2019 |

OTHER PUBLICATIONS

Notification of Transmittal of the International Search Report and the Written Opinion of the International Searching Authority, or the Declaration (PCT/ISA/220), International Application No. PCT/JP2019/046315, dated Feb. 4, 2020.

Written Opinion of the International Search Authority (PCT/ISA/237), International Application No. PCT/JP2019/046315, dated Feb. 4, 2020.

\* cited by examiner

Fig. 3
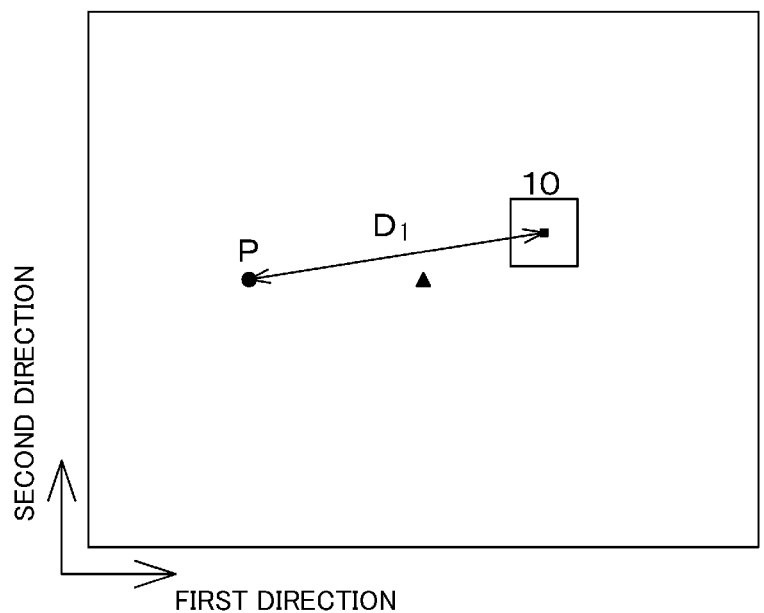
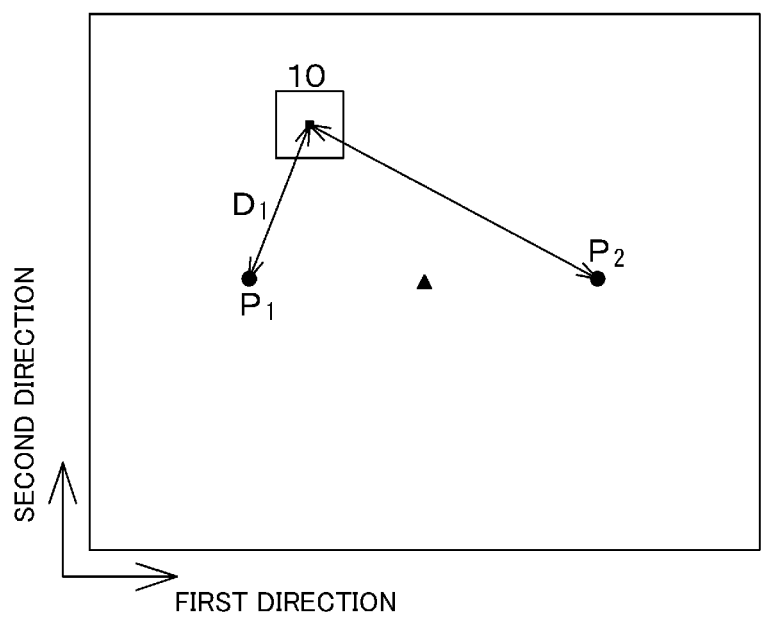

Fig. 4
A
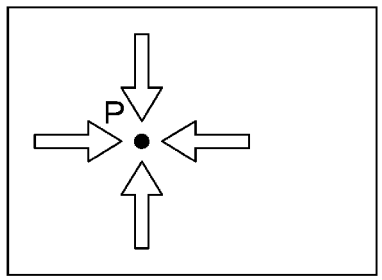
DISPLAY REGION OF DISPLAY PANEL
B
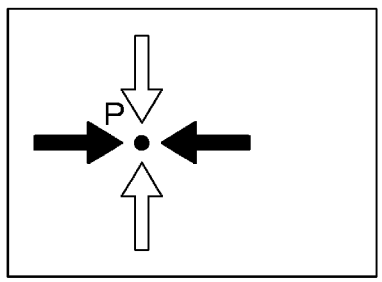
DISPLAY REGION OF DISPLAY PANEL
C
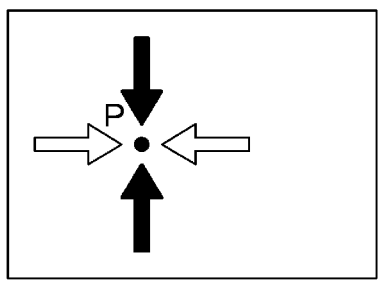
DISPLAY REGION OF DISPLAY PANEL
D
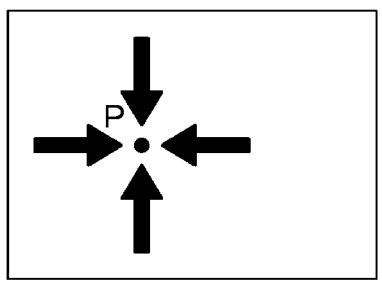
DISPLAY REGION OF DISPLAY PANEL Fig. 5
A DISPLAY REGION OF DISPLAY PANEL
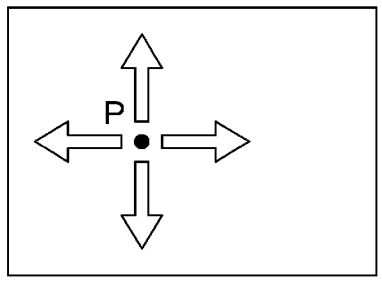
B DISPLAY REGION OF DISPLAY PANEL
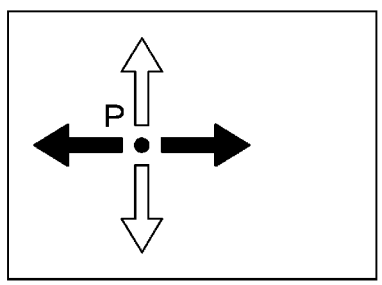
C DISPLAY REGION OF DISPLAY PANEL
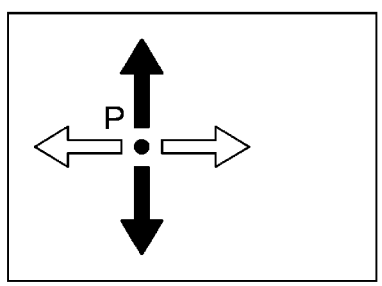
D DISPLAY REGION OF DISPLAY PANEL
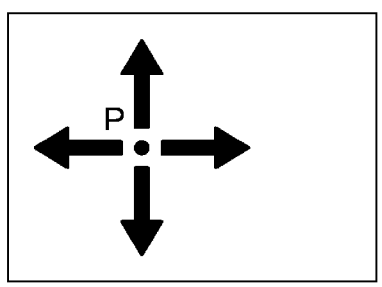

Fig. 6
A  DISPLAY REGION OF DISPLAY PANEL
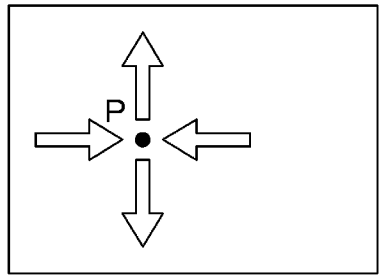
B  DISPLAY REGION OF DISPLAY PANEL
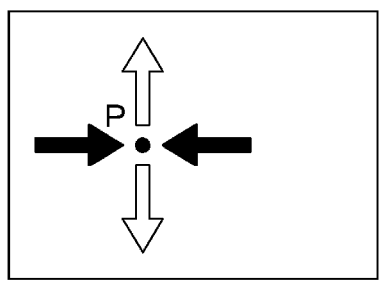
C  DISPLAY REGION OF DISPLAY PANEL
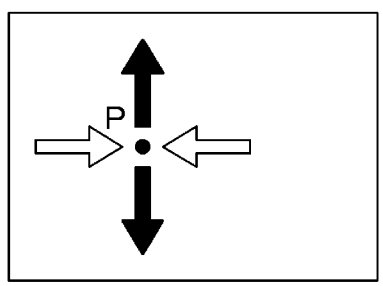
D  DISPLAY REGION OF DISPLAY PANEL
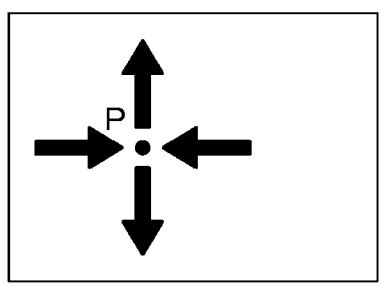

Fig. 7
A
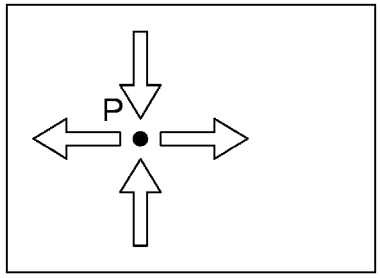
B
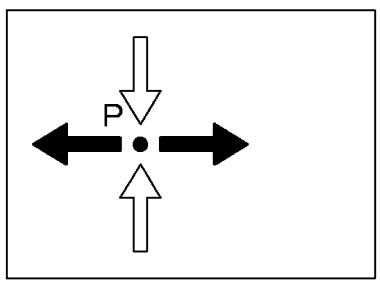
C
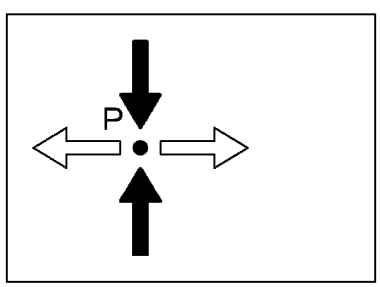
D
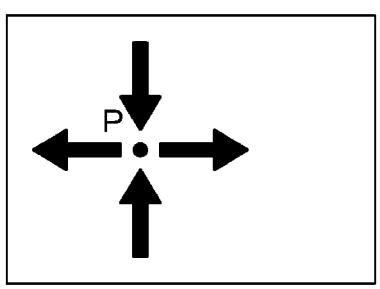

Fig. 8
A
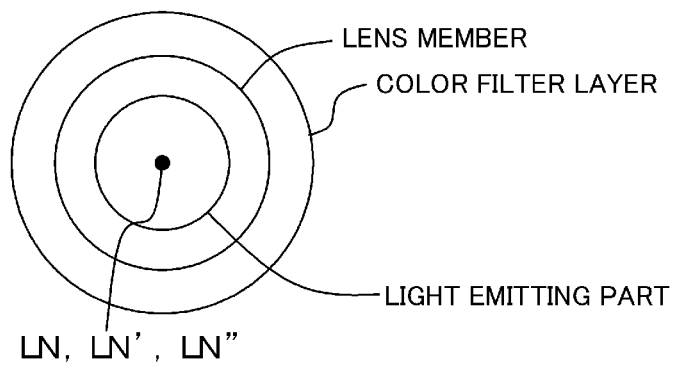
LENS MEMBER
COLOR FILTER LAYER
LIGHT EMITTING PART
LN, LN', LN"
B
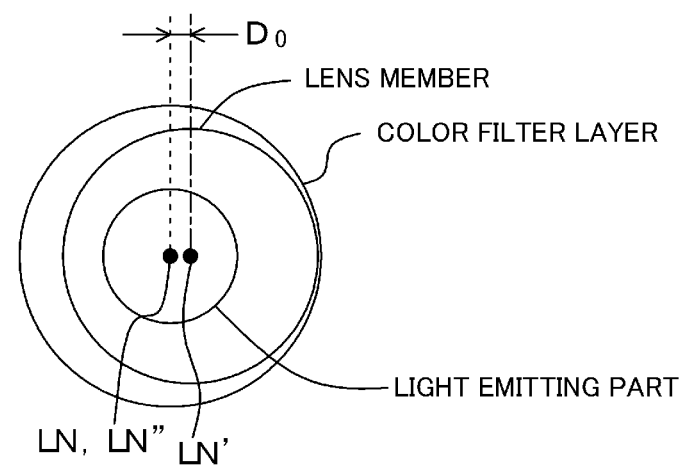
D₀
LENS MEMBER
COLOR FILTER LAYER
LIGHT EMITTING PART
LN, LN" LN'

Fig. 9
A
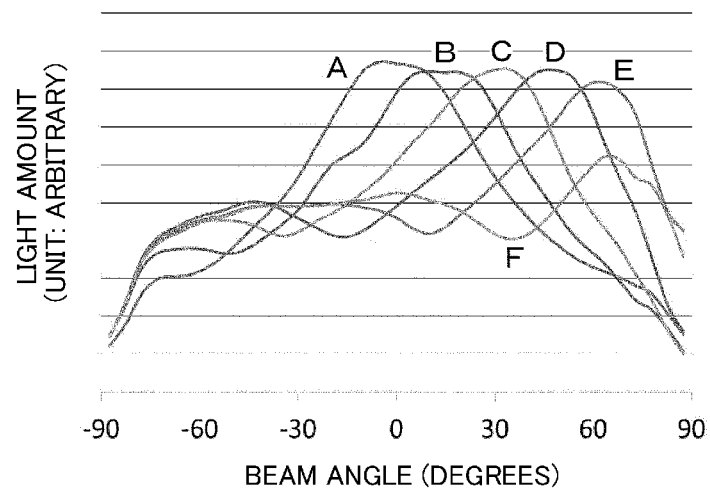
B
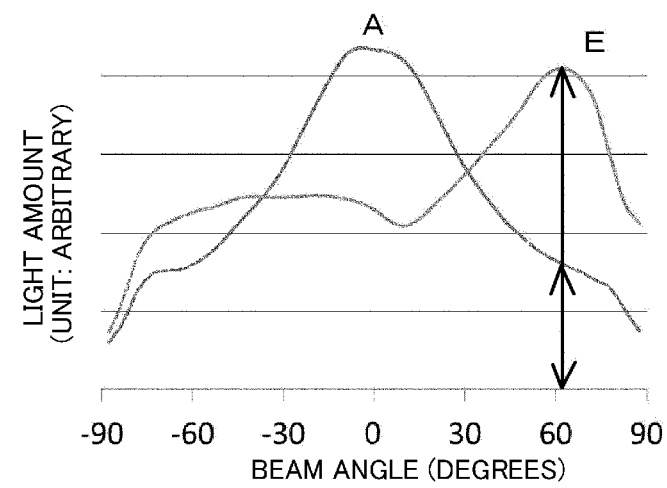

Fig. 22
A
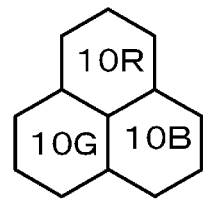
B
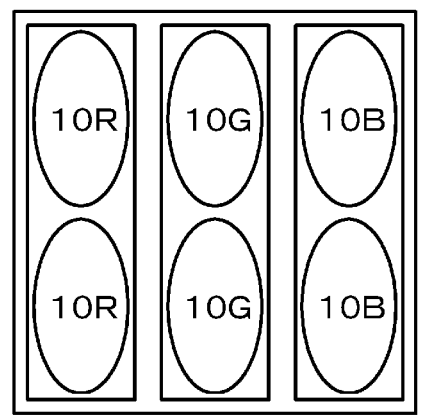
C
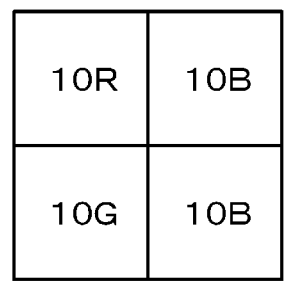
D
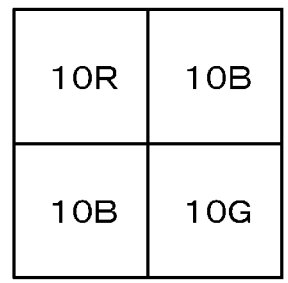

Fig. 28
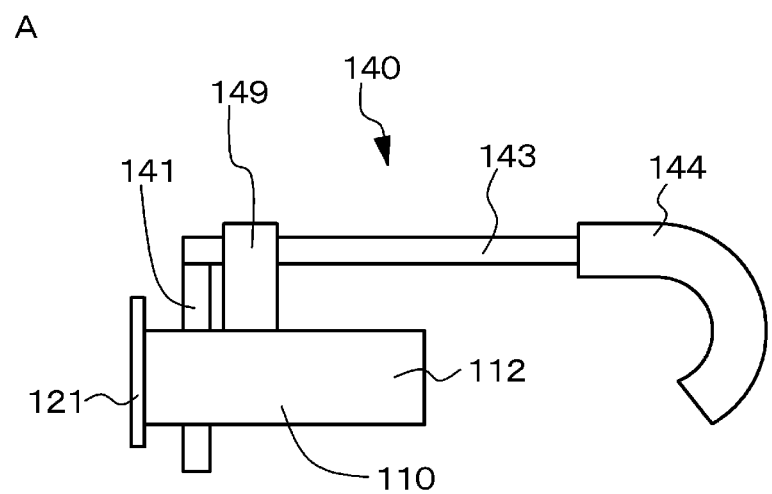
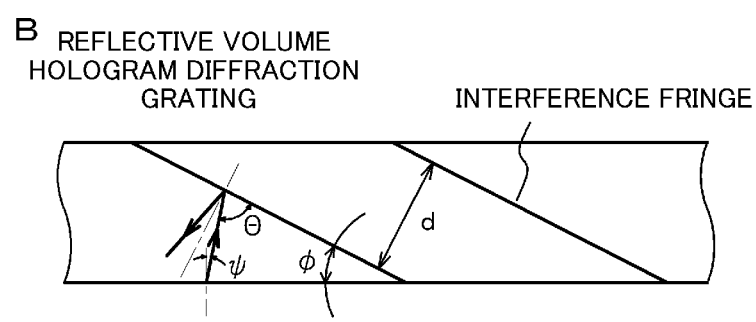

Fig. 29
A
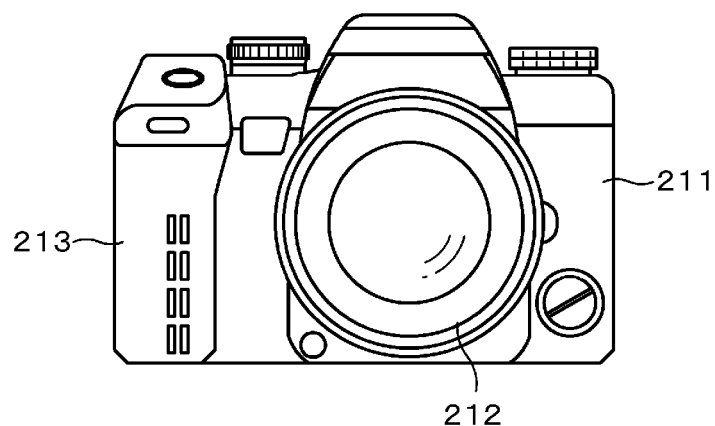
B
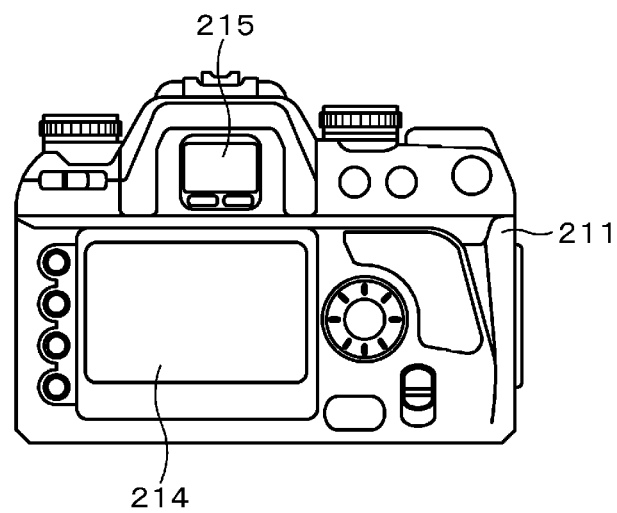

Fig. 34
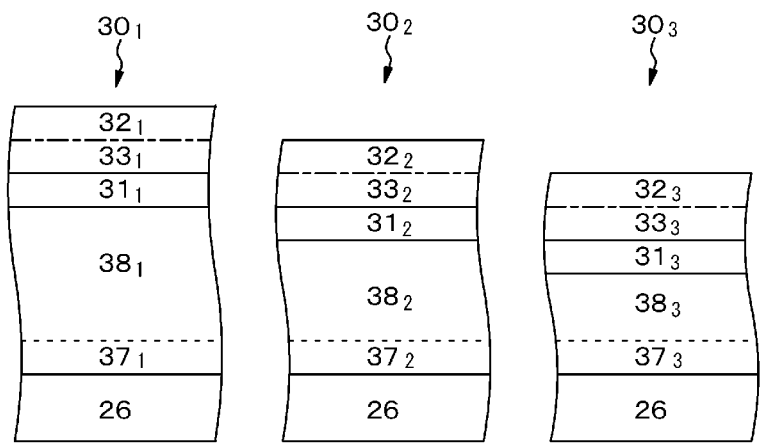
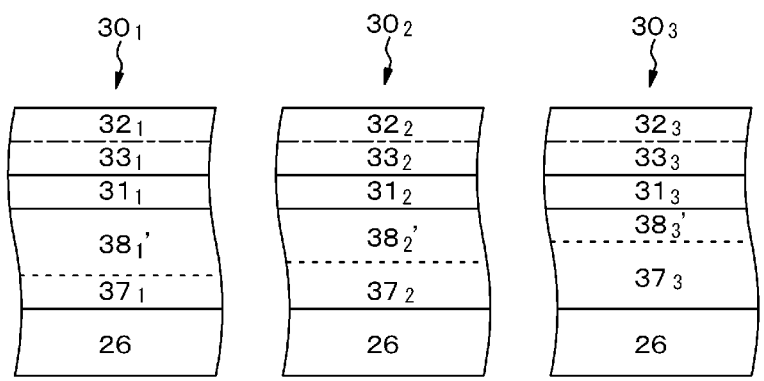

Fig. 35
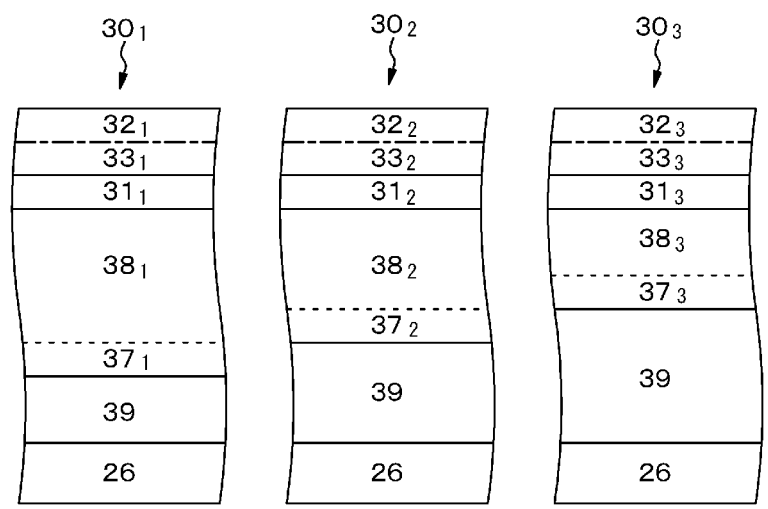
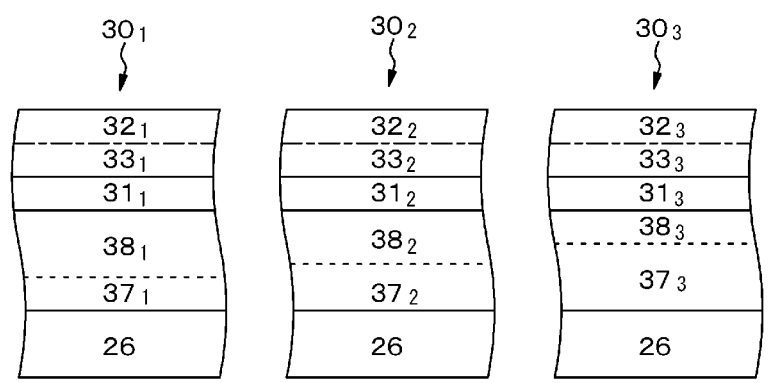

Fig. 36
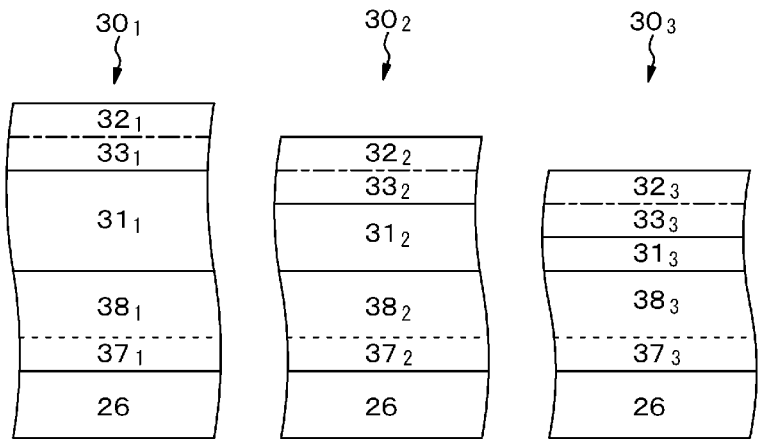
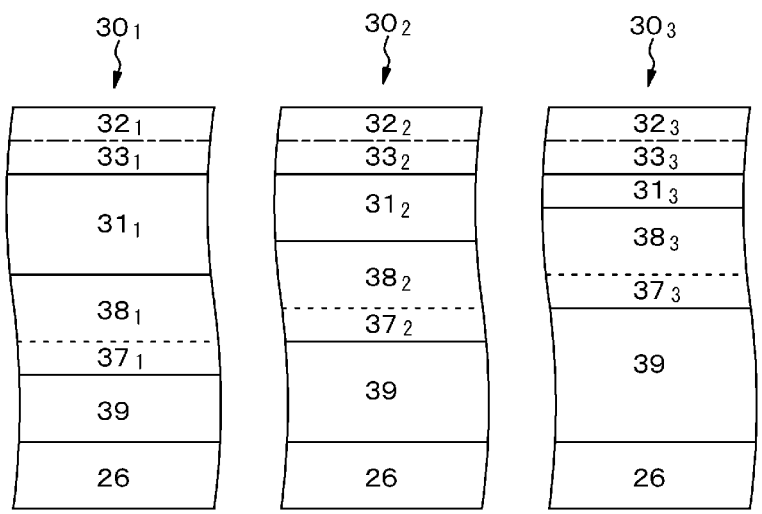

DISPLAY DEVICE

TECHNICAL FIELD

The present disclosure relates to a display device including a plurality of light emitting elements.

BACKGROUND ART

In recent years, development of a display device (an organic EL display) using an organic electroluminescence (EL) element as a light emitting element has been progressing. In this display device, for example, an organic layer including at least a light emitting layer and a second electrode (an upper electrode) are formed on a first electrode (a lower electrode) formed separately for each pixel. In addition, for example, each of a red light emitting element in which an organic layer emitting white light and a red color filter are combined, a green light emitting element in which an organic layer emitting white light and a green color filter are combined, and a blue light emitting element in which an organic layer emitting white light and a blue color filter are combined is provided as a sub pixel, and one pixel is configured of these sub pixels.

In addition, a technique for changing a shape of a lens member in accordance with a film thickness of a color filter provided in each light emitting element in order to reduce color shift due to a change in viewing angle is known from JP 2013-120731 A.

CITATION LIST

Patent Literature

[PTL 1]
  JP 2013-120731 A

SUMMARY

Technical Problem

However, the above patent literature does not mention any technique of controlling a moving direction of light which is emitted from a light emitting layer and passes through a lens member depending on a position of a light emitting element in a display device. That is, there is no mention of the state in which an image from a display device is emitted toward a certain region of an external space.

Therefore, an object of the present disclosure is to provide a display device having a configuration and structure with which it is possible to reliably and accurately control a state in which an image from a display device is emitted toward a certain region of an external space.

Solution to Problem

A display device of the present disclosure for achieving the above object is a display device that has a display panel provided with a plurality of light emitting elements, each of the light emitting elements including
  a light emitting part and
  a lens member (an on-chip micro lens) through which light emitted from the light emitting part passes,
    wherein,
  when a distance (an offset amount) between a normal passing through a center of the light emitting part and a normal passing through a center of the lens member is $D_0$, a value of the distance (offset amount) $D_0$ is not 0 in at least some of the light emitting elements provided in the display panel.

BRIEF DESCRIPTION OF DRAWINGS

FIGS. 3A and 3B are schematic diagrams showing a positional relationship between a light emitting element and the reference point in the display device of the first embodiment.

FIGS. 4A, 4B, 4C and 4D are diagrams schematically showing a change of $D_{0\text{-}X}$ with respect to a change of $D_{1\text{-}X}$ and a change of $D_{0\text{-}Y}$ with respect to a change of $D_{1\text{-}Y}$.

FIGS. 5A, 5B, 5C and 5D are diagrams schematically showing a change of $D_{0\text{-}X}$ with respect to a change of $D_{1\text{-}X}$ and a change of $D_{0\text{-}Y}$ with respect to a change of $D_{1\text{-}Y}$.

FIGS. 6A, 6B, 6C and 6D are diagrams schematically showing a change of $D_{0\text{-}X}$ with respect to a change of $D_{1\text{-}X}$ and a change of $D_{0\text{-}Y}$ with respect to a change of $D_{1\text{-}Y}$.

FIGS. 7A, 7B, 7C and 7D are diagrams schematically showing a change of $D_{0\text{-}X}$ with respect to a change of $D_{1\text{-}X}$ and a change of $D_{0\text{-}Y}$ with respect to a change of $D_{1\text{-}Y}$.

FIGS. 8A and 8B are diagrams schematically showing an example of arrangement relationships of the light emitting part, a color filter layer, and a lens member in the display device of the first embodiment.

FIG. 9A is a graph showing the result of simulating a relationship between a light beam angle θ (unit: degrees) and a light amount (luminance) when the distance $D_0$ is changed, and FIG. 9B is a graph showing an increase in the light amount (luminance) as compared with the case of a conventional display device.

FIGS. 22A, 22B, 22C and 22D are diagrams schematically showing an arrangement of light emitting elements in the display device of the first embodiment.

FIGS. 28A and 28B are a schematic diagram of the head-mounted display of the fifth embodiment from a lateral side and a schematic enlarged cross-sectional view showing a part of a reflective volume hologram diffraction grating in the head-mounted display of the fifth embodiment, respectively.

FIGS. 29A and 29B show an example in which the display device of the present disclosure is applied to a mirrorless type digital still camera with interchangeable lenses, with FIG. 29A showing a front view of the digital still camera and FIG. 29B showing a rear view thereof.

FIGS. 34A and 34B are conceptual diagrams of light emitting elements of a first example and a second example having a resonator structure.

FIGS. 35A and 35B are conceptual diagrams of light emitting elements of a third example and a fourth example having a resonator structure.

FIGS. 36A and 36B are conceptual diagrams of light emitting elements of a fifth example and a sixth example having a resonator structure.

DESCRIPTION OF EMBODIMENTS

Figure 1:
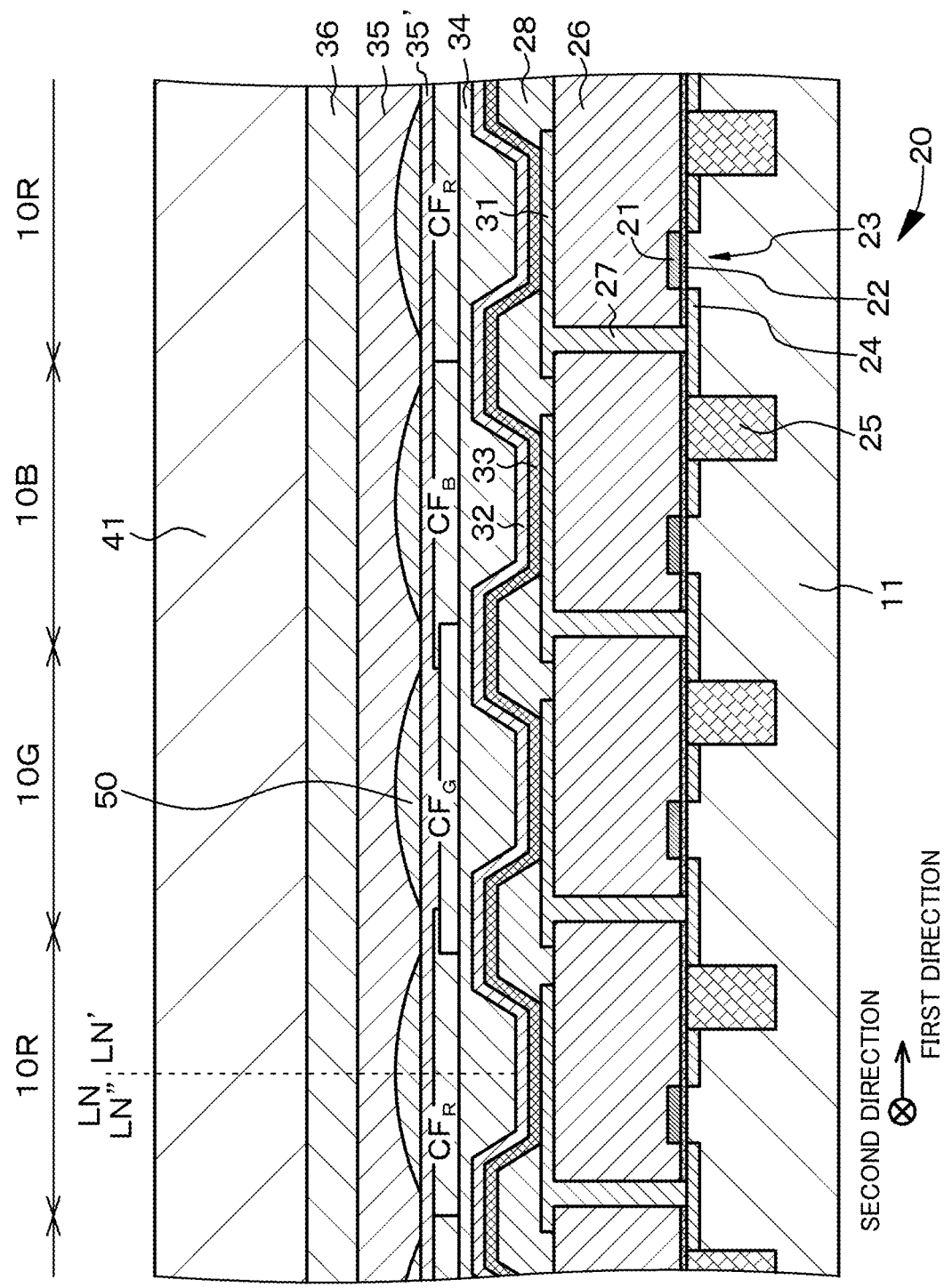
FIG. 1 is a schematic partial cross-sectional view of light emitting elements constituting (and located within a reference point of) a display device of a first embodiment.

Hereinafter, the present disclosure will be described on the basis of embodiments with reference to the figures, but the present disclosure is not limited to the embodiments, and the various numerical values and materials in the embodiments are examples. Also, the description will be given in the following order.

1. Description of an overall display device of the present disclosure
2. First embodiment (display device)
3. Second embodiment (modification of first embodiment)
4. Third embodiment (modification of first embodiment and second embodiment)
5. Fourth embodiment (other modification of first embodiment and second embodiment)
6. Fifth embodiment (example in which display devices of first embodiment to fourth embodiment are applied to a head-mounted display)
7. Other Description of Overall Display Device of Present Disclosure In a display device of the present disclosure, a reference point (reference region) is assumed, and a distance $D_0$ can be set in forms that depend on a distance $D_1$ from the reference point (reference region) to a normal passing through a center of a light emitting part. Also, the reference point (reference region) may include some extent of extension.

Here, various normals are vertical lines with respect to a light emitting surface of a display panel. Further, various orthographic projection images, which will be described later, are orthographic projection images with respect to the light emitting surface of the display panel.

In the display device of the present disclosure including the above preferred forms, the reference point may have a configuration assumed to be in the display panel, and in this case, the reference point may have a configuration not located in a central region of the display panel, or the reference point may have a configuration located in the central region of the display panel, and in these cases, the reference point may have a configuration in which one reference point is assumed or a plurality of reference points are assumed. In addition, in these cases, a value of the distance $D_0$ may be 0 in some light emitting elements, and the value of the distance $D_0$ may not be 0 in the remaining light emitting elements.

Alternatively, in the display device of the present disclosure including the above preferred forms, in a case in which one reference point is assumed, the reference point may have a configuration that is not included in the central region of the display panel, or the reference point may have a configuration that is included in the central region of the display panel. Further, in a case in which a plurality of reference points are assumed, at least one reference point may have a configuration that is not included in the central region of the display panel.

Alternatively, in the display device of the present disclosure including the above preferred forms, the reference point may have a configuration that is assumed to be outside (in an external region of) the display panel, and in this case, the reference point may have a configuration in which one reference point is assumed or a plurality of reference points are assumed. In addition, in these cases, the value of the distance $D_0$ may be non-zero in all the light emitting elements in the configuration.

Further, in the display device of the present disclosure including the preferred forms and configurations described above, the light that is emitted from each light emitting element and passes through a lens member may be set in such a form that it converges (condenses) in a certain region of a space outside the display device, the light that is emitted from each light emitting element and passes through the lens member may be set in such a form that it diverges in the space outside the display device, or the light that is emitted from each light emitting element and passes through the lens member may be set in the form of parallel light.

Furthermore, in the display device of the present disclosure including the preferable forms and configurations described above, the value of the distance (offset amount) $D_0$ may be set in a different form depending on a position occupied by the light emitting element in the display panel. Specifically, the reference point is set, the plurality of light emitting elements are arranged in a first direction and a second direction different from the first direction, and when a distance from the reference point to a normal passing through a center of a light emitting part is defined as $D_1$, values of the distance $D_0$ in the first direction and the second direction are defined as $D_{0-X}$ and $D_{0-Y}$, and values of the distance $D_1$ in the first direction and the second direction are defined as $D_{1-X}$ and $D_{1-Y}$, $D_{0-X}$ may change linearly with respect to a change of $D_{1-X}$, and $D_{0-Y}$ may change linearly with respect to a change of $D_{1-Y}$, or $D_{0-X}$ may change linearly with respect to the change of $D_{1-X}$, and $D_{0-Y}$ may change non-linearly with respect to the change of $D_{1-Y}$, or $D_{0-X}$ may change non-linearly with respect to the change of $D_{1-X}$, and $D_{0-Y}$ may change linearly with respect to the change of $D_{1-Y}$, or $D_{0-X}$ may change non-linearly with respect to the change of $D_{1-X}$, and $D_{0-Y}$ may change non-linearly with respect to the change of $D_{1-Y}$.

Alternatively, the display device of the present disclosure including the preferred forms and configurations described above may have a form in which, the reference point is set, and when the distance from the reference point to the normal passing through the center of the light emitting part is defined as $D_1$, the value of the distance $D_0$ increases as the value of the distance $D_1$ increases.

Here, the fact that $D_{0-X}$ changes linearly with respect to the change of $D_{1-X}$, and $D_{0-Y}$ changes linearly with respect to the change of $D_{1-Y}$ indicates that they satisfy the following relationships.

$$D_{0-X} = k_X \cdot D_{1-X}$$

$$D_{0-Y} = k_Y \cdot D_{1-Y}$$

Here, $k_X$ and $k_Y$ are constants. That is, $D_{0-X}$ and $D_{0-Y}$ change on the basis of a linear function. On the other hand, the fact that $D_{0-X}$ changes non-linearly with respect to the change of $D_{1-X}$, and $D_{0-Y}$ changes linearly with respect to the change of $D_{1-Y}$ indicates that they satisfy the following relationships.

$$D_{0-X} = f_X(D_{1-X})$$

$$D_{0-Y} = f_Y(D_{1-Y})$$

Here, $f_X$ and $f_Y$ are functions that are not linear functions (for example, quadratic functions).

Alternatively, the change of $D_{0-X}$ with respect to the change of $D_{1-X}$ and the change of $D_{0-Y}$ with respect to the change of $D_{1-Y}$ may be regarded as a stepwise change. In addition, in this case, looking at the stepwise change as a whole, the change may be set in a form in which the change changes linearly, or a form in which the change changes non-linearly. Further, when the display panel is divided into M×N regions, in one region, the change in $D_{0-X}$ with respect to the change in $D_{1-X}$ and the change in $D_{0-Y}$ with respect to the change in $D_{1-Y}$ may be invariant or constant. The number of light emitting elements in one region is not limited, and 10×10 can be exemplified.

Furthermore, the display device of the present disclosure including the preferred forms and configurations described above may have a form in which a wavelength selection part is provided on a light incidence side or a light emitting side of the lens member. In this case, an orthographic projection image of the lens member may have a form in which it coincides with an orthographic projection image of the wavelength selection part or is included in the orthographic projection image of the wavelength selection part. By adopting the latter configuration, it is possible to reliably inhibit occurrence of color mixing between adjacent light emitting elements. Further, in these cases, the light emitting element in which the value of the distance $D_0$ is not 0 can be formed in the following forms.

(a) A form in which the normal passing through the center of the wavelength selection part and the normal passing through the center of the light emitting part coincide with each other.

(b) A form in which the normal passing through the center of the wavelength selection part and the normal passing through the center of the lens member coincide with each other.

(c) A form in which the normal passing through the center of the wavelength selection part and the normal passing through the center of the light emitting part do not coincide with each other, and the normal passing through the center of the wavelength selection part and the normal passing through the center of the lens member do not coincide with each other.

By adopting either of the latter configurations (b) and (c), it is possible to reliably inhibit occurrence of color mixing between adjacent light emitting elements. Also, the center of the wavelength selection part indicates a centroid point of an area of a region occupied by the wavelength selection part. Alternatively, in a case in which a planar shape of the wavelength selection part is circular, elliptical, square, rectangular, or a regular polygon, centers of these figures correspond to the center of the wavelength selection part, or in a case in which these figures are such figures of which a part is notched, centers of the figures in which the notched part is complemented correspond to the center of the wavelength selection part, or in a case in which these figures are connected figures, centers of the figures in which the connected part is removed and the removed part is complemented correspond to the center of the wavelength selection part. Further, in these cases, a form in which a light absorption layer (a black matrix layer) is formed between the wavelength selection parts of the adjacent light emitting elements can be adopted, whereby occurrence of color mixing between the adjacent light emitting elements can be reliably inhibited. The wavelength selection part can be configured of, for example, a color filter layer, and the color filter layer is formed of a resin to which a colorant composed of a desired pigment or dye is added and is adjusted by selecting a pigment or dye such that light transmittance in a target wavelength range such as red, green, or blue is high and light transmittance in other wavelength ranges is low. Alternatively, the wavelength selection part may be configured of a photonic crystal, a wavelength selection element to which plasmon is applied (a color filter layer having a conductor lattice structure in which a lattice-shaped hole structure is provided in a conductor thin film; for example, see JP 2008-177191 A), a thin film made of an inorganic material such as amorphous silicon, and quantum dots. Hereinafter, the wavelength selection part will be described as a representative of the color filter layer, but the wavelength selection part is not limited to the color filter layer. Also, a size of the wavelength selection part (for example, the color filter layer) may be appropriately changed in accordance with the light emitted by the light emitting element. In a case in which the light absorption layer (black matrix layer) is provided between the wavelength selection parts (for example, color filter layers) of the adjacent light emitting elements, a size of the light absorption layer (black matrix layer) may be appropriately changed in accordance with the light emitted by the light emitting element.

Furthermore, the display device of the present disclosure including the preferred forms and configurations described above may be configured to have a form in which the light absorption layer (black matrix layer) is formed between adjacent lens members, and this also makes it possible to reliably inhibit occurrence of color mixing between the adjacent light emitting elements.

These light absorption layers (black matrix layers) are made of, for example, a black resin film (specifically, for example, a black polyimide resin) having an optical density of 1 or more with which a black colorant is mixed, or configured of a thin film filler utilizing interference of thin films. The thin film filter is formed by stacking two or more thin films made of, for example, a metal, a metal nitride or a metal oxide, and attenuates the light by utilizing interference of thin films. Specifically, as the thin film filter, one in which Cr and chromium(III) oxide ($Cr_2O_3$) are alternately laminated can be exemplified.

Furthermore, in the display device of the present disclosure including the preferred forms and configurations described above, the light emitting part provided in the light emitting element may have a form including an organic electroluminescence layer. That is, the display device of the present disclosure including the various preferred forms and configurations described above may have a form of an organic electroluminescence display device (an organic EL display device), and may have a form in which the light emitting element is configured of an organic electroluminescence element (an organic EL element). Alternatively, the light emitting part may have a form including a light emitting diode (LED).

The normal passing through the center of the lens member coincides with an optical axis of the lens member. The lens member may have a hemispherical form, may have a form including a part of a sphere, may have a form including a truncated cone shape (a three-dimensional shape in which a cross-sectional shape of the lens member obtained when the lens member is cut along a virtual plane including the optical axis of the lens member is trapezoidal), or may have a form in which the cross-sectional shape of the lens member obtained when the lens member is cut along a virtual plane including the optical axis of the lens member is rectangular (square or rectangular), and broadly, the lens member may have a form including a shape suitable for functioning as a lens. The lens member (on-chip micro lens) may be made of, for example, a transparent resin material such as an acrylic resin, an epoxy resin, a polycarbonate resin, or a polyimide resin, or a transparent inorganic material such as $SiO_2$, and the transparent resin material can be obtained using melt flow, can be obtained using etching back, can be obtained using a combination of a photolithography technique using a gray tone mask and an etching method, or can also be obtained using a method such as forming the transparent resin material into a lens shape on the basis of a nano print method. A flattening film may be formed between the color filter layer and the lens member with the same material as the lens member.

In the display device of the present disclosure, as an arrangement of pixels (or sub-pixels), a delta arrangement can be exemplified, or a stripe arrangement, a diagonal arrangement, a rectangle arrangement, and a PenTile arrangement can be exemplified. An arrangement of the wavelength selection part may also be a delta arrangement, or a stripe arrangement, a diagonal arrangement, a rectangle arrangement, or a PenTile arrangement on the basis of the arrangement of pixels (or sub-pixels).

The display device can be used, for example, for a monitor device constituting a personal computer, and can be used for a television receiver, a mobile phone, a personal digital assistant (PDA), a monitor device incorporated in a game device, or a display device incorporated in a projector. Alternatively, the display device can be applied to an electronic view finder (EVF) or a head-mounted display (HMD), and can be applied to a display device for virtual reality (VR), mixed reality (MR), or augmented reality (AR). Alternatively, the display device can constitute an image display device in an electronic book, an electronic paper such as an electronic newspaper, a signboard, a poster, a bulletin board such as a blackboard, rewritable paper as a substitute for printer paper, a display part for a home appliance, a card display part such as a point card, an electronic advertisement, and an electronic POP. By using the display device of the present disclosure as a light emitting device, various lighting devices including a backlight device for a liquid crystal display device and a planar light source device can be configured.

The head-mounted display includes, for example:
(a) a frame mounted on an observer's head; and
(b) an image display device mounted on the frame.
The image display device includes:
(A) an image forming device including the display device of the present disclosure; and (B) an optical device on and from which light emitted from an image forming device is incident and emitted.

The optical device includes:

(B-1) a light guide plate inside of which incident light from an image forming device (specifically, the display device of the present disclosure) propagates by total reflection and then is emitted toward an observer;

(B-2) a first deflection means (configured of, for example, a volume hologram diffraction grating) for deflecting the light incident on the light guide plate so that the light incident on the light guide plate is totally reflected inside the light guide plate; and (B-3) a second deflection means (configured of, for example, a volume hologram diffraction grating) for deflecting the light propagating inside the light guide plate by total reflection a plurality of times in order to emit the light propagating through the inside of the light guide plate by total reflection from the light guide plate.

Alternatively, the head-mounted display can be, for example, a retinal projection type display based on Maxwell vision which displays an image by directly projecting an image (luminous flux) onto an observer's retina, specifically, a retinal projection type head-mounted display.

Hereinafter, a form in which the light emitting part provided in the light emitting element includes an organic electroluminescence layer, that is, a form in which the display device of the present disclosure is configured of an organic electroluminescence display device (organic EL display device), will be described.

The display device includes:

a first substrate and a second substrate; and a plurality of light emitting elements positioned between the first substrate and the second substrate and arranged in a two-dimensional shape, the light emitting elements each include a light emitting part, the light emitting part provided on a substrate formed on the first substrate at least includes:

a first electrode;

a second electrode; and an organic layer (including a light emitting layer including an organic electroluminescence layer) sandwiched between the first electrode and the second electrode, and light from the organic layer is emitted to the outside through the second substrate, or is emitted to the outside through the first substrate.

That is, the display device of the present disclosure can be a top emission type (top surface light emitting type) display device that emits light from the second substrate (top surface light emitting type display device), or can also be a bottom emission type (bottom surface light emitting type) display device that emits light from the first substrate (bottom surface light emitting type display device).

As described above, the light emitting part is configured of the first electrode, the organic layer, and the second electrode. A center of the light emitting part indicates a centroid point of an area of a region (light emitting region) in which an electrode on the first substrate side and the organic layer are in contact with each other. The electrode on the first substrate side may be in contact with a part of the organic layer, or the organic layer may be in contact with a part of the electrode on the first substrate side. Specifically, they may be configured such that a size of the electrode on the first substrate side is smaller than that of the organic layer, or the size of the electrode on the first substrate side is the same as that of the organic layer, but an insulating layer is formed in a part between the electrode on the first substrate side and the organic layer, or the size of the electrode on the first substrate side is larger than that of the organic layer.

In addition, the organic layer can have a form of emitting white light, and in this case, the organic layer can have a form configured of at least two light emitting layers that emit light of different colors. Specifically, the organic layer can have a laminated structure in which three layers of a red light emitting layer that emits red light (wavelength: 620 nm to 750 nm), a green light emitting layer that emits green light (wavelength: 495 nm to 570 nm), and a blue light emitting layer that emits blue light (wavelength: 450 nm to 495 nm) are laminated and emits white light as a whole. Alternatively, the organic layer can have a structure in which two layers of a blue light emitting layer that emits blue light and a yellow light emitting layer that emits yellow light are laminated and emits white light as a whole. Alternatively, the organic layer can have a structure in which two layers of a blue light emitting layer that emits blue light and an orange light emitting layer that emits orange light are laminated and emits white light as a whole. The organic layer may be shared by a plurality of light emitting elements, or may be individually provided in each light emitting element. In addition, a red light emitting element is configured by combining such an organic layer (light emitting part) that emits white light with a red color filter layer (or a flattening layer that functions as a red color filter layer), a green light emitting element is configured by combining the organic layer (light emitting part) that emits white light with a green color filter layer (or a flattening layer that functions as a green color filter layer), and a blue light emitting element is configured by combining an organic layer (light emitting part) that emits white light and a blue color filter layer (or a flattening layer that functions as a blue color filter layer). The flattening layer will be described later. As described above, one pixel is configured of a combination of sub-pixels of the red light emitting element, the green light emitting element, and the blue light emitting element described above. In some cases, one pixel may be configured of a red light emitting element, a green light emitting element, a blue light emitting element, and a light emitting element (or a light emitting element that emits light of a complementary color) that emits white (or a fourth color). Also, it can also be a display device that generates a monochromatic image. In a form including at least two light emitting layers that emit different colors, in reality, light emitting layers that emit different colors may be mixed and not clearly separated into each layer.

Alternatively, the organic layer can have a form including one light emitting layer. In this case, the light emitting element can be configured of, for example, a red light emitting element having an organic layer including a red light emitting layer, a green light emitting element having an organic layer including a green light emitting layer, or a blue light emitting element having an organic layer including a blue light emitting layer. In the case of a color display device, one pixel is configured of these three types of light emitting elements (sub-pixels). Alternatively, the organic layer can also be configured of a laminated structure of a red light emitting element having an organic layer including a red light emitting layer, a green light emitting element having an organic layer including a green light emitting layer, and a blue light emitting element having an organic layer including a blue light emitting layer. Also, although it is not necessary to form the color filter layer in principle, the color filter layer may be provided for improving color purity.

The substrate is formed on or above the first substrate. As a material constituting the substrate, an insulating material such as $SiO_2$, SiN, and SiON can be exemplified. The substrate can be formed on the basis of a forming method suitable for the material constituting the substrate, specifically, for example, a known method such as various CVD methods, various coating methods, various PVD methods including sputtering and vacuum vapor deposition methods, various printing methods including a screen printing method, a plating methods, an electrodeposition method, a dipping method, and a sol-gel method.

A light emitting element driving part is provided below or under the substrate, but is not limited thereto. The light emitting element driving part is configured of, for example, a transistor (specifically, for example, MOSFET) formed on a silicon semiconductor substrate constituting the first substrate, or a thin film transistor (TFT) provided on various substrates constituting the first substrate. The transistor or TFT constituting the light emitting element driving part and the electrode on the first substrate side can be connected via a contact hole (a contact plug) formed in the substrate or the like. The light emitting element driving part may have a well-known circuit configuration. The electrode on the second substrate side is connected to the light emitting element driving part via a contact hole (a contact plug) formed in the substrate or the like on an outer peripheral portion of the display panel.

The electrode on the first substrate side is provided for each light emitting element. The organic layer is provided for each light emitting element, or is provided to be shared by the light emitting elements. The electrode on the second substrate side may be a common electrode in a plurality of light emitting elements. That is, the electrode on the second substrate side may be a so-called solid electrode. The first substrate is disposed below or under the substrate, and the second substrate is disposed above the second electrode. The light emitting element is formed on the first substrate side, and the light emitting part is provided on the substrate.

The first substrate or the second substrate can be formed of a silicon semiconductor substrate, a high distortion point glass substrate, soda glass ($Na_2O/CaO/SiO_2$) substrate, a borosilicate glass ($Na_2O/B_2O_3/SiO_2$) substrate, a forsterite ($2MgO/SiO_2$) substrate, lead glass ($Na_2O/PbO/SiO_2$)) substrate, various glass substrates having a surface on which an insulating material layer is formed, a quartz substrate, a quartz substrate having a surface on which an insulating material layer is formed, and an organic polymer (which has a form of a polymer material, such as a flexible plastic film, plastic sheet, or plastic substrate made of a polymer material) such as polymethylmethacrylate (PMMA), polyvinyl alcohol (PVA), polyvinylphenol (PVP), polyethersulfone (PES), polyimide, polycarbonate, polyethylene terephthalate (PET), or polyethylene naphthalate (PEN). The material constituting the first substrate and the second substrate may be the same or different. However, in the case of a top surface light emitting type display device, the second substrate is required to be transparent to the light from the light emitting element and in the case of a bottom surface light emitting type display device, the first substrate is required to be transparent to the light from the light emitting element.

In a case in which the first electrode functions as an anode electrode, as the material constituting the first electrode, for example, a metal such as platinum (Pt), gold (Au), silver (Ag), chromium (Cr), tungsten (W), nickel (Ni), copper (Cu), iron (Fe), cobalt (Co), or tantalum (Ta), or alloy (for example, Ag—Pd—Cu alloy, Al—Nd alloy, Al—Cu alloy, or Al—Cu—Ni alloy containing silver as a main component and containing 0.3% by mass to 1% by mass of palladium (Pd) and 0.3% by mass to 1% by mass of copper (Cu)), which have a high work function can be exemplified. Further, in a case in which a conductive material having a small work function value and a high light reflectance such as aluminum (Al) or alloy containing aluminum, it can be used as an anode electrode by providing an appropriate hole injection layer to improve hole injection characteristics. As a thickness of the first electrode, 0.1 μm to 1 μm can be exemplified. Alternatively, in a case in which a light reflecting layer is provided, which will be described later, the first electrode is required to be transparent to the light from the light emitting element, and thus, as the material constituting the first electrode, various transparent conductive materials such as a transparent conductive material having, as a base layer, indium oxide, indium-tin oxide (including indium tin oxide (ITO), sn-doped $In_2O_3$, crystalline ITO, and amorphous ITO), indium-zinc oxide (indium zinc oxide (IZO)), indium-gallium oxide (IGO), indium-doped gallium-zinc oxide (IGZO, and In—$GaZnO_4$), IFO (F-doped $In_2O_3$), ITiO (Ti-doped $In_2O_3$), InSn, InSnZnO, tin oxide ($SnO_2$), ATO (Sb-doped $SnO_2$), FTO (F-doped $SnO_2$), zinc oxide (ZnO), aluminum oxide-doped zinc oxide (AZO), gallium-doped zinc oxide (GZO), B-doped ZnO, AlMgZnO (aluminum oxide and magnesium oxide-doped zinc oxide), antimony oxide, titanium oxide, NiO, spinel oxide, oxide having a $YbFe_2O_4$ structure, gallium oxide, titanium oxide, niobium oxide, nickel oxide, etc. Alternatively, it can also have a structure in which a transparent conductive material having excellent hole injection characteristics such as indium tin oxide (ITO) and indium zinc oxide (IZO) is laminated on a reflective film having high light reflectivity such as a dielectric multilayer film or aluminum (Al) or an alloy thereof (for example, Al—Cu—Ni alloy). On the other hand, in a case in which the first electrode functions as a cathode electrode, the first electrode is preferably made of a conductive material having a small work function value and high light reflectance, but a conductive material having high light reflectance used as an anode electrode can also be used as a cathode electrode by providing an appropriate electron injection layer thereon to improve electron injection characteristics thereof.

As a material constituting the second electrode (semi-light transmitting material or light transmitting material), in a case in which the second electrode functions as a cathode electrode, it is preferably formed of a conductive material having a small work function value to transmit emitted light and efficiently inject electrons into the organic layer (light emitting layer), for example, a metal or alloy having a small work function such as aluminum (Al), silver (Ag), magnesium (Mg), calcium (Ca), sodium (Na), strontium (Sr), an alkali metal or an alkaline earth metal and silver (Ag) [for example, magnesium (Mg)-silver (Ag) alloy (Mg—Ag alloy)], magnesium-calcium alloy (Mg—Ca alloy), aluminum (Al)-lithium (Li) alloy (Al—Li alloy), etc., can be exemplified, and among them, Mg—Ag alloy is preferable, and Mg:Ag=5:1 to 30:1 can be exemplified as a volume ratio of magnesium and silver. Alternatively, as a volume ratio of magnesium to calcium, Mg:Ca=2:1 to 10:1 can be exemplified. As a thickness of the second electrode, 4 nm to 50 nm, preferably 4 nm to 20 nm, and more preferably 6 nm to 12 nm can be exemplified. Alternatively, at least one material selected from the group consisting of Ag—Nd—Cu, Ag—Cu, Au and Al—Cu can be exemplified. Alternatively, the second electrode can be configured to have a laminated structure of the above-mentioned material layer and a so-called transparent electrode (for example, a thickness of $3 \times 10^{-8}$ m to $1 \times 10^{-6}$ m) made of, for example, ITO or IZO from the organic layer side. A bus electrode (an auxiliary electrode) made of a low resistance material such as aluminum, aluminum alloy, silver, silver alloy, copper, copper alloy, gold, or gold alloy may be provided for the second electrode to achieve reduction in resistance of the second electrode as a whole. An average light transmittance of the second electrode is preferably 50% to 90%, preferably 60% to 90%. On the other hand, in a case in which the second electrode functions as an anode electrode, it is preferably made of a conductive material that transmits emitted light as needed and has a large work function value.

As a method for forming the first electrode and the second electrode, for example, an electron beam deposition method, a thermal filament deposition method, a vapor deposition method including a vacuum vapor deposition method, a sputtering method, a chemical vapor deposition method (CVD method), a MOCVD method, a combination of an ion plating method and an etching method, Various printing methods such as a screen printing method, an inkjet printing method and a metal mask printing method, a plating method (an electroplating method and an electroless plating method), a lift-off method, a laser ablation method, a sol-gel method, etc., can be exemplified. According to various printing methods and plating methods, it is possible to directly form the first electrode and the second electrode having a desired shape (pattern). In a case in which the second electrode is formed after the organic layer is formed, in particular, it is preferable to perform the film forming on the basis of a film forming method such as a vacuum vapor deposition method in which energy of film-forming particles is small, or a film forming method such as a MOCVD method from the viewpoint of preventing damage to the organic layer. When the organic layer is damaged, non-emission pixels (or non-emission sub-pixels) called "dead points" may be generated due to generation of a leakage current.

Although the organic layer includes the light emitting layer containing the organic light emitting material, specifically, the organic layer may be configured to have, for example, a laminated structure of a hole transport layer, a light emitting layer, and an electron transport layer, a laminated structure of a light emitting layer that also serves as a hole transport layer and an electron transport layer, and a laminated structure of a hole injection layer, a hole transport layer, a light emitting layer, an electron transport layer and an electron injection layer. As a method for forming the organic layer, a physical vapor deposition method (PVD method) such as a vacuum vapor deposition method, a printing method such as a screen printing method or an inkjet printing method, a laser transfer method in which a laminated structure of a laser absorption layer and an organic layer formed on a transfer substrate is irradiated with a laser, thereby separating the organic layer on the laser absorption layer to transfer the organic layer, and various coating methods can be exemplified. In a case in which the organic layer is formed on the basis of the vacuum vapor deposition method, for example, a so-called metal mask is used, and the organic layer can be obtained by depositing a material that has passed through openings provided in the metal mask.

A light shielding part may be provided between a light emitting element and a light emitting element. As a light shielding material constituting the light shielding part, specifically, a material capable of blocking light such as titanium (Ti), chromium (Cr), tungsten (W), tantalum (Ta), aluminum (Al), and $MoSi_2$ can be exemplified. The light shielding part can be formed using an electron beam vapor deposition method, a hot filament vapor deposition method, a vapor deposition method including a vacuum vapor deposition method, a sputtering method, a CVD method, an ion plating method, or the like.

A protective layer is preferably formed to cover electrodes on the second substrate side. Further, the protective layer can have a form in which a lens member is formed on or above the protective layer, or a form in which a color filter layer is formed on or above the protective layer and a lens member is formed on or above the color filter layer, or a form in which the lens member is formed on or above the protective layer and the color filter layer is formed on or above the lens member. In addition, a flattening layer may be further formed on these. As described above, the flattening layer that functions as a color filter layer may be provided.

As a material constituting the protective layer and the flattening layer, acrylic resin can be exemplified, and $SiO_2$, SiN, SiON, SiC, amorphous silicon (a-Si), $Al_2O_3$, and $TiO_2$ can also be exemplified. The protective layer and the flattening layer may have a single-layer structure or may be configured of a plurality of layers. As a method for forming the protective layer and the flattening layer, they can be formed on the basis of known methods such as various CVD methods, various coating methods, various PVD methods including a sputtering method and a vacuum vapor deposition method, and various printing methods such as a screen printing method. Further, as the method for forming the protective layer and the flattening layer, an atomic layer deposition (ALD) method can also be adopted. The protective layer and the flattening layer may be shared by a plurality of light emitting elements, or may be individually provided in each light emitting element.

The flattening layer and the second substrate are joined via, for example, a resin layer (sealing resin layer). As a material constituting the resin layer (sealing resin layer), thermosetting adhesives such as acrylic adhesives, epoxy adhesives, urethane adhesives, silicone adhesives, and cyanoacrylate adhesives, and ultraviolet curable adhesives can be exemplified. The resin layer (sealing resin layer) may also serve as the flattening layer.

As described above, in some cases, the flattening layer may have a form having a function as a color filter layer. Such a flattening layer may be made of a well-known color resist material. A transparent filter may be arranged for the light emitting element that emits white. By making the flattening layer also function as a color filter layer in this way, the organic layer and the flattening layer (color filter layer) are close to each other, and thus even when an angle of the light emitted from the light emitting element is widened, color mixing can be effectively prevented and viewing angle characteristics thereof are improved. However, the color filter layer may be provided on or above the flattening layer and below or under the flattening layer independently of the flattening layer.

On an outermost surface (specifically, for example, an outer surface of the second substrate) that emits light from the display panel, an ultraviolet absorbing layer, a contamination prevention layer, a hard coat layer, and an antistatic layer may be formed and a protective member (for example, a cover glass) may be arranged.

In the display panel, an insulating layer and an interlayer insulating layer are formed, and as an insulating material constituting these, $SiO_2$, non-doped silicate glass (NSG), boron phosphorus silicate glass (BPSG), PSG, BSG, AsSG, SbSG, PbSG, spin-on glass (SOG), low temperature oxide (LTO, low temperature CVD-SiO$_2$), SiO$_X$-based materials (materials constituting silicon-based oxide films) such as low-melting glass and glass paste, SiN-based materials including SiON-based materials, SiOC, SiOF, or SiCN can be exemplified. Alternatively, an inorganic insulating material such as titanium oxide (TiO$_2$), tantalum oxide (Ta$_2$O$_5$), aluminum oxide (Al$_2$O$_3$), magnesium oxide (MgO), chromium oxide (CrO$_x$), zirconium oxide (ZrO$_2$), niobium oxide (Nb$_2$O$_5$), tin oxide (SnO$_2$), vanadium oxide (VO$_x$) can be exemplified. Alternatively, various resins such as polyimide resin, epoxy resin, acrylic resin, and low dielectric constant insulating materials such as SiOCH, organic SOG, and fluorine resin (for example, materials having a dielectric constant k (=ε/ε$_0$) of 3.5 or less, specifically, for example, fluorocarbon, cycloperfluorocarbon polymer, benzocyclobutene, cyclic fluororesin, polytetrafluoroethylene, amorphous tetrafluoroethylene, polyaryl ether, aryl fluoride ether, polyimide fluoride, amorphous carbon, parylene (polyparaxylylene), fullerene fluoride) can be exemplified, and Silk (a trademark of The Dow Chemical Co., a coating type low dielectric constant interlayer insulating film material) and Flare (a trademark of Honeywell Electronic Materials Co., a polyallyl ether (PAE)-based material) can also be exemplified. In addition, these can be appropriately used alone or in combination. In some cases, the substrate may be made of the materials described above. The insulating layer, the interlayer insulating layer, and the substrate can be formed using a known method such as various CVD methods, various coating methods, various PVD methods including a sputtering method and a vacuum vapor deposition method, various printing methods such as a screen printing method, a plating method, an electrodeposition method, an immersion method, a sol-gel method, etc.

The organic EL display device preferably has a resonator structure in order to further improve light extraction efficiency. Specifically, the light emitted by the light emitting layer is resonated between a first interface formed by an interface (alternatively, an interface formed by an interface between a light reflecting layer and an interlayer insulating layer in a structure in which the interlayer insulating layer is provided below the first electrode and the light reflecting layer is provided below the interlayer insulating layer) between the first electrode and the organic layer and a second interface formed by an interface between the second electrode and the organic layer to emit some of the light from the second electrode. In addition, when an optical distance from the maximum light emitting position of the light emitting layer to the first interface is OL$_1$, an optical distance from the maximum light emitting position of the light emitting layer to the second interface is OL$_2$, and m$_1$ and m$_2$ are integers, the configuration satisfying the following equations (1-1) and (1-2) can be formed.

$$0.7\{-\Phi_1/(2\pi)+m_1\} \leq 2\times OL_1/\lambda \leq 1.2\{-\Phi_1/(2\pi)+m_1\} \quad (1\text{-}1)$$

$$0.7\{-\Phi_2/(2\pi)+m_2\} \leq 2\times OL_2/\lambda \leq 1.29\{-\Phi_2/(2\pi)+m_2\} \quad (1\text{-}2)$$

Here, reference signs are as follows.
λ: The maximum peak wavelength of a spectrum of light generated in the light emitting layer (or desired wavelength in the light generated in the light emitting layer)
$\Phi_1$: A phase shift amount of light reflected at the first interface (part: radian). Here, $-2\pi < \Phi_1 \leq 0$
$\Phi_2$: A phase shift amount of light reflected at the second interface (part: radian). Here, $-2\pi < \Phi_2 \leq 0$
Here, a value of m$_1$ is a value of 0 or more, and a value of m$_2$ is a value of 0 or more independently of the value of m$_1$, and a form of (m$_1$, m$_2$)=(0,0), a form of (m$_1$, m$_2$)=(0,1), a form of (m$_1$, m$_2$)=(1,0), and a form of (m$_1$, m$_2$)=(1,1) can be exemplified.

A distance L$_1$ from the maximum light emitting position of the light emitting layer to the first interface indicates an actual distance (physical distance) from the maximum light emitting position of the light emitting layer to the first interface, and a distance L$_2$ from the maximum light emitting position of the light emitting layer to the second interface indicates an actual distance (physical distance) from the maximum light emitting position of the light emitting layer to the second interface. Further, the optical distance is also called an optical path length, and generally indicates n×L when a light beam passes a distance L through a medium having a refractive index n. The same applies to the following. Therefore, when an average refractive index is defined as n$_{ave}$, the following relationship is present.

$$OL_1 = L_1 \times n_{ave}$$

$$OL_2 = L_2 \times n_{ave}$$

Here, the average refractive index n$_{ave}$ is obtained by summing a product of a refractive index and a thickness of each layer constituting the organic layer (or the organic layer, the first electrode, and the interlayer insulating layer) and dividing it by a thickness of the organic layer (or the organic layer, the first electrode, and the interlayer insulating layer).

The light emitting element may be designed by determining the desired wavelength λ (specifically, for example, a wavelength of red, a wavelength of green, and a wavelength of blue) of the light generated in the light emitting layer and obtaining various parameters such as OL$_1$ and OL$_2$ in the light emitting element on the basis of the equations (1-1) and (1-2).

The first electrode or the light reflecting layer and the second electrode absorb some of incident light and reflect the rest. Therefore, a phase shift occurs in the reflected light. Phase shift amounts $\Phi_1$ and $\Phi_2$ can be obtained by measuring values of a real part and an imaginary part of a complex refractive index of materials constituting the first electrode or the light reflecting layer and the second electrode using, for example, an ellipsometer, and performing a calculation on the basis of these values (see, for example, "Principles of Optic," Max Born and Emil Wolf, 1974 (PERGAMON PRESS)). Refractive indexes of the organic layer, the interlayer insulating layer, and the like (or the refractive index of the first electrode when the first electrode absorbs some of the incident light and reflects the rest) can be obtained by performing the measurement using an ellipsometer.

As a material that constitutes the light reflecting layer, aluminum, aluminum alloy (for example, Al—Nd and Al—Cu), Al/Ti laminated structure, Al—Cu/Ti laminated structure, chromium (Cr), silver (Ag), silver alloy (for example, Ag—Cu, Ag—Pd—Cu, and Ag—Sm—Cu) can be exemplified. The light reflecting layer can be formed using, for example, an electron beam deposition method, a thermal filament deposition method, a vapor deposition method including a vacuum vapor deposition method, a sputtering method, a CVD method, an ion plating method, a plating method (an electroplating method and an electroless plating method), a lift-off method, a laser ablation method, a sol-gel method, etc. Depending on the material constituting the light reflecting layer, it is preferable to form a base layer made of, for example, TiN in order to control a crystal state of the light reflecting layer to be formed.

As described above, in the organic EL display device having a resonator structure, in reality, a red light emitting element configured of an organic layer that emits white light [in some cases, a red light emitting element configured of a combination of an organic layer that emits white light and a red color filter layer (or a flattening layer that functions as a red color filter layer)] resonates red light emitted by a light emitting layer to emit reddish light (light having a peak in an optical spectrum in a red region) from the second electrode. In addition, a green light emitting element configured of an organic layer that emits white light [in some cases, a green light emitting element configured of a combination of an organic layer that emits white light and a green color filter layer (or a flattening layer that functions as a green color filter layer)] resonates green light emitted by a light emitting layer to emit greenish light (light having a peak in an optical spectrum in a green region) from the second electrode. Further, a blue light emitting element configured of an organic layer that emits white light [in some cases, a blue light emitting element configured of a combination of an organic layer that emits white light and a blue color filter layer (or a flattening layer that functions as a blue color filter layer)] resonates a blue light emitted by a light emitting layer to emit bluish light (light having a peak in an optical spectrum in a blue region) from the second electrode. That is, each light emitting element may be designed by determining the desired wavelength $\lambda$ (specifically, the wavelength of red, the wavelength of green, and the wavelength of blue) of the light generated in the light emitting layer and obtaining various parameters such as $OL_1$, $OL_2$, and the like in each of the red light emitting element, the green light emitting element, and the blue light emitting element on the basis of the equations (1-1) and (1-2). For example, paragraph [0041] of Japanese Patent Application Laid-Open No. 2012-216495 discloses an organic EL element having a resonator structure having an organic layer as a resonance part, and paragraph [0041] of Japanese Patent Application Laid-Open No. 2012-216495 discloses that since a distance from a light emitting point (an light emitting surface) to a reflecting surface can be adjusted appropriately, a film thickness of an organic layer is preferably 80 nm or more and 500 nm or less, and more preferably 150 nm or more and 350 nm or less. Usually, a value of $(L_1+L2=L_0)$ is different in a red light emitting element, a green light emitting element, and a blue light emitting element.

In an organic EL display device, it is preferable that a thickness of a hole transport layer (a hole supply layer) and a thickness of an electron transport layer (an electron supply layer) be approximately equal. Alternatively, the electron transport layer (electron supply layer) may be thicker than the hole transport layer (hole supply layer), which makes it possible to supply sufficient electrons to a light emitting layer, which is necessary for high efficiency with a low drive voltage. That is, the hole supply can be increased by disposing the hole transport layer between the first electrode, which corresponds to an anode electrode, and the light emitting layer, and forming the hole transport layer with a film thickness thinner than that of the electron transport layer. In addition, this makes it possible to obtain a carrier balance in which there is no excess or deficiency of holes and electrons and an amount of carrier supply is sufficiently large, and thus high luminous efficiency can be obtained. Further, since there is no excess or deficiency of holes and electrons, a carrier balance cannot be easily lost, drive deterioration can be inhibited, and a light emitting life span can be extended.

First Embodiment

Figure 2:
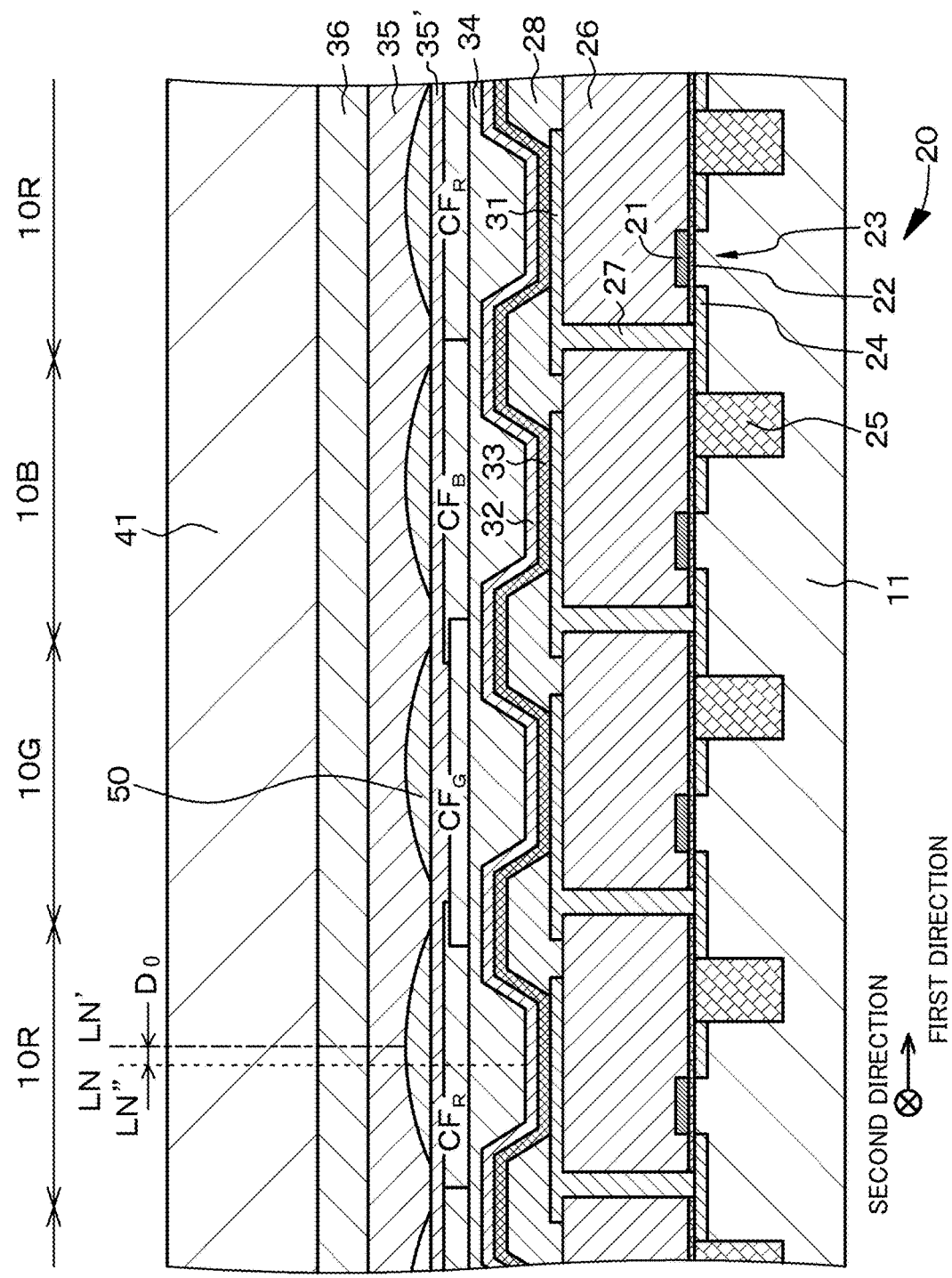
FIG. 2 is a schematic partial cross-sectional view of light emitting elements constituting (and located away from the reference point of) the display device of the first embodiment.

A first embodiment relates to the display device of the present disclosure. FIG. 1 shows a schematic partial cross-sectional view of light emitting elements constituting (and located within a reference point of) the display device of the first embodiment, and FIG. 2 shows a schematic partial cross-sectional view of light emitting elements (located away from the reference point). Also, FIG. 3A schematically shows a positional relationship between a light emitting element provided in a display panel of the display device of the first embodiment and the reference point, and FIGS. 8A and 8B schematically show an arrangement relationship between a light emitting part, a color filter layer, and a lens member in the display panel of the first embodiment. Specifically, the display device of the first embodiment is configured of an organic EL display device, and specifically, the light emitting element of the first embodiment is configured of an organic EL element. Further, the display device of the first embodiment is a top emission type (a top surface light emitting type) display device (a top surface light emitting type display device) that emits light from a second substrate. An electrode on a first substrate side is a first electrode, and an electrode on a second substrate side is a second electrode.

The display device of the first embodiment has a display panel provided with a plurality of light emitting elements 10 (10R, 10G, and 10B), each of the light emitting elements including:

a light emitting part 30; and
a lens member (an on-chip micro lens) 50 through which light emitted from the light emitting part 30 passes, and when a distance between a normal LN passing through a center of the light emitting part 30 and a normal LN' passing through a center of the lens member 50 is defined as $D_0$, a value of the distance $D_0$ is not 0 in at least some of the light emitting elements 10 provided in the display panel. Further, a center of the light emitting part 30 indicates a centroid point of an area of a region at which a first electrode 31 and an organic layer 33, which will be described later, are in contact with each other.

In addition, a reference point P is assumed, and the distance $D_0$ depends on a distance $D_1$ from the reference point P to the normal LN passing through the center of the light emitting part 30.

In the display device of the first embodiment, the reference point P is assumed to be in the display panel. However, the reference point P is not located (not included) in a central region of the display panel. In FIGS. 3A, 3B, 12A, and 12B, the central region of the display panel is indicated by a black triangle mark, the light emitting element 10 is indicated by a square mark, the center of the light emitting part 30 is indicated by a black square mark, and the reference point P is indicated by a black circle. In addition, a positional relationship between the light emitting element 10 and the reference point P is schematically shown in FIG. 3A, but one reference point P is assumed. Since the reference point P may include extension to some extent, the value of the distance $D_0$ is 0 in some light emitting elements 10 (specifically, one or a plurality of light emitting elements 10 included in the reference point P), and the value of the distance $D_0$ is not 0 in the remaining light emitting elements 10. The value of the distance (an offset amount) $D_0$ differs depending on a position occupied by the light emitting element on the display panel.

As described above, in the display device of the first embodiment or a second embodiment to a fifth embodiment, which will be described later, the light emitting part 30 provided in the light emitting part 10 includes an organic electroluminescence layer (an organic EL layer). That is, the display devices of the first embodiment to the fifth embodiment are configured of an organic electroluminescence display device (an organic EL display device), and the light emitting element 10 is configured of an organic electroluminescence element (an organic EL element).

In the display device of the embodiment, the light emitted from each light emitting element 10 and passing through the lens member 50 converges (condenses) on a certain region of a space outside the display device. Alternatively, the light emitted from each light emitting element 10 and passing through the lens member 50 is diverged in a space outside the display device. Alternatively, the light emitted from each light emitting element 10 and passing through the lens member 50 is parallel light. Whether the light that has passed through the lens member 50 is convergent light, divergent light, or parallel light is based on specifications required for the display device. In addition, power of the lens member 50 and the like may be designed on the basis of the specifications. In a case in which the light that has passed through the lens member 50 is convergent light, a position of the space in which an image emitted from the display device is formed may or may not be on a normal of the reference point P, which depends on specifications required for the display device. In order to control a display dimension, a display position, and the like of the image emitted from the display device, an optical system through which the image emitted from the display device passes may be disposed. What kind of optical system is disposed also depends on specifications required for the display device, but for example, an imaging lens system can be exemplified.

Further, in the display device of the first embodiment, the reference point P is set, and the plurality of light emitting elements 10 are arranged in a first direction (specifically, an X direction) and a second direction (specifically, a Y direction) different from the first direction. In addition, when the distance from the reference point P to the normal LN passing through the center of the light emitting part 30 is defined as $D_1$, values of the distance $D_0$ in the first direction (X direction) and the second direction (Y direction) are defined as $D_{0-X}$ and $D_{0-Y}$, and values of the distance $D_1$ in the first direction (X direction) and the second direction (Y direction) are defined as $D_{1-X}$ and $D_{1-Y}$,

[A] $D_{0-X}$ may be designed to change linearly with a change of $D_{1-X}$, and $D_{0-Y}$ may be designed to change linearly with a change of $D_{1-Y}$,

[B] $D_{0-X}$ may be designed to change linearly with a change of $D_{1-X}$, and $D_{0-Y}$ may be designed to change non-linearly with a change of $D_{1-Y}$,

[C] $D_{0-X}$ may be designed to change non-linearly with a change of $D_{1-X}$, and $D_{0-Y}$ may be designed to change linearly with a change of $D_{1-Y}$, and

[D] $D_{0-X}$ may be designed to change non-linearly with a change of $D_{1-X}$, and $D_{0-Y}$ may be designed to change non-linearly with a change of $D_{1-Y}$.

FIGS. 4A, 4B, 4C, 4D, 5A, 5B, 5C, 5D, 6A, 6B, 6C, 6D, 7A, 7B, 7C and 7D schematically shows the change of $D_{0-X}$ with respect to the change of $D_{1-X}$ and the change of $D_{0-Y}$ with respect to the change of $D_{1-Y}$. In these figures, white arrows indicate linear changes and black arrows indicate non-linear changes. Further, in a case in which the arrow points toward an outside of the display panel, it indicates that the light passing through the lens member 50 is divergent light, and in a case in which the arrow points toward an inside of the display panel, it indicates that the light passing through the lens member 50 is convergent light or parallel light.

Alternatively, when the reference point P is set and the distance from the reference point P to the normal LN passing through the center of the light emitting part 30 is defined as $D_1$, it may be designed such that the value of the distance $D_0$ increases as the value of the distance $D_1$ increases.

That is, the changes in $D_{0-X}$ and $D_{0-Y}$ depending on the changes in $D_{1-X}$ and $D_{1-Y}$ may be determined on the basis of specifications required for the display device.

Specifically, the display device of the first embodiment includes:

a first substrate 11, and a second substrate 41; and a plurality of light emitting elements 10 (10R, 10G, and 10B) which are located between the first substrate 11 and the second substrate 41 and arranged two-dimensionally, the light emitting element 10 (10R, 10G, and 10B) includes a light emitting part 30, the light emitting part 30 provided on a substrate 26 formed on the first substrate 11 includes at least:

a first electrode 31;

a second electrode 32; and an organic layer (having a light emitting layer including an organic electroluminescence layer) 33 sandwiched between the first electrode 31 and the second electrode 32, and in the first embodiment, light from the organic layer 33 is emitted to the outside through the second substrate 41.

More specifically, the light emitting part 30 included in each light emitting element (10R, 10G, and 10B) is provided on the substrate 26 formed on the first substrate 11, and the light emitting part 30 includes at least:

a first electrode 31;

an organic layer (an organic electroluminescence layer) 33 formed on the first electrode 31; and a second electrode 32 formed on the organic layer 33.

In addition, on a light incident side or a light emitting side of the lens member 50 (in the display device of the first embodiment, on the light incident side of the lens member 50), color filter layers $CF_R$, $CF_G$, and $CF_B$ (hereinafter, they may be collectively referred to as a color filter layer CF) are provided. Specifically, a protective layer 34 made of an acrylic resin is formed on the second electrode 32 to cover the second electrode 32. The color filter layer CF made of a well-known material is formed on the top surface or above the protective layer 34 (specifically, on the protective layer 34 in the first embodiment) using a well-known method, and the lens member (on-chip micro lens) 50 made of a well-known material is provide above the color filter layer CF using a well-known method. As shown, a flattening film 35' may be formed between the color filter layer CF and the lens member 50 with the same material as the lens member 50. In addition, a flattening layer 35 is formed on the flattening film 35' and the lens member 50. The arrangement relationship between the light emitting part 30, the color filter layer CF, and the lens member 50 in the display device is schematically shown in FIGS. 8A and 8B, but an orthographic projection image of the lens member 50 is included in an orthographic projection image of the color filter layer CF. Also, outer shapes of the light emitting part 30, the color filter layer CF, and the lens member 50 are circular for convenience, but are not limited to such shapes. Further, in the light emitting element 10 in which the value of the distance $D_0$ is not 0, a normal LN passing through a center of the color filter layer CF and the normal LN passing through the center of the light emitting part 30 coincide with each other. That is, when the distance (offset amount) between the normal passing through the center of the light emitting part and the normal passing through the center of the color filter layer CF is $d_0$, $d_0=0$. By adopting such a configuration, it is possible to reliably inhibit occurrence of color mixing between the adjacent light emitting elements.

Also, in conventional display devices, the arrangement relationship of the light emitting part 30, the color filter layer, and the lens member in all the light emitting elements 10 occupying a display region is the same as that shown in FIG. 8A.

The flattening layer 35 formed on the flattening film 35' and the lens member 50 is bonded to the second substrate 41 via a sealing resin layer 36. As materials constituting the sealing resin layer 36, thermosetting adhesives such as acrylic adhesives, epoxy adhesives, urethane adhesives, silicone adhesives, and cyanoacrylate adhesives, and ultraviolet curable adhesives can be exemplified. The color filter layer CF is an on-chip color filter layer (OCCF) formed on the first substrate side. In addition, this makes it possible to shorten a distance between the organic layer 33 and the color filter layer CF, and thus it is possible to prevent the light emitted from the organic layer 33 from entering the adjacent color filter layer CF of another color to cause color mixing and to perform a wide range of lens designs for the lens member 50. In some cases, the flattening layer 35 may be omitted, and the lens member 50 and the flattening film 35' may be bonded to the second substrate 41 via the sealing resin layer 36.

In the light emitting elements 10 of the first embodiment to the fifth embodiment configured of organic EL elements, the organic layer 33 has a laminated structure of a red light emitting layer, a green light emitting layer, and a blue light emitting layer. One pixel is configured of three light emitting elements, a red light emitting element 10R, a green light emitting element 10G, and a blue light emitting element 10B. The organic layer 33 constituting the light emitting element 10 emits white light, and each of the light emitting elements 10R, 10G, and 10B is configured of a combination of the organic layer 33 that emits white light and the color filter layers $CF_R$, $CF_G$, and $CF_B$. The red light emitting element 10R that should display red is provided with a red color filter layer $CF_R$, the green light emitting element 10G that should display green is provided with a green color filter layer $CF_G$, and the blue light emitting element 10B that should display blue is provided with a blue color filter layer $CF_B$. The red light emitting element 10R, the green light emitting element 10G, and the blue light emitting element 10B have substantially the same configuration and structure except for positions of the color filter layers and the light emitting layers. The number of pixels is, for example, 1920×1080, one light emitting element (a display element) constitutes one sub-pixel, and the light emitting element (specifically, the organic EL element) is three times the number of pixels. In the display device of the first embodiment, as an arrangement of the sub-pixels, a delta arrangement shown in FIG. 22A can be exemplified. However, a stripe arrangement as shown in FIGS. 22B, 22C, and 22D may be used. In some cases, one pixel may be configured of the red light emitting element 10R, the green light emitting element 10G, the blue light emitting element 10B, and a light emitting element that emits white (or a light emitting element that emits light of a complementary color).

Figure 23:
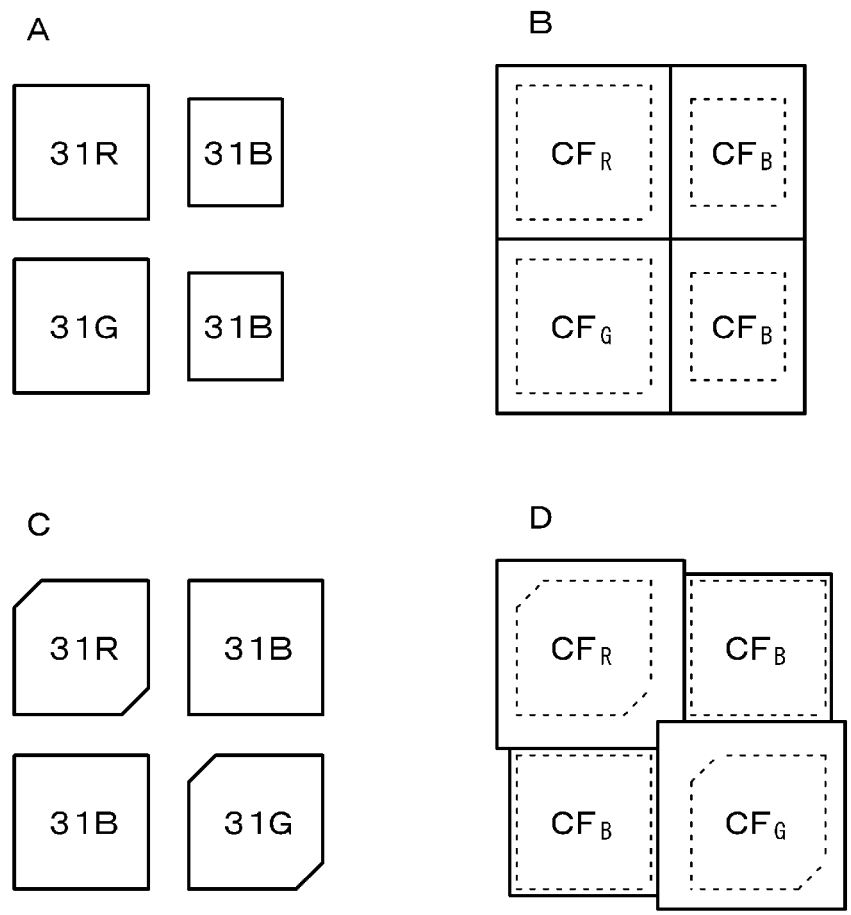
FIGS. 23A and 23B, and 23C and 23D are diagrams schematically showing an arrangement relationship between a second electrode and the color filter layer in the display device of the first embodiment.

FIGS. 23A, 23B, 23C, and 23D schematically show an arrangement relationship between the first electrodes 31R, 31G, and 31B and the color filter layers $CF_R$, $CF_G$, and $CF_B$. In FIGS. 23B and 23D, the color filter layers $CF_R$, $CF_G$, and $CF_B$ are shown by dotted lines. Especially in applications such as electronic viewfinders that shake eyes (that is, coloring of a viewing angle is concerned), by adjusting sizes of the color filter layers $CF_R$, $CF_G$, and $CF_B$ in the red light emitting element 10R, the green light emitting element 10G, and the blue light emitting element 10B, and sizes of the first electrodes 31R, 31G, 31B, specifically, as shown in FIGS. 23A and 23B, by setting their relationship as (a width of the first electrode of the red light emitting element)=(a width of the first electrode of the green light emitting element)>(a width of the first electrode of the blue light emitting element), the red light emitting element, the green light emitting element, and the blue light emitting element, which are configured of the light emitting elements including the organic layer 33 that emits white light, have the same color intensity with viewing angles thereof as parameters, so that occurrence of coloring due to the viewing angles (viewing angle coloring) can be avoided.

Further, as shown in FIGS. 23C and 23D, in a case in which two blue light emitting elements are disposed diagonally and a red light emitting element and a green light emitting element are disposed diagonally, it is preferable to cut out opposite portions of the first electrode 31R constituting the red light emitting element and the first electrode 31G constituting the green light emitting element, and in order to maintain viewing angle symmetry in azimuth angle, it is more preferable to cut out a portion of the first electrode 31R facing the cutout portion of the first electrode 31R of the red light emitting element and to cut out a portion of the first electrode 31G facing the cutout portion of the first electrode 31G of the green light emitting element.

A light emitting element driving part is provided below the substrate 26 made of $SiO_2$ formed on the basis of a CVD method. The light emitting element driving part may have a well-known circuit configuration. The light emitting element driving part is configured of a transistor (specifically, a MOSFET) formed on a silicon semiconductor substrate corresponding to the first substrate 11. The transistor 20 configured of the MOSFET is configured of a gate insulating layer 22 formed on the first substrate 11, a gate electrode 21 formed on the gate insulating layer 22, a source and drain region 24 formed on the first substrate 11, a channel formation region 23 formed between the source and drain regions 24, and an element separation region 25 surrounding the channel formation region 23 and the source and drain region 24. The transistor 20 and the first electrode 31 are electrically connected to each other via a contact plug 27 provided on the substrate 26. Also, in the figures, one transistor 20 is shown for each light emitting element driving part.

The second electrode 32 is connected to the light emitting element driving part via a contact hole (a contact plug) (not shown) formed in the substrate 26 on an outer peripheral portion of the display panel. An auxiliary electrode connected to the second electrode 32 may be provided below the second electrode 32 on the outer peripheral portion of the display panel, and the auxiliary electrode may be connected to the light emitting element driving part.

The first electrode 31 functions as an anode electrode, and the second electrode 32 functions as a cathode electrode. The first electrode 31 is configured of a light reflecting material layer, specifically, for example, an Al—Nd alloy layer, an Al—Cu alloy layer, a laminated structure of an Al—Ti alloy layer and an ITO layer, and the second electrode 32 is made of a transparent conductive material such as ITO. The first electrode 31 is formed on the substrate 26 on the basis of a combination of a vacuum vapor deposition method and an etching method. Further, the second electrode 32 is formed using a film forming method such as a vacuum vapor deposition method in which energy of film-forming particles is small, and is not patterned. The organic layer 33 is also not patterned. However, the present invention is not limited to this, and the organic layer 33 may be patterned. That is, the organic layer 33 may be painted separately for each sub-pixel, the organic layer 33 of the red light emitting element may be configured of an organic layer that emits red, the organic layer 33 of the green light emitting element is configured of an organic layer that emits green, and the organic layer 33 of the blue light emitting element may be configured of an organic layer that emits blue.

In the first embodiment, the organic layer 33 has a laminated structure of a hole injection layer (HIL), a hole transport layer (HTL), a light emitting layer, an electron transport layer (ETL), and an electron injection layer (EIL). The light emitting layer is configured of at least two light emitting layers that emit light of different colors, and as described above, the light emitted from the organic layer 33 is white. Specifically, as described above, the organic layer has a structure in which three layers of a red light emitting layer that emits red light, a green light emitting layer that emits green light, and a blue light emitting layer that emits blue light are laminated. The organic layer may have a structure in which two layers of a blue light emitting layer that emits blue light and a yellow light emitting layer that emits yellow light are laminated, or a structure in which two layers of a blue light emitting layer that emits blue light and an orange light emitting layer that emits orange light are laminated.

The hole injection layer is a layer that enhances hole injection efficiency and also functions as a buffer layer that prevents leaks, and has a thickness of, for example, about 2 nm to 10 nm. The hole injection layer is made of, for example, a hexaazatriphenylene derivative represented by the following formula (A) or formula (B). Further, when an end face of the hole injection layer is in contact with the second electrode, it becomes a main cause of brightness variation between pixels and leads to deterioration of display image quality.

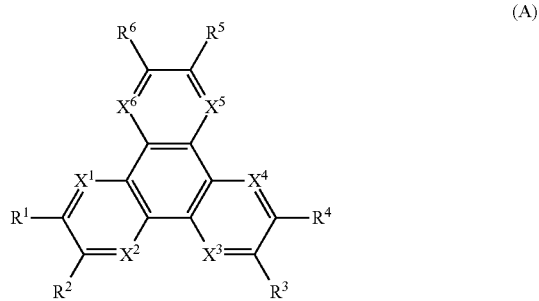

(A)

Here, $R^1$ to $R^6$ are substituents independently selected from hydrogen, halogen, a hydroxy group, an amino group, an arulamino group, a substituted or unsubstituted carbonyl group having 20 or less carbon atoms, a substituted or unsubstituted carbonyl ester group having 20 or less carbon atoms, a substituted or unsubstituted alkyl groups with 20 or less carbon atoms, a substituted or unsubstituted alkenyl group having 20 or less carbon atoms, a substituted or unsubstituted alkoxy group having 20 or less carbon atoms, a substituted or unsubstituted aryl groups having 30 or less carbon atoms, a substituted or unsubstituted heterocyclic group having 30 or less carbon atoms, a nitrile group, a cyano group, a nitro group, or a silyl group. Neighboring $R_m$ (m=1 to 6) may be coupled to each other via an annular structure. Further, $X^1$ to $X^6$ are independently carbon or nitrogen atoms.

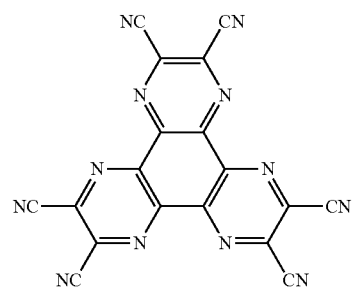

(B)

The hole transport layer is a layer that enhances hole transport efficiency to the light emitting layer. In the light emitting layer, when an electric field is applied, electrons and holes are recombined to generate light. The electron transport layer is a layer that enhances electron transport efficiency to the light emitting layer, and the electron injection layer is a layer that enhances electron injection efficiency into the light emitting layer.

The hole transport layer is configured of, for example, 4,4',4"-tris (3-methylphenylphenylamino) triphenylamine (m-MTDATA) or α-naphthylphenyldiamine (αNPD) having a thickness of about 40 nm.

The light emitting layer is a light emitting layer that produces white light by mixing colors. For example, as described above, the red light emitting layer, the green light emitting layer, and the blue light emitting layer are laminated.

In the red light emitting layer, when an electric field is applied, some of the holes injected from the first electrode 31 and some of the electrons injected from the second electrode 32 are recombined to generate red light. Such a red light emitting layer contains, for example, at least one of a red light emitting material, a hole transporting material, an electron transporting material, and an amphoteric charge transporting material. The red light emitting material may be a fluorescent material or a phosphorescent material. The red light emitting layer having a thickness of about 5 nm is made of, for example, a mixture of 4,4-bis(2,2-diphenylvinyl) biphenyl (DPVBi) mixed with 30% by mass of 2,6-bis[(4'-methoxydiphenylamino)styryl]-1,5-Dicyanonaphthalene (BSN).

In the green light emitting layer, when an electric field is applied, some of the holes injected from the first electrode 31 and some of the electrons injected from the second electrode 32 are recombined to generate green light. Such a green light emitting layer contains, for example, at least one of a green light emitting material, a hole transporting material, an electron transporting material, and an amphoteric charge transporting material. The green light emitting material may be a fluorescent material or a phosphorescent material. The green light emitting layer having a thickness of about 10 nm is made of, for example, a mixture of DPVBi mixed with 5% by mass of coumarin 6.

In the blue light emitting layer, when an electric field is applied, some of the holes injected from the first electrode 31 and some of the electrons injected from the second electrode 32 are recombined to generate blue light. Such a blue light emitting layer contains, for example, at least one of a blue light emitting material, a hole transporting material, an electron transporting material, and a both charge transporting material. The blue light emitting material may be a fluorescent material or a phosphorescent material. The blue light emitting layer having a thickness of about 30 nm is made of, for example, a mixture of DPVBi mixed with 2.5% by mass of 4,4'-bis[2-{4-(N,N-diphenylamino)phenyl}vinyl]biphenyl (DPAVBi).

The electron transport layer having a thickness of about 20 nm is made of, for example, 8-hydroxyquinoline aluminum (Alq3). The electron injection layer having a thickness of about 0.3 nm is made of, for example, LiF or $Li_2O$.

However, the materials constituting each layer are examples and are not limited to these materials. Further, for example, the light emitting layer may be configured of the blue light emitting layer and the yellow light emitting layer, or may be configured of the blue light emitting layer and the orange light emitting layer.

The light emitting element 10 has a resonator structure in which the organic layer 33 is a resonance part and is sandwiched between the first electrode 31 and the second electrode 32. In order to appropriately adjust a distance from a light emitting surface to a reflecting surface (specifically, a distance from the light emitting surface to the first electrode 31 and the second electrode 32), a thickness of the organic layer 33 is preferably $8 \times 10^{-8}$ m or more and $5 \times 10^{-7}$ m or less, and more preferably $1.5 \times 10^{-7}$ m or more and $3.5 \times 10^{-7}$ m or less. In the organic EL display device having a resonator structure, in reality, the red light emitting element 10R resonates the red light emitted in the light emitting layer and emits reddish light (light having a peak in the optical spectrum in the red region) from the second electrode 32. Also, the green light emitting element 10G resonates the green light emitted in the light emitting layer and emits greenish light (light having a peak in the optical spectrum in the green region) from the second electrode 32. Further, the blue light emitting element 10B resonates the blue light emitted in the light emitting layer and emits bluish light (light having a peak in the optical spectrum in the blue region) from the second electrode 32. In the resonator structure, specifically, as the material constituting the first electrode 31, it may be made of a material that reflects light with high efficiency as described above.

Hereinafter, an outline of a method for manufacturing the light emitting element 10 of the first embodiment shown in FIGS. 1 and 2 will be described.

[Step-100]

First, the light emitting element driving part is formed on the silicon semiconductor substrate (first substrate 11) on the basis of a known MOSFET manufacturing process.

[Step-110]

Next, the substrate 26 is formed on the entire surface thereof on the basis of a CVD method.

[Step-120]

Then, a connection hole is formed in portions of the substrate 26 located above the source and drain region 24 on one side of the transistor 20 on the basis of a photolithography technique and an etching technique, a metal layer is formed on the substrate 26 including the connection hole, for example, using a sputtering method, and the metal layer is subsequently patterned on the basis of the photolithography technique and the etching technique, and thus the first electrode 31 can be formed on a part of the substrate 26. The first electrode 31 is separated for each light emitting element. At the same time, the contact hole (contact plug) 27 for electrically connecting the first electrode 31 and the transistor 20 can be formed in the connection hole.

[Step-130]

Next, for example, after the insulating layer 28 is formed on the entire surface on the basis of the CVD method, the insulating layer 28 is caused to left on the substrate 26 between the first electrode 31 and the first electrode 31 on the basis of the photolithography technique and the etching technique.

[Step-140]

Then, the organic layer 33 is formed on the first electrode 31 and the insulating layer 28, for example, using a PVD method such as a vacuum vapor deposition method or a sputtering method, a coating method such as a spin coating method or a die coating method, or the like. In some cases, the organic layer 33 may be patterned into a desired shape.

[Step-150]

Next, the second electrode 32 is formed on the entire surface on the basis of, for example, a vacuum vapor deposition method. In some cases, the second electrode 32 may be patterned into a desired shape. In this way, the organic layer 33 and the second electrode 32 can be formed on the first electrode 31.

[Step-160]

Figure 24:
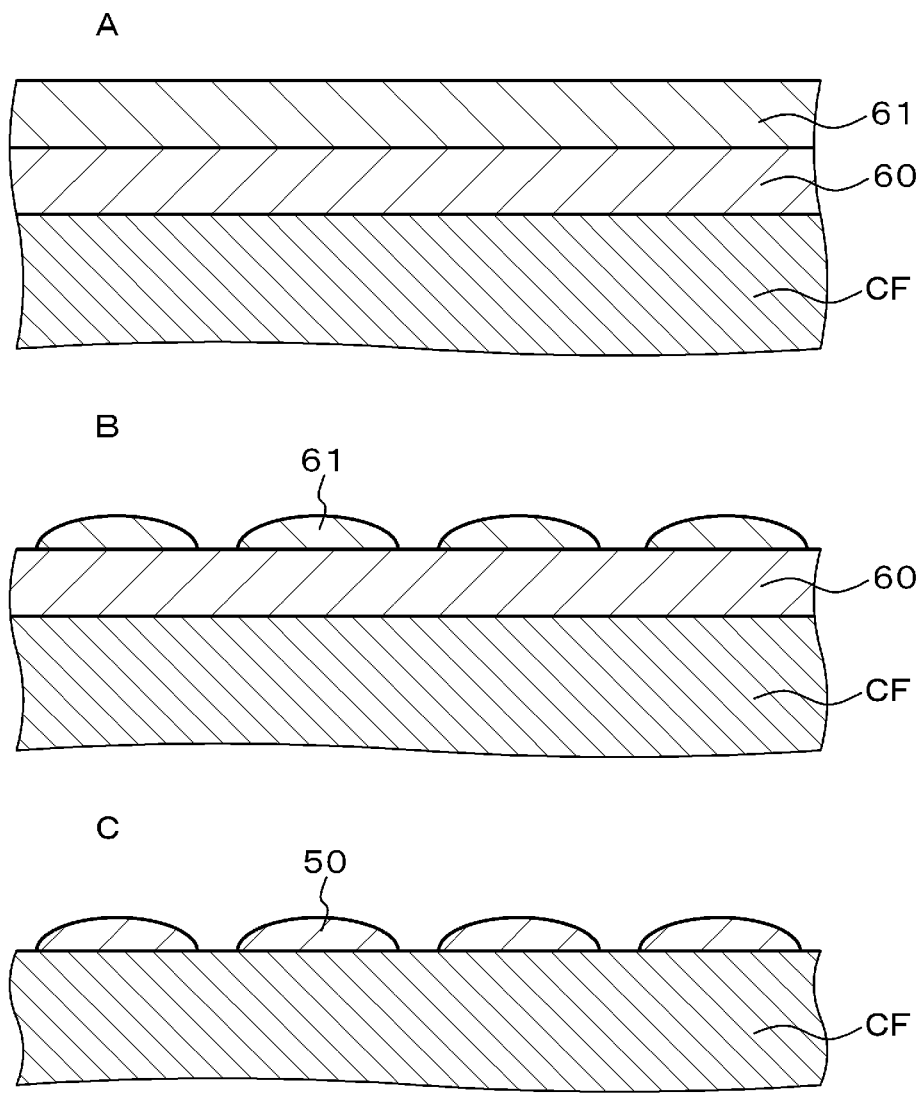
FIGS. 24A, 24B, and 24C are schematic partial end views of a substrate or the like for explaining a method of manufacturing the lens member in the light emitting element of the first embodiment shown in FIG. 1.

Then, on the basis of a coating method, the protective layer 34 is formed on the entire surface, and then a top surface of the protective layer 34 is flattened. Since the protective layer 34 can be formed on the basis of the coating method, there are few restrictions on a processing process, a material selection range is wide, and a high refractive index material can be used. Then, using a well-known method, the color filter layer CF ($CF_R$, $CF_G$, and $CF_B$) is formed on the protective layer 34 and the flattening film 35' is formed on the color filter layer CF, and the lens member 50 is formed on the flattening film 35'. Specifically, as shown in FIG. 24A, a lens member forming layer 60 for forming the lens member 50 is formed on the color filter layer CF, and a resist material layer 61 is formed on the lens member forming layer 60. Then, the resist material layer 61 is patterned and further heat-treated to form the resist material layer 61 into a lens member shape (see FIG. 24B). Next, by etching back the resist material layer 61 and the lens member forming layer 60, the shape formed on the resist material layer 61 is transferred to the lens member forming layer 60 (see FIG. 24C). In this way, the lens member 50 can be obtained.

[Step-170]

Then, the flattening layer 35 is formed on the flattening film 35' and the lens member 50. Then, the flattening layer 35 and the second substrate 41 are bonded together by the sealing resin layer 36 made of an acrylic adhesive. In this way, the display device of the light emitting element (organic EL element) 10 and the first embodiment shown in FIGS. 1 and 2 can be obtained. As described above, by making the device a so-called OCCF type in which the color filter layer CF is not provided on the second substrate side and the color filter layer CF is provided on the first substrate side, the distance between the organic layer 33 and the color filter layer CF can be shortened, a range of design and a degree of freedom in design of the lens member 50 are widened, and by making the device a so-called OCCF type, a possibility of occurrence of alignment problem with the organic layer 33 decreases.

In the display device of the first embodiment, when the distance between the normal LN passing through the center of the light emitting part and the normal LN' passing through the center of the lens member is $D_0$, the value of the distance $D_0$ is not 0 in at least some of the light emitting elements constituting the display device, and thus the direction in which the light emitted from the light emitting layer and passing through the lens member goes can be reliably and accurately controlled on the basis of the position of the light emitting element on the display panel. That is, it is possible to reliably and accurately control to which region of an external space the image from the display device is emitted in what state. Further, by providing the lens member, it is possible not only to achieve increase in brightness (luminance) of the image emitted from the display device and prevention of color mixing between adjacent pixels, but also to appropriately diverge the light in accordance with required viewing angles and extend life spans of the light emitting element and the display device and realize higher brightness. Therefore, it is possible to reduce a size, weight, and achieve high quality of the display device. In addition, applications for eyewear, augmented reality (AR) glasses, and VR will be greatly expanded.

FIG. 9A shows results of simulating a relationship between a light beam angle θ (unit: degree) and a light amount (luminance) when the distance $D_0$ is changed. Also, meanings of reference signs A, B, C, D, E, and F in FIG. 9A are as shown in Table 1 below. Further, in the simulation, a diameter of the light emitting part 30 having a circular outer shape was set to 2.6 μm, and a diameter of the lens member having a circular outer shape was set to 5.8 μm. Also, the light beam angle means an angle formed by a light beam emitted from the lens member 50 and the normal LN' passing through the center of the lens member 50. In addition, in Table 1, a main light beam angle is a light beam angle when the light beam emitted from the lens member 50 has the highest light amount (luminance).

TABLE 1

| | Distance $D_0$ | Main light beam angle | Brightness increase proportion |
|---|---|---|---|
| A | 0.00 μm | 0 degrees | 1.00 |
| B | 0.51 μm | 15 degrees | 1.07 |
| C | 1.05 μm | 34 degrees | 1.64 |
| D | 1.67 μm | 49 degrees | 2.17 |
| E | 2.43 μm | 63 degrees | 2.57 |
| F | 3.45 μm | 63 degrees | 1.95 |

From FIG. 9A, it can be seen that even when the distance $D_0$ is changed, there is no significant difference in a change of the light amount (luminance) with respect to the light beam angle θ. In addition, as shown in FIG. 9B, as compared with a case of a conventional display device (distance $D_0$=0 regardless of the position of the light emitting element in the display region of the display device) (see "A" in FIG. 9B), in the display device of the first embodiment, the light amount (luminance) at a distance $D_0$=2.57 μm and a light beam angle of 63 degrees is increased by about 2.6 times as shown by "E" in FIG. 9B. Table 1 shows a proportion of increase in the light amount (luminance) in the display device of the first embodiment with respect to the conventional display device.

The display device of the first embodiment may have a configuration in which a plurality of reference points are assumed. Also, the plurality of reference points are disposed in the display region of the display panel. A positional relationship between the light emitting element 10 and the reference points $P_1$ and $P_2$ is schematically shown in FIG. 3B, but in the illustrated example, two reference points $P_1$ and $P_2$ are assumed. Specifically, the two reference points $P_1$ and $P_2$ are disposed in a twice rotation symmetry with a center of the display panel as a point of symmetry. Here, at least one reference point is not included in the central region of the display panel. In the illustrated example, the two reference points $P_1$ and $P_2$ are not included in the central region of the display panel. The value of the distance $D_0$ is 0 in some of the light emitting elements (specifically, one or a plurality of light emitting elements included in the reference point P), and the value of the distance $D_0$ is not 0 in the remaining light emitting elements. Regarding the distance $D_1$ from the reference point to the normal LN passing through the center of the light emitting part 30, the distance $D_1$ is defined as a distance from the normal LN passing through a center of a certain light emitting part 30 to the closer reference point.

Figure 10:
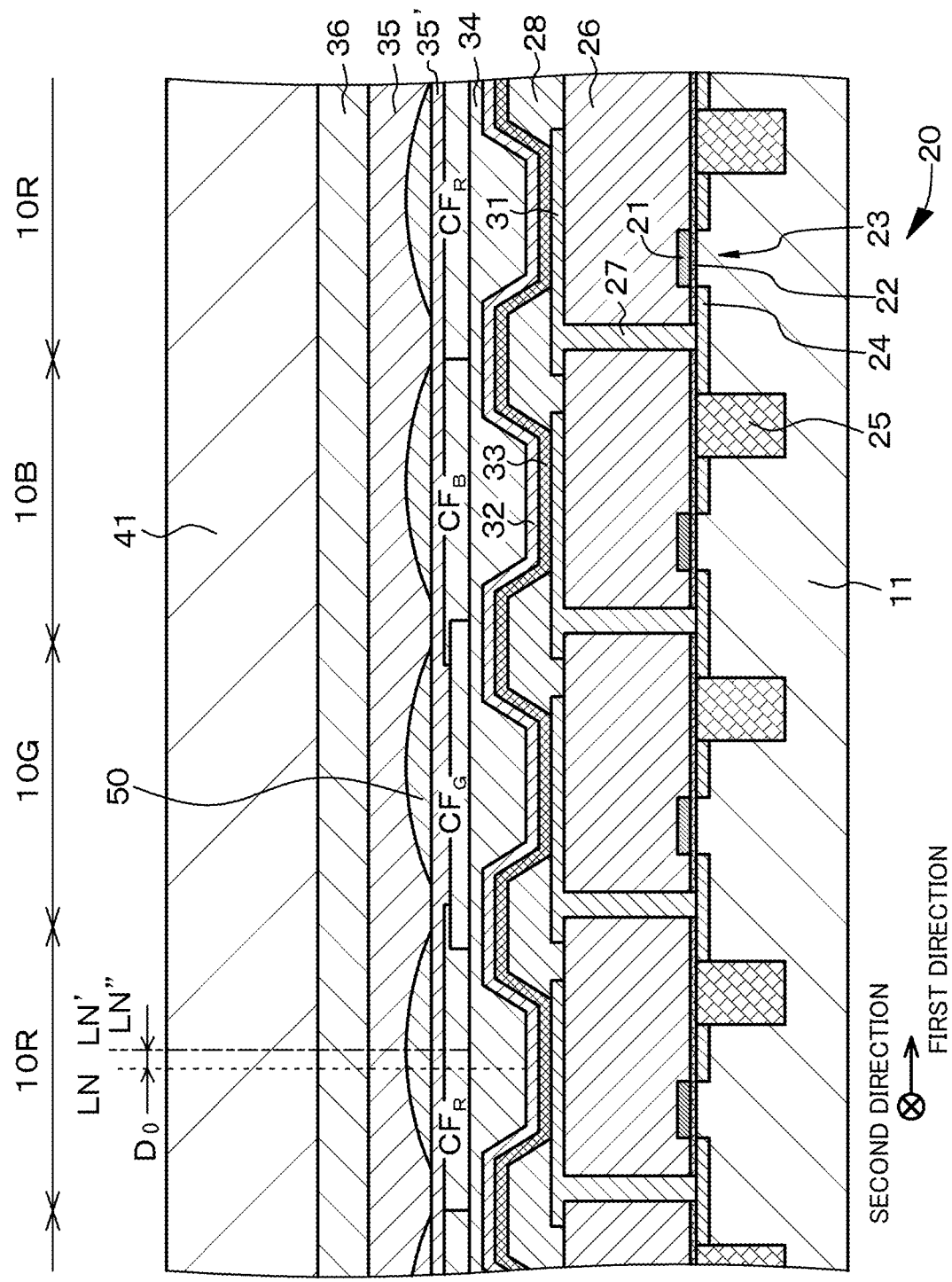
FIG. 10 is a schematic partial cross-sectional view of light emitting elements constituting (and located away from the reference point of) a first modified example of the display device of the first embodiment.

FIG. 10 shows a schematic partial cross-sectional view of light emitting elements constituting (and located away from the reference point of) a first modified example of the display device of the first embodiment, but it may also be configured such that the orthographic projection image of the lens member 50 is included in the orthographic projection image of the color filter layer CF, and in the light emitting element in which the value of the distance $D_0$ is not 0, the normal LN" passing through the center of the color filter layer CF and the normal LN' passing through the center of the lens member 50 coincide with each other. That is, $D_0=d_0>0$.

Figure 11:
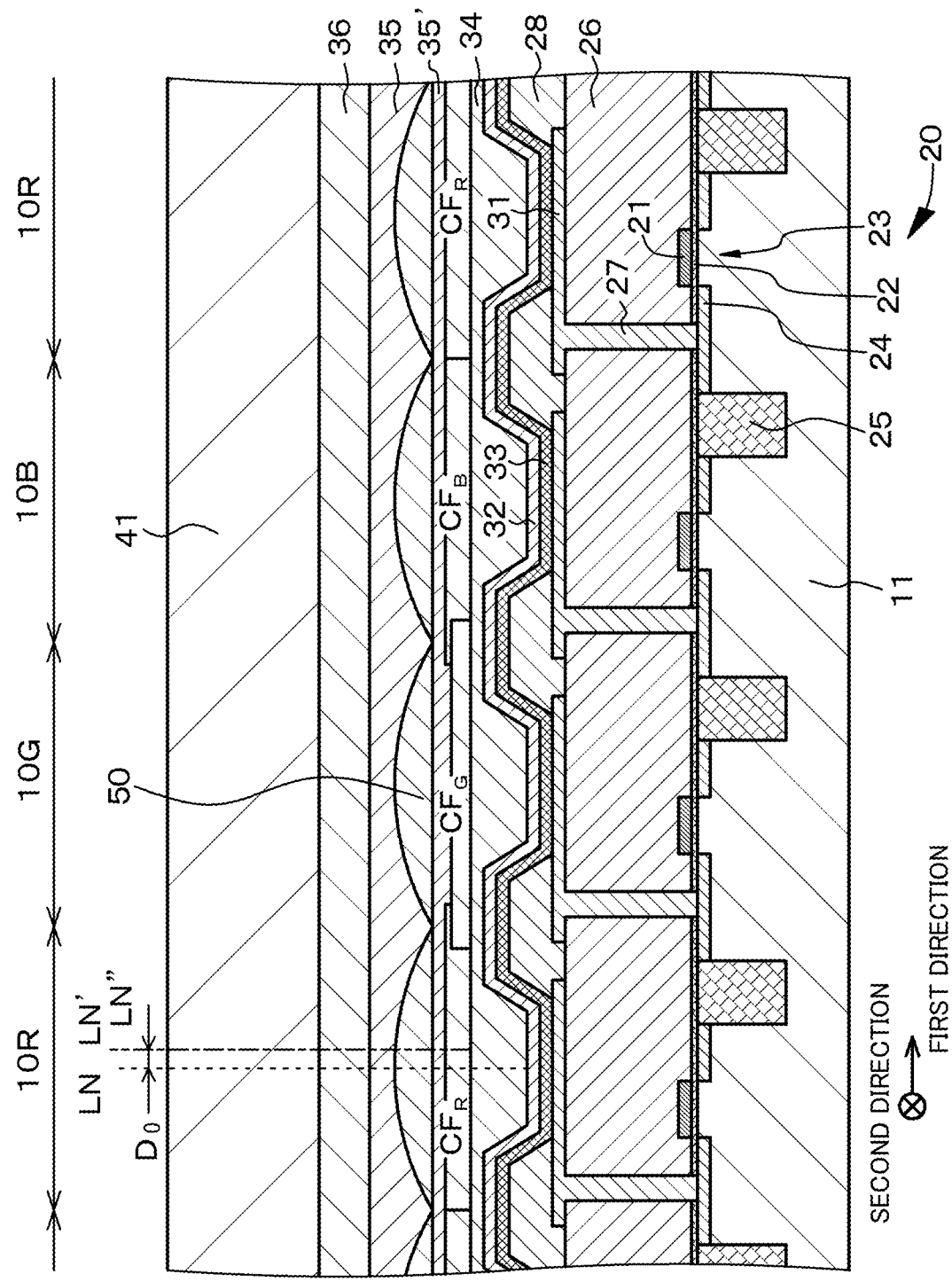
FIG. 11 is a schematic partial cross-sectional view of light emitting elements constituting (and located away from the reference point of) a second modified example of the display device of the first embodiment.

Alternatively, FIG. 11 shows a schematic partial cross-sectional view of light emitting elements constituting (and located away from a reference point of) a second modified example of the display device of the first embodiment, but it may be configured such that the orthographic projection image of the lens member 50 coincides with the orthographic projection image of the color filter layer CF, and in the light emitting element in which the value of the distance $D_0$ is not 0, the normal LN" passing through the center of the color filter layer CF and the normal LN' passing through the center of the lens member 50 coincide with each other. That is, $D_0=d_0>0$.

By adopting the configuration of the first modified example or the second modified example of the display device of the first embodiment, it is possible to surely inhibit occurrence of color mixing between the adjacent light emitting elements.

Second Embodiment

Figure 12:
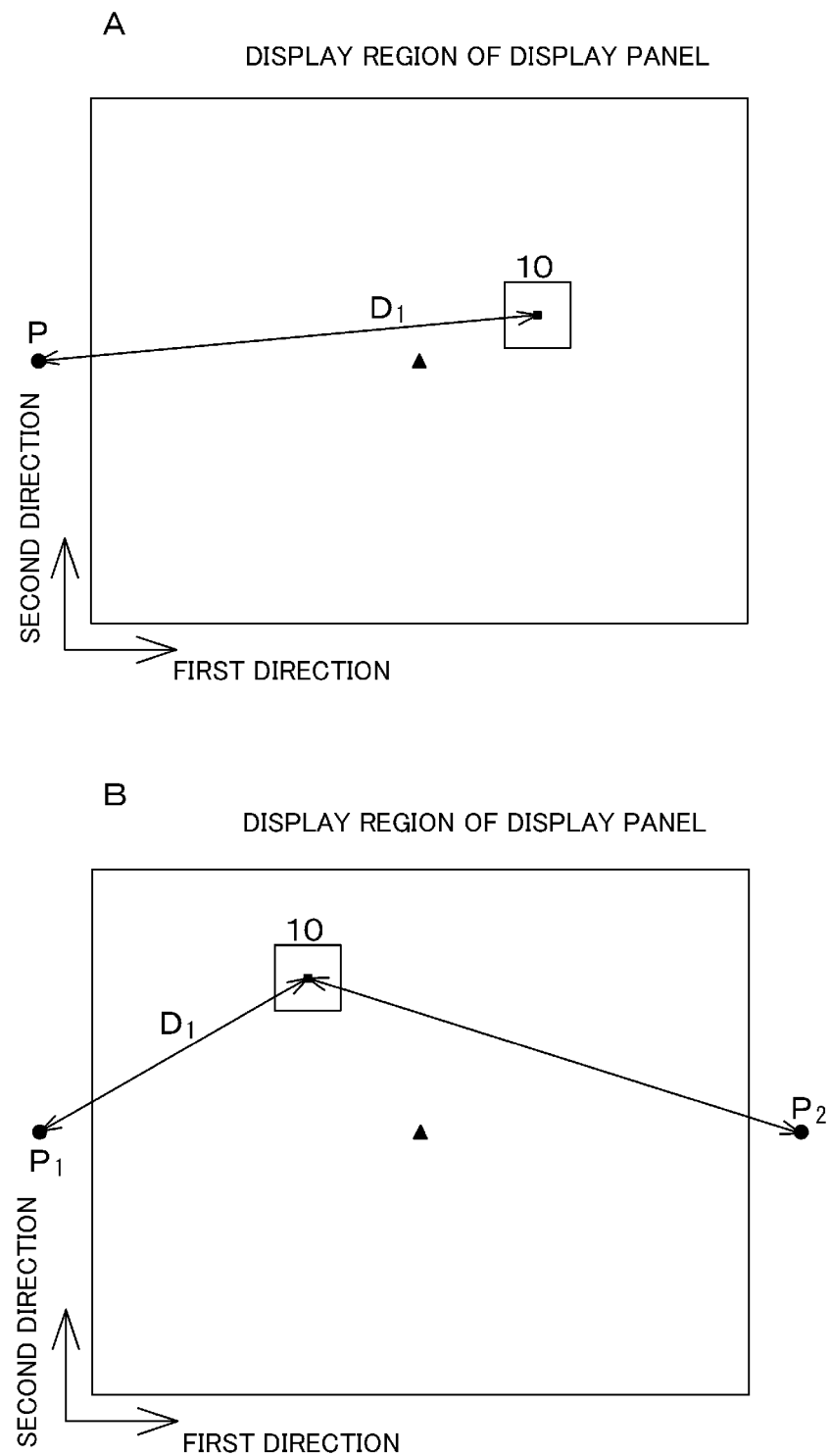
FIGS. 12A and 12B are diagrams schematically showing a positional relationship between a light emitting element and a reference point in a display device of a second embodiment.

A second embodiment is a modification of the first embodiment. In the display device of the second embodiment, the reference point P is assumed to be outside the display panel. A positional relationship between the light emitting element 10 and the reference points P, $P_1$, and $P_2$ is schematically shown in FIGS. 12A and 12B. A configuration in which one reference point P is assumed (see FIG. 12A), or a plurality of reference points P (two reference points $P_1$ and $P_2$ are shown in FIG. 12B) are assumed may be adopted. The two reference points $P_1$ and $P_2$ are disposed in a twice rotation symmetry with the center of the display panel as a point of symmetry. The value of the distance $D_0$ is not 0 in all light emitting elements. With respect to the distance $D_1$ from the reference point to the normal LN passing through the center of the light emitting part 30, a distance from the normal LN passing through a center of a certain light emitting part 30 to a closer reference point is defined as the distance $D_1$. In addition, in these cases, the light emitted from each light emitting element 10 and passing through the lens member 50 converges (condenses) on a certain region of a space outside the display device. Alternatively, the light emitted from each light emitting element 10 and passing through the lens member 50 is diverged in the space outside the display device.

Except for the above points, the configuration and structure of the display device of the second embodiment can be the same as the configuration and structure of the display device described in the first embodiment, and thus detailed description thereof will be omitted.

Third Embodiment

Figure 13:
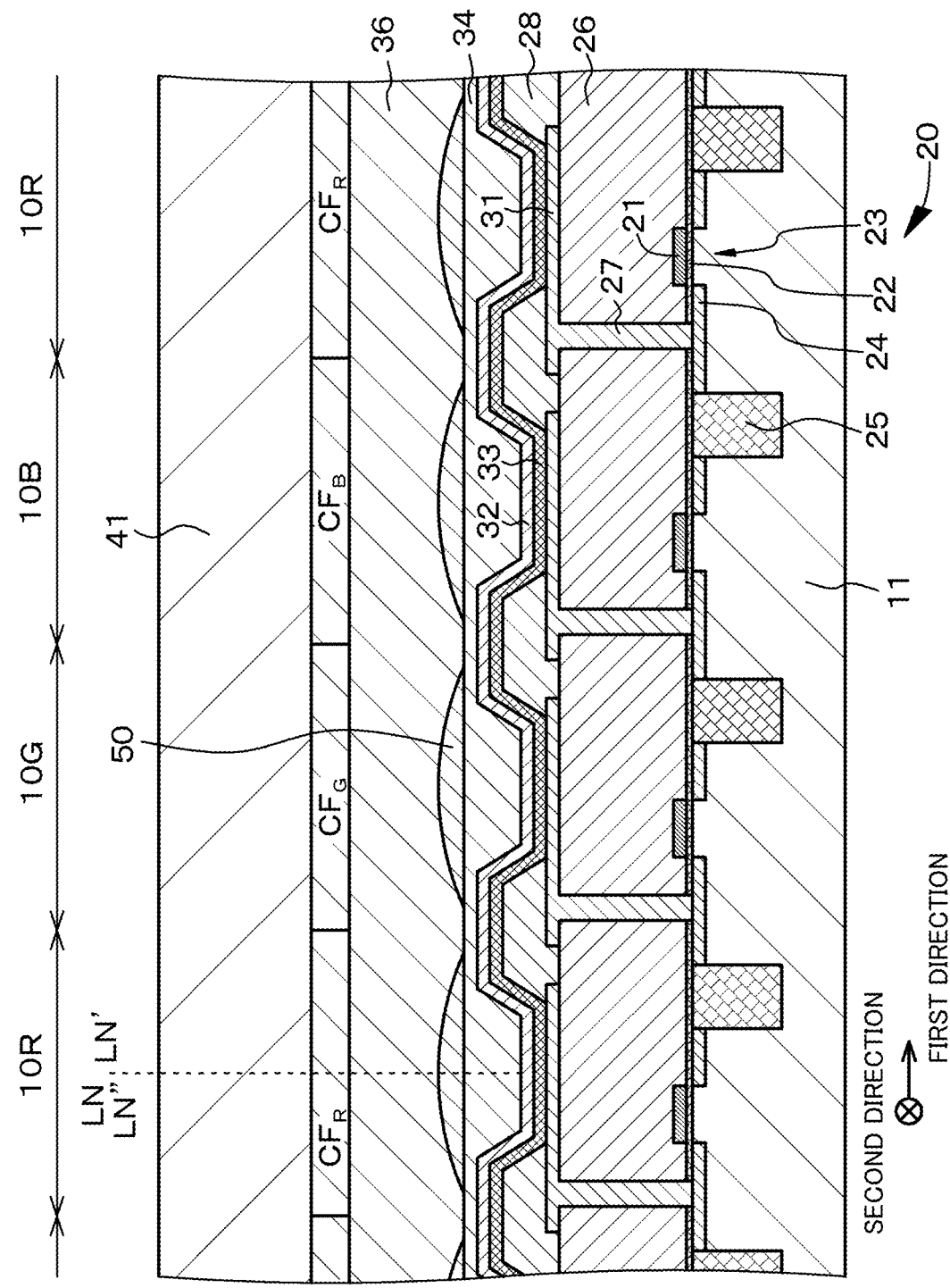
FIG. 13 is a schematic partial cross-sectional view of light emitting elements constituting (and located within a reference point of) a display device of a third embodiment.
Figure 14:
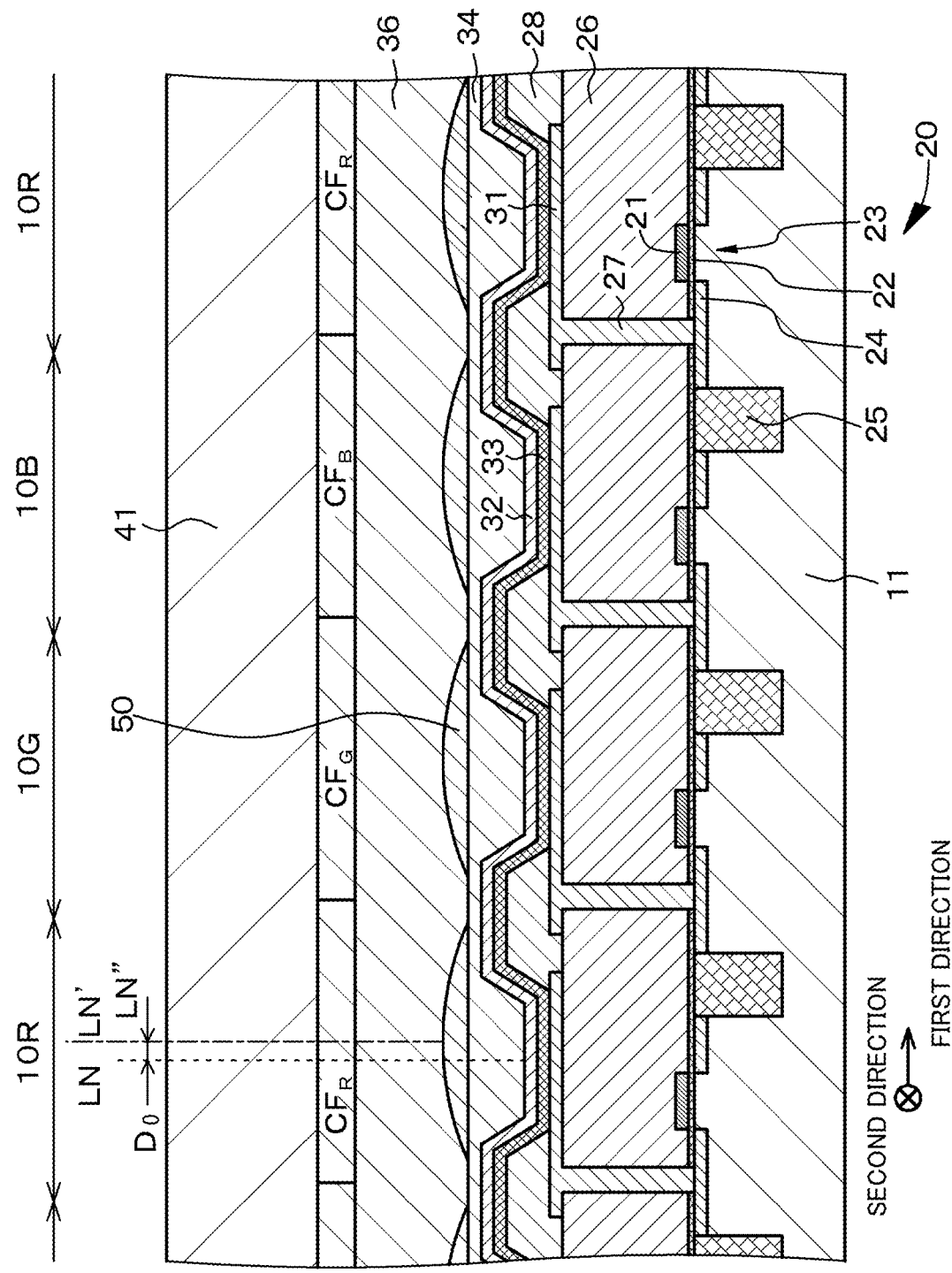
FIG. 14 is a schematic partial cross-sectional view of light emitting elements constituting (and located away from the reference point of) the display device of the third embodiment.

A third embodiment is a modification of the first embodiment and the second embodiment. In the display devices of the first embodiment and the second embodiment, the color filter layer is provided on the light incident side of the lens member 50. On the other hand, in the third embodiment, the color filter layers $CF_R$, $CF_G$, and $CF_B$ are provided on the light emitting side of the lens member 50. Specifically, as shown in FIG. 13 that shows a schematic partial cross-sectional view of light emitting elements constituting (and located within the reference point of) a display device of the third embodiment and FIG. 14 that shows a schematic partial cross-sectional view of light emitting elements (located away from the reference point), the protective layer 34 made of an acrylic resin is formed on the second electrode 32. In addition, the lens member (on-chip micro lens) 50 made of a well-known material is provided on the top surface or above the protective layer 34 (specifically, on the protective layer 34). Further, the color filter layer CF ($CF_R$, $CF_G$, and $CF_B$) is provided on the surface of the second substrate 41 facing the first substrate 11. In addition, the color filter layer CF, the lens member 50, and the protective layer 34 are bonded to each other by the sealing resin layer 36 made of an acrylic adhesive. Also, the flattening layer may be provided on the lens member 50, and the color filter layer CF and the flattening layer may be bonded to each other by the sealing resin layer 36 made of an acrylic adhesive. In the light emitting element in which the value of the distance $D_0$ is not 0, the normal LN" passing through each center of the color filter layers $CF_R$, $CF_G$, and $CF_B$ and the normal LN' passing through the center of the lens member 50 coincides with each other (that is, $D_0 = d_0 > 0$). Further, the orthographic projection image of the lens member 50 coincides with each orthographic projection image of the color filter layers $CF_R$, $CF_G$, and $CF_B$. Alternatively, it is included in the orthographic projection image of the color filter layers $CF_R$, $CF_G$, and $CF_B$ (see FIGS. 13 and 14).

Except for the above points, the configuration and structure of the display device of the third embodiment can be the same as the configuration and structure of the display device described in the first or second embodiment, and thus detailed description thereof will be omitted.

Fourth Embodiment

Figure 15:
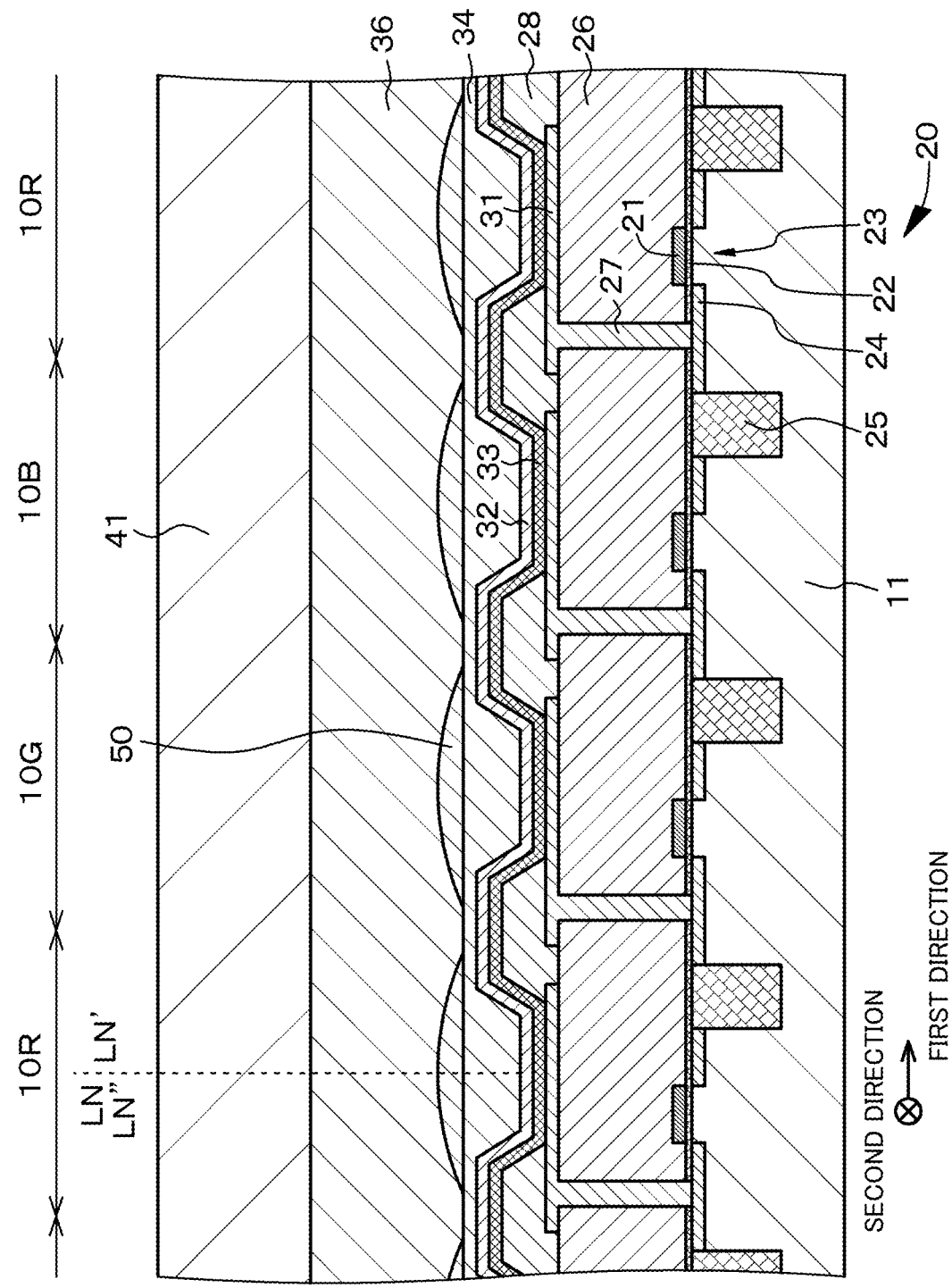
FIG. 15 is a schematic partial cross-sectional view of light emitting elements constituting (and located within a reference point of) a display device of a fourth embodiment.
Figure 16:
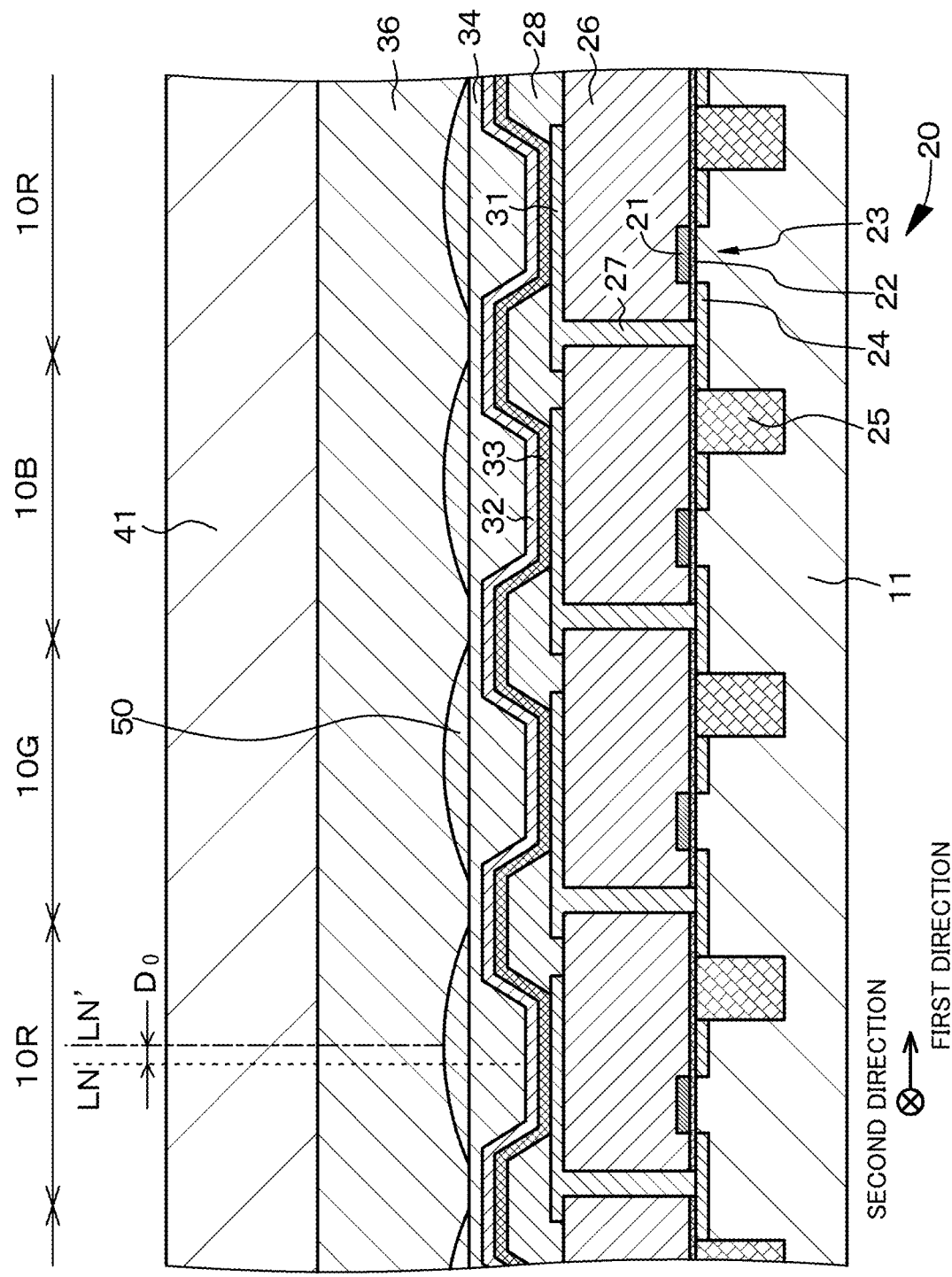
FIG. 16 is a schematic partial cross-sectional view of light emitting elements constituting (and located away from the reference point of) the display device of the fourth embodiment.

A fourth embodiment is also a modification of the first embodiment and the second embodiment. As shown in FIG. 15 that shows a schematic partial cross-sectional view of light emitting elements constituting (and located within the reference point of) a display device of the fourth embodiment, and FIG. 16 that shows a schematic partial cross-sectional view of light emitting elements (located away from the reference point), the color filter layers $CF_R$, $CF_G$, and $CF_B$ are omitted in the fourth embodiment. That is, the lens member 50 is provided on the top surface or above the protective layer 34 (specifically, on the protective layer 34), and the lens member 50, the protective layer 34, and the second substrate 41 are bonded to each other by the sealing resin layer 36 made of an acrylic adhesive. The flattening layer may be provided on the lens member 50, and the second substrate 41 and the flattening layer may be bonded to each other by the sealing resin layer 36 made of an acrylic adhesive. The light emitting element is configured of the red light emitting element 10R in which the organic layer emits red light, the green light emitting element 10G in which the organic layer emits green light, and the blue light emitting element 10B in which the organic layer emits blue light, and by combining these three types of light emitting elements (sub-pixels), one pixel is formed. In this case, the color filter layer may be provided to improve color purity.

Except for the above points, the configuration and structure of the display device of the fourth embodiment can be the same as the configuration and structure of the display device described in the first or second embodiment, and thus detailed description thereof will be omitted.

Fifth Embodiment

Figure 25:
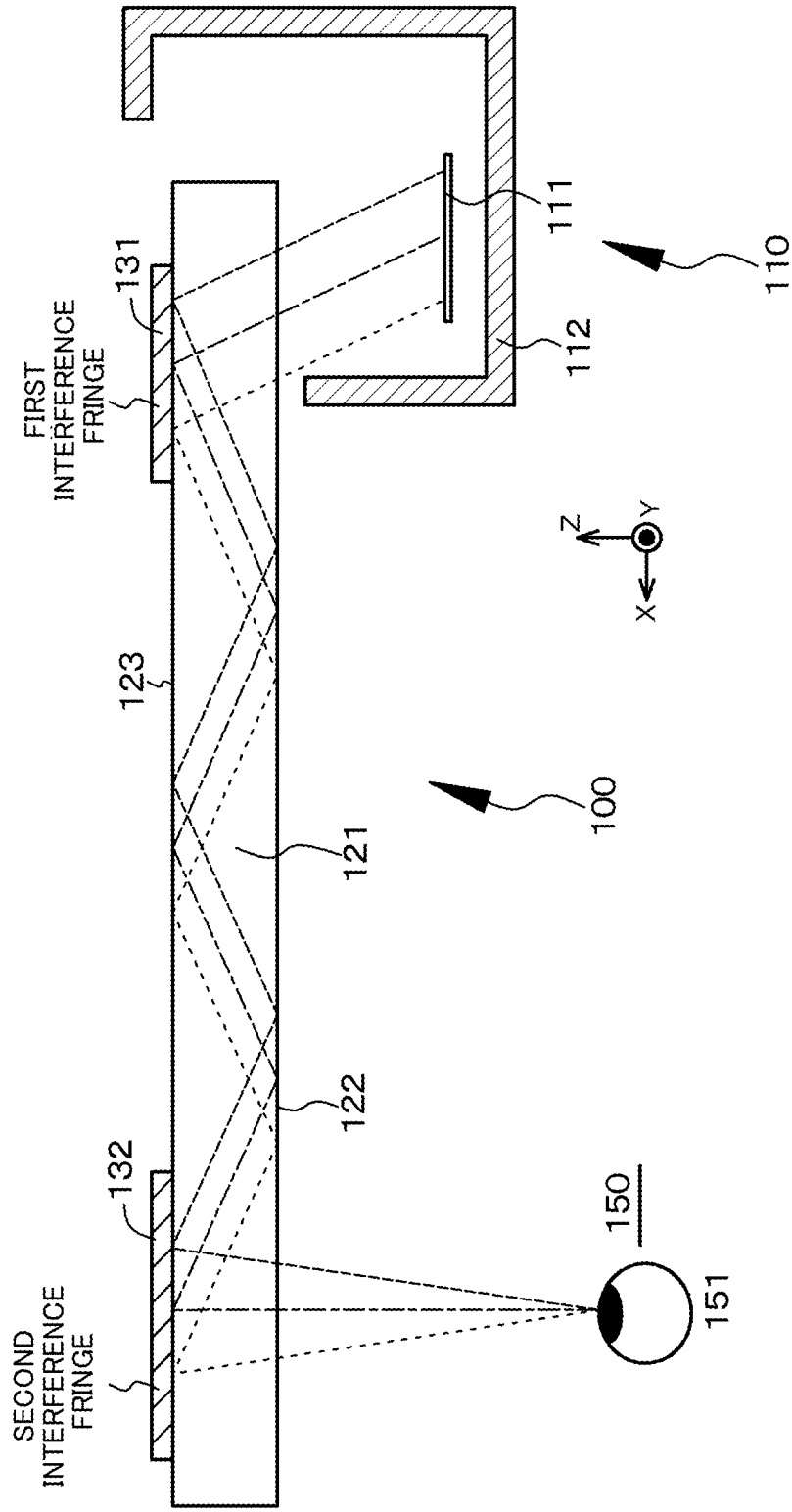
FIG. 25 is a conceptual diagram of an image display device constituting a head-mounted display of a fifth embodiment.
Figure 26:
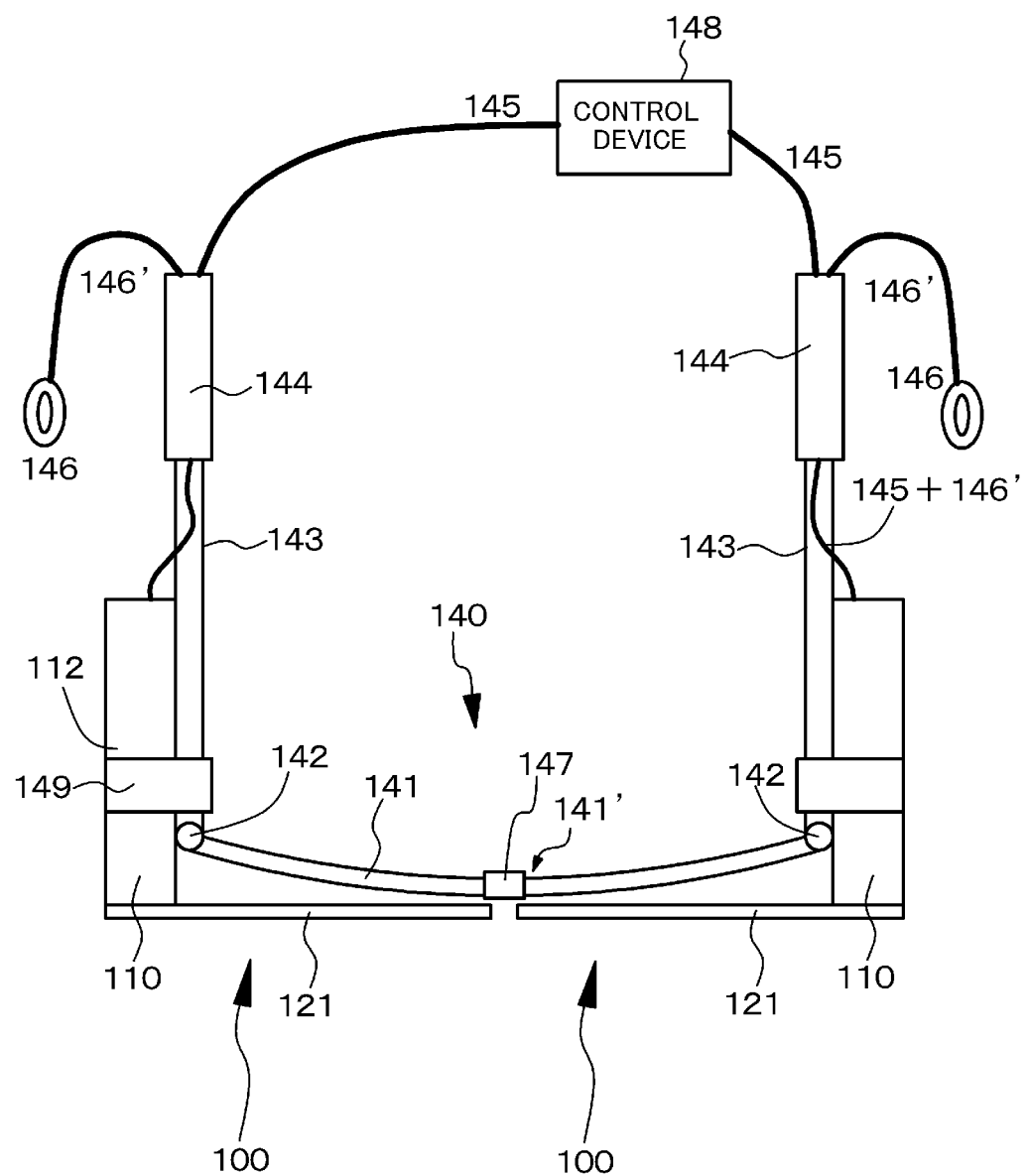
FIG. 26 is a schematic diagram of the head-mounted display of the fifth embodiment viewed from above.
Figure 27:
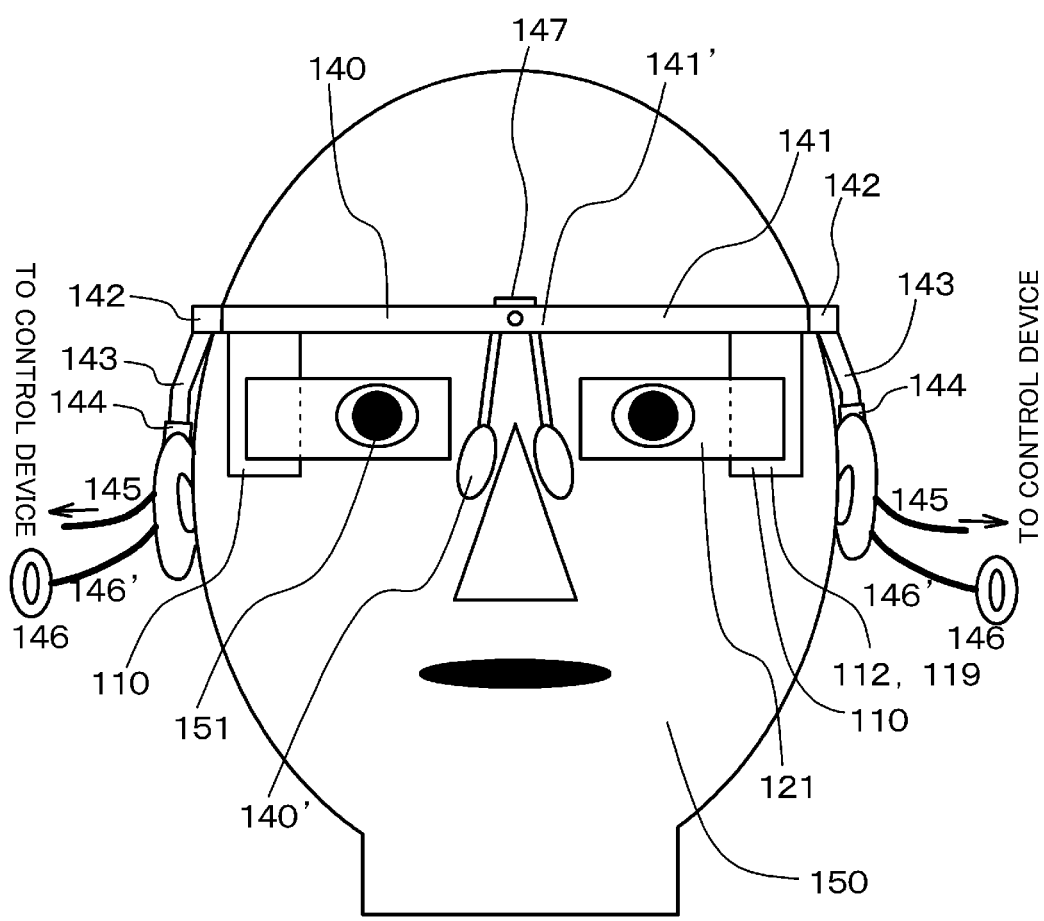
FIG. 27 is a schematic diagram of the head-mounted display of the fifth embodiment viewed from the front.

In a fifth embodiment, the display devices described in the first embodiment to the fourth embodiment are applied to a head-mounted display (HMD). FIG. 25 shows a conceptual diagram of an image display device constituting the head-mounted display of the fifth embodiment, FIG. 26 shows a schematic diagram of the head-mounted display of the fifth embodiment as viewed from above, FIG. 27 shows a schematic diagram when viewed from the front, FIG. 28A shows a schematic diagram when viewed from a lateral side. Further, FIG. 28B shows a schematic enlarged cross-sectional view showing a part of a reflective volume hologram diffraction grating in the display device of the fifth embodiment.

The image display device 100 of the fifth embodiment includes an image forming device 110 configured of a display device 111 described in the first embodiment to fourth embodiment,
  a light guide plate 121,
  a first deflection means 131 attached to the light guide plate 121, and
  a second deflection means 132 attached to the light guide plate 121. In addition, light from the image forming device 110 is deflected (or reflected) by the first deflection means 131 to propagate through an inside of the light guide plate 121 due to total reflection, and is deflected by the second deflection means 132 to be emitted toward a pupil 151 of an observer 150.

A system configured of the light guide plate 121 and the second deflection means 132 is a semi-transmission type (see-through type).

The head-mounted display of the fifth embodiment includes:
  (A) a frame 140 (for example, a spectacle-shaped frame 140) mounted on a head part of the observer 150; and
  (B) the image display device 100 attached to the frame 140. Also, the head-mounted display of the fifth embodiment is specifically a binocular type provided with two image display devices, but may be a single-eye type provided with one. The image display device

100 may be fixedly attached to the frame 140, or may be detachably attached to the frame 140. The head-mounted display is, for example, a direct-rendering type head-mounted display that renders an image directly on the pupil 151 of the observer 150.

The light guide plate 121 has a first surface 122 on which the light from the image forming device 110 is incident, and a second surface 123 facing the first surface 122. That is, the light guide plate 121 made of optical glass or a plastic material has two parallel surfaces (the first surface 122 and the second surface 123) extending parallel to a light propagation direction (a X direction) due to total internal reflection of the light guide plate 121. The first surface 122 and the second surface 123 face each other. In addition, the first deflection means 131 is disposed (specifically, bonded) on the second surface 123 of the light guide plate 121, and the second deflection means 132 is disposed (specifically, bonded) on the second surface 123 of the light guide plate 121.

The first deflection means (a first diffraction grating member) 131 includes a hologram diffraction grating, specifically, a reflective volume hologram diffraction grating, and the second deflection means (a second diffraction grating member) 132 also includes a hologram diffraction grating, specifically, a reflective volume hologram diffraction grating. A first interference fringe is formed inside the hologram diffraction grating that constitutes the first deflection means 131, and a second interference fringe is formed inside the hologram diffraction grating that constitutes the second deflection means 132.

The first deflection means 131 is diffracted and reflected such that the parallel light incident on the light guide plate 121 from the second surface 123 is totally reflected inside the light guide plate 121. The second deflection means 132 diffracts and reflects the light propagating inside the light guide plate 121 due to total reflection, and guides the light to the pupil 151 of the observer 150. The second deflection means 132 constitutes a virtual image forming region in the light guide plate 121. Axes of the first deflection means 131 and the second deflection means 132 are parallel to the X direction, and normals thereof are parallel to a Z direction. An interference fringe corresponding to one type of wavelength band (or a wavelength) is formed on each reflective volume hologram diffraction grating made of a photopolymer material, which is produced using a conventional method. A pitch of the interference fringes formed on the reflective volume hologram diffraction grating is constant, and the interference fringes are linear and parallel to a Y direction.

FIG. 28B shows an enlarged schematic partial cross-sectional view of the reflective volume hologram diffraction grating. The interference fringes having an inclination angle (a slant angle) φ are formed on the reflective volume hologram diffraction grating. Here, the inclination angle φ indicates an angle formed by the interference fringe and a surface of the reflective volume hologram diffraction grating. The interference fringes are formed from the inside of the reflective volume hologram diffraction grating to the surface. The interference fringes satisfy the Bragg condition. Here, the Bragg condition indicates a condition that satisfies the following equation (A). In the equation (A), m is a positive integer, λ is a wavelength, d is a pitch of a lattice plane (an interval between virtual planes including the interference fringes in a normal direction thereof), and θ is a complementary angle of an angle incident on the interference fringe. Further, a relationship between θ, the inclination angle φ, and an incident angle Ψ in a case in which light enters the diffraction grating member at the incident angle Ψ is as shown in the equation (B).

$$m \cdot \lambda = 2 \cdot d \sin(\theta) \quad (A)$$

$$\theta = 90° - (\varphi + \Psi) \quad (B)$$

The entire image forming device 110 is accommodated in a housing 112. Also, an optical system through which the image emitted from the display device 111 passes may be disposed in order to control a display dimension, a display position, and the like of the image emitted from the display device 111. What kind of optical system is disposed depends on specifications required for the head-mounted display and the image forming device 110.

The frame 140 is configured of a front part 141 disposed in front of the observer 150 and two temple parts 143 rotatably attached to both ends of the front part 141 via hinges 142, and modern parts (also called tip cells, earmuffs, or earpads) 144 attached to a tip part of each temple part 143. In addition, a nose pad 140' is attached thereto. That is, an assembly of the frame 140 and the nose pad 140' has basically substantially the same structure as ordinary eyeglasses. Further, each housing 112 is attached to the temple parts 143 by attachment members 149. The frame 140 is made of a metal or a plastic. Also, each housing 112 may be detachably attached to the temple parts 143 by the attachment members 149. In addition, for the observer who owns and wears spectacles, each housing 112 may be detachably attached to the temple parts 143 of the frame 140 of the spectacles owned by the observer by the attachment members 149. Each housing 112 may be attached to outer sides of the temple parts 143 or may be attached to inner sides of the temple parts 143. Alternatively, the light guide plate 121 may be fitted into a rim provided on the front part 141.

Further, wiring (a signal line, a power supply line, etc.) 145 extending from one image forming device 110 extends from a tip part of the modern part 144 to the outside via the temple part 143 and the inside of the modern part 144 and is connected to a control device (a control circuit or a control means) 148. Further, each image forming device 110 includes a headphone part 146. Wiring 146' for the headphone part extending from each image forming device 110 extends from the tip part of the modern part 144 to the headphone part 146 via the temple part 143 and the inside of the modern part 144. More specifically, the wiring 146' for the headphone part extends from the tip part of the modern part 144 to the headphone part 146 to wrap around a back side of a pinna (auricle). With such a configuration, a neat head-mounted display can be obtained without giving the impression that the headphone part 146 and the wiring 146' for the headphone part are disposed randomly.

As described above, the wiring (signal line, power line, etc.) 145 is connected to the control device (control circuit) 148, and the control device 148 performs processing for displaying an image. The control device 148 can be configured of a well-known circuit.

A solid-state image sensor configured of a CCD or CMOS sensor and a camera 147 configured of lenses (these are not shown) are attached to a central part 141' of the front part 141, if necessary, by an appropriate attachment member (not shown). Signals from the camera 147 are transmitted to the control device (control circuit) 148 via a wiring (not shown) extending from the camera 147.

In the image display device of the fifth embodiment, the light emitted from the display device 111 at a certain moment (for example, corresponding to a size of one pixel or one sub-pixel) is regarded as parallel light. In addition, this light reaches the pupil 151 (specifically, a crystalline lens) of the observer 150, and the light that has passed through the crystalline lens is finally imaged in a retina of the pupil 151 of the observer 150.

Although the present disclosure has been described above on the basis of the preferred embodiments, the present disclosure is not limited to these embodiments. The configurations of the display device (organic EL display device), the light emitting element (organic EL element), and the configurations of the structures described in the embodiments are examples and can be appropriately changed, and the method for manufacturing the display device is also an example and can be appropriately changed. The flattening layer may have a form having a function as a color filter layer. That is, the flattening layer having such a function may be made of a well-known color resist material. By making the flattening layer also function as a color filter layer in this way, it becomes possible to dispose the organic layer and the flattening layer in close proximity to each other, and the color mixing can be effectively prevented even when the angle of the light emitted from the light emitting element is widened, thereby improving viewing angle characteristics.

Figure 17:
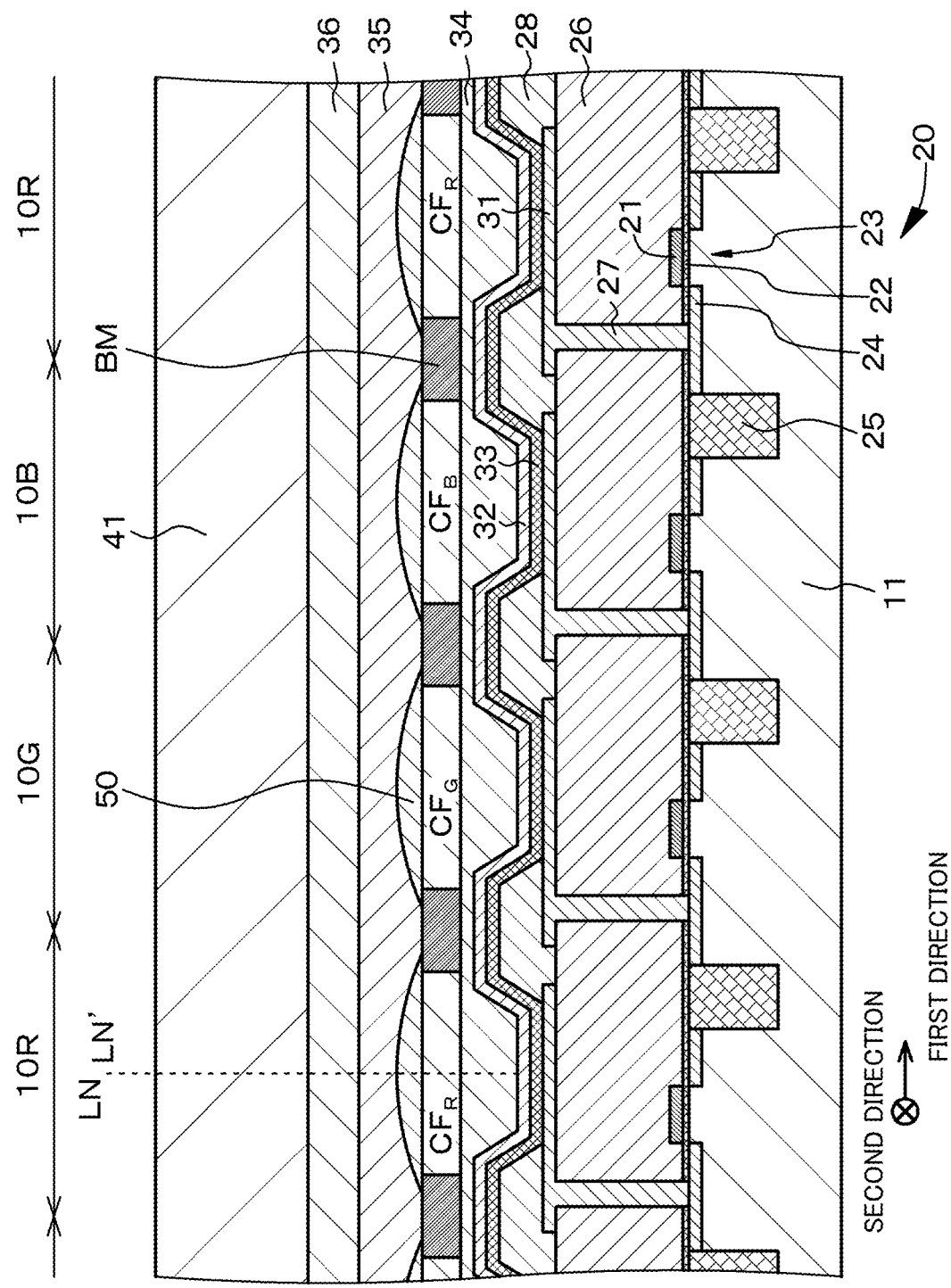
FIG. 17 is a schematic partial cross-sectional view of light emitting elements constituting (and located within a reference point of) a third modified example of the display device of the first embodiment.
Figure 18:
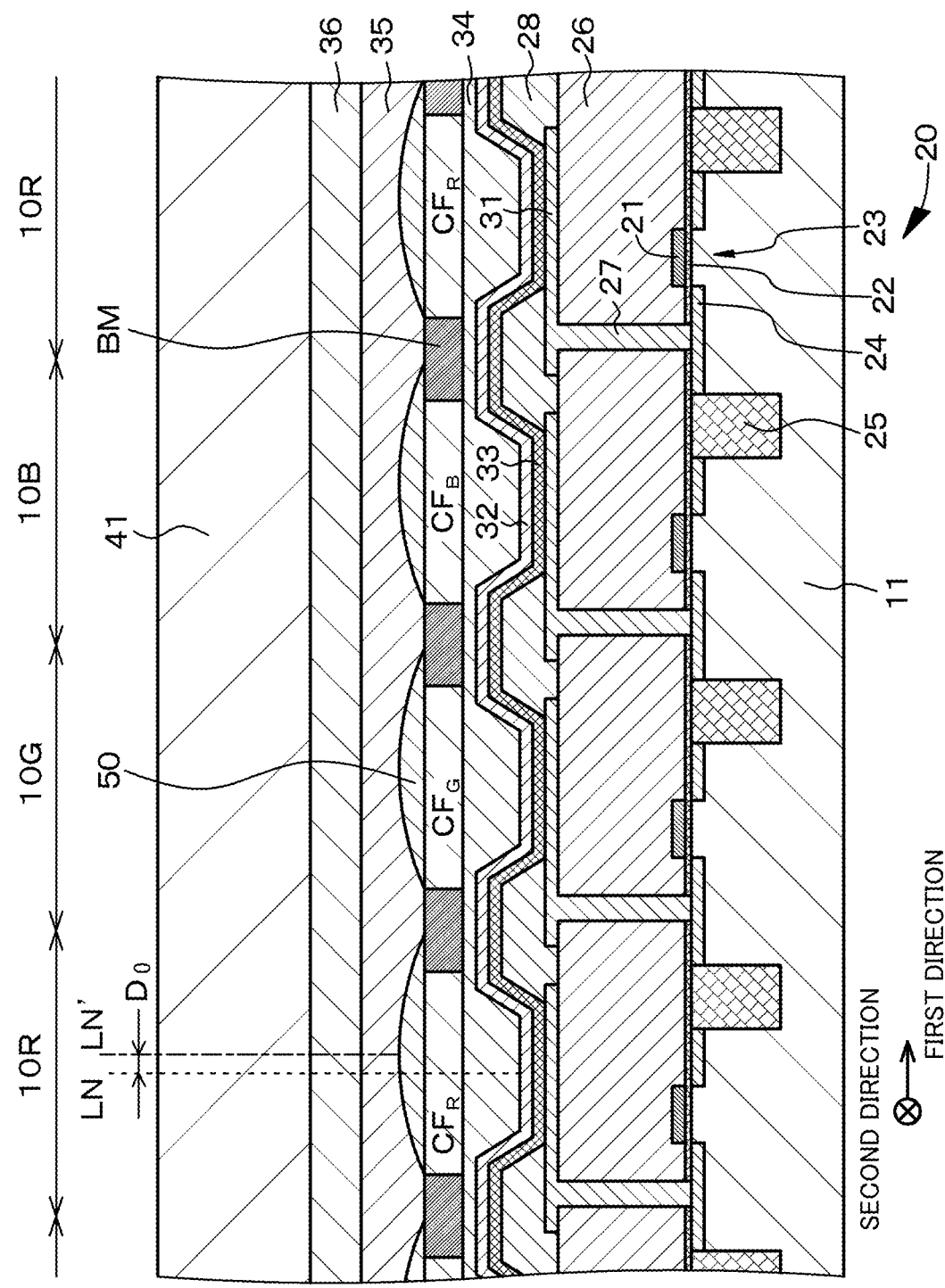
FIG. 18 is a schematic partial cross-sectional view of light emitting elements constituting (and located away from the reference point of) the third modified example of the display device of the first embodiment.
Figure 19:
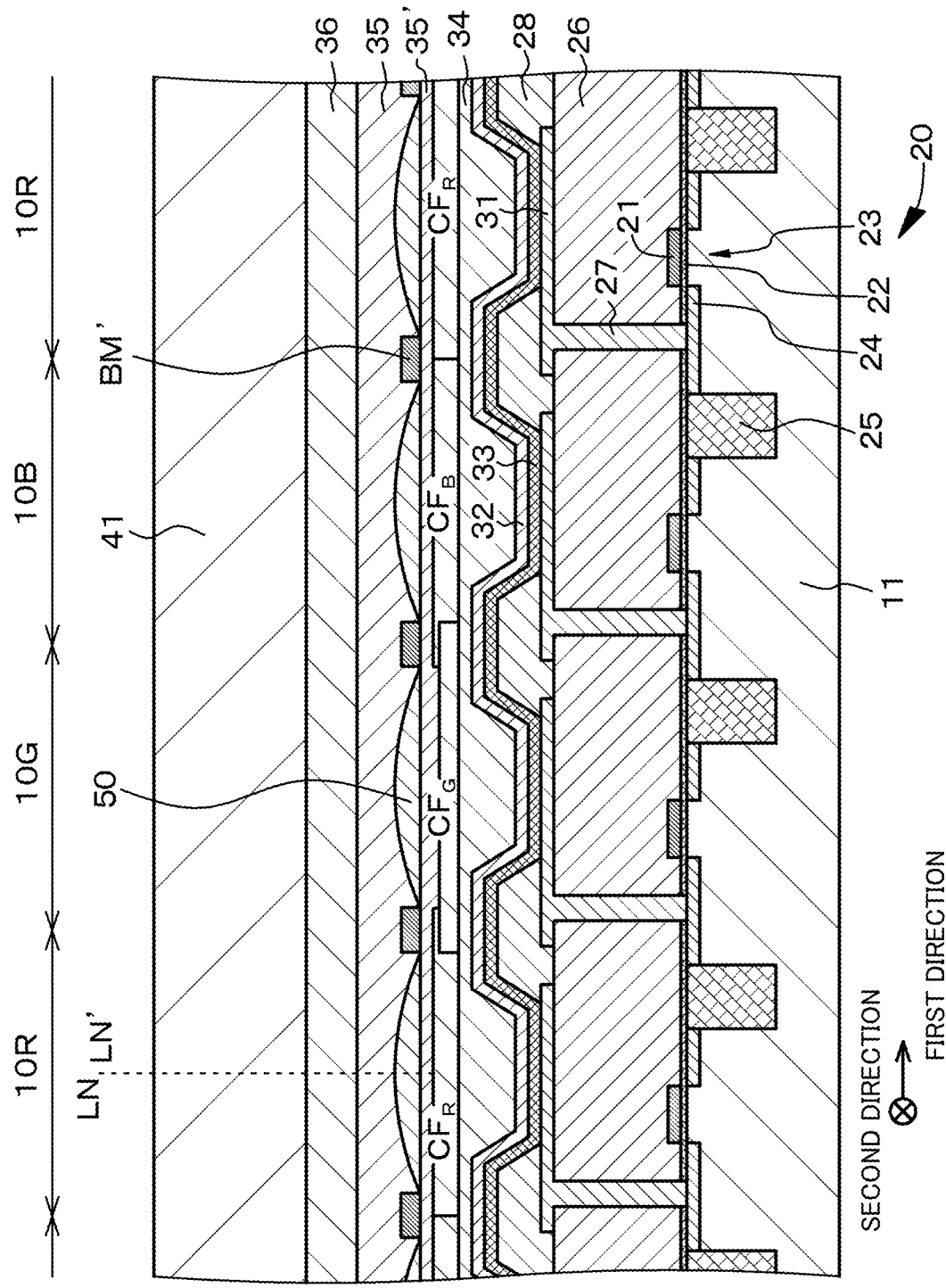
FIG. 19 is a schematic partial cross-sectional view of light emitting elements constituting (and located within a reference point of) a fourth modified example of the display device of the first embodiment.
Figure 20:
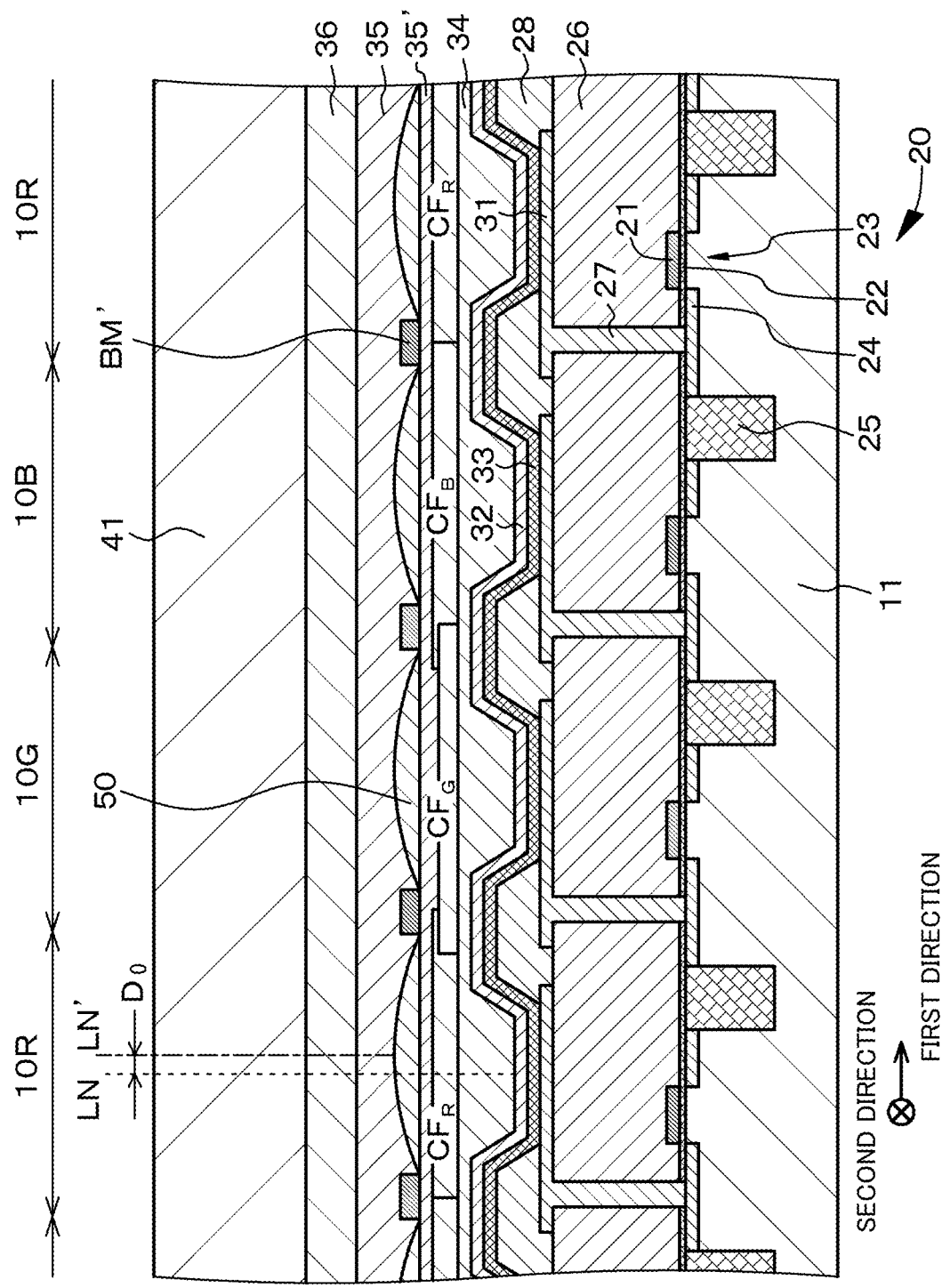
FIG. 20 is a schematic partial cross-sectional view of light emitting elements constituting (and located away from the reference point of) the fourth modified example of the display device of the first embodiment.

As shown in FIG. 17 that shows a schematic partial cross-sectional view of light emitting elements constituting (and located within the reference point of) a third modified example of the display device of the first embodiment, and FIG. 18 that shows a schematic partial cross-sectional view of light emitting elements (located away from the reference point), it may have a form in which a light absorption layer (a black matrix layer) BM is formed between the color filter layers CF of the adjacent light emitting elements. The black matrix layer BM is made of, for example, a black resin film (specifically, for example, a black polyimide resin) having an optical density of at least 1 into which a black colorant is mixed. Further, as shown in FIG. 19 that shows a schematic partial cross-sectional view of light emitting element constituting (and located within the reference point) of a fourth modified example of the display device of the first embodiment, and FIG. 20 that shows a schematic partial cross-sectional view of light emitting elements (located away from the reference point), it may have a form in which a light absorption layer (a black matrix layer) BM' is formed between the lens members 50 of the adjacent light emitting elements. Further, these modified examples 3 and 4 can be combined, and various modified examples can be applied to other embodiments.

Figure 21:
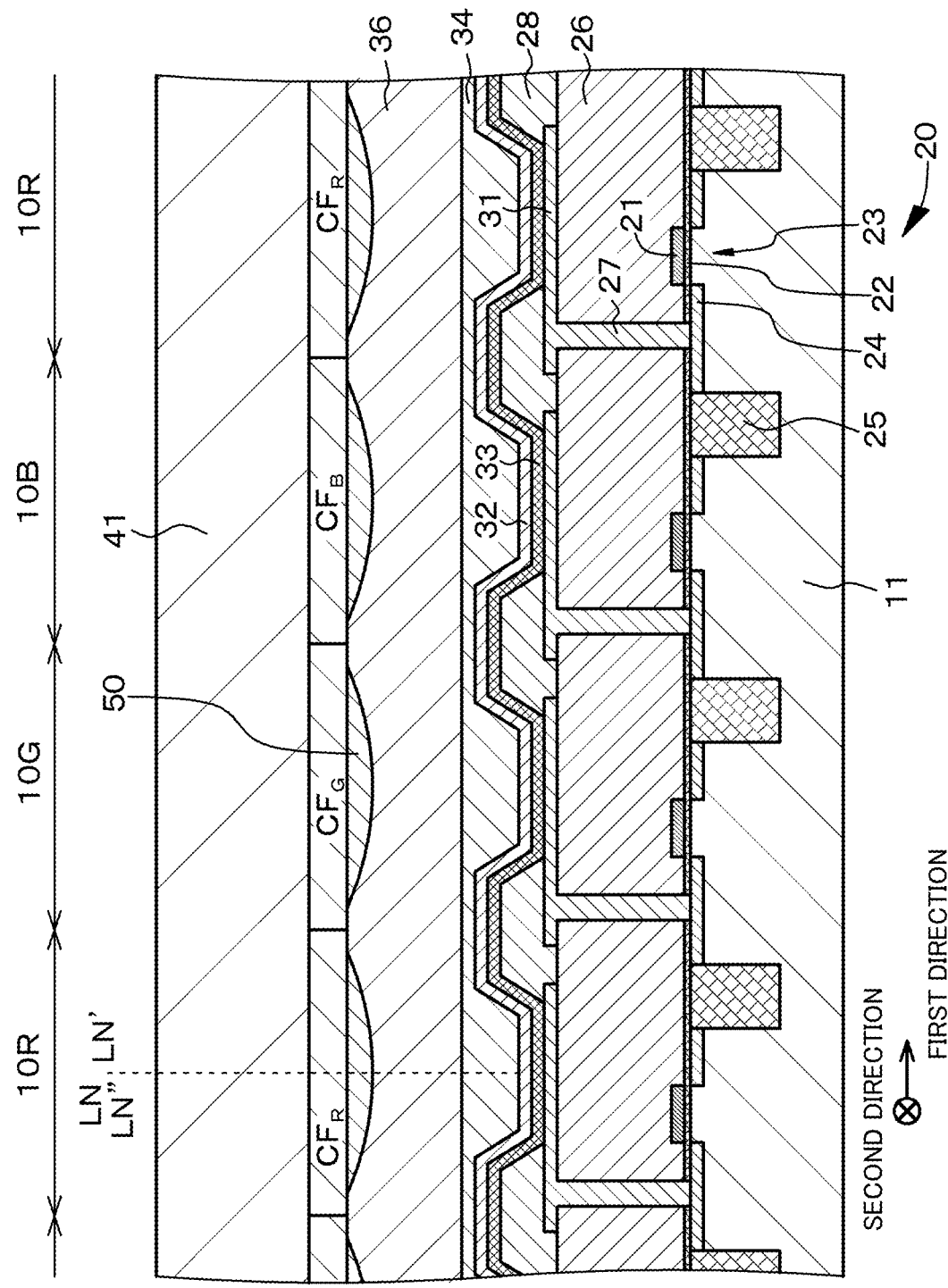
FIG. 21 is a schematic partial cross-sectional view of light emitting elements constituting (and located away from a reference point of) a first modified example of the display device of the third embodiment.

Although FIG. 21 shows a schematic partial cross-sectional view of light emitting elements constituting (and located away from the reference point of) a first modified example of the display device of the third embodiment, it may have a form in which the color filter layer CF ($CF_R$, $CF_G$, and $CF_B$) is provided on the surface of the second substrate 41 facing the first substrate 11, and the lens member (on-chip micro lens) 50 is provided on the surface of the color filter layer CF facing the first substrate 11. The color filter layer CF, the lens member 50, and the protective layer 34 are bonded to each other by the sealing resin layer 36 made of an acrylic adhesive. The flattening film may be formed between the color filter layer CF and the lens member 50 with the same material as the lens member 50.

Although one pixel is configured of three sub-pixels exclusively from the combination of the white light emitting element and the color filter layer in the embodiment, for example, one pixel may be configured of four sub-pixels including the light emitting element that emits white light. In this case, a transparent filter may be provided for the light emitting element that emits white light. In the embodiment, the light emitting element driving part is configured of MOSFET, but it can also be configured of TFT. The first electrode and the second electrode may have a single-layer structure or a multi-layer structure.

The light shielding part may be provided between the light emitting elements in order to prevent light emitted from a certain light emitting element from entering into a light emitting element adjacent to the certain light emitting element and causing optical crosstalk. That is, a groove part may be formed between the light emitting elements, and the groove part may be embedded with a light shielding material to form the light shielding part. When the light shielding part is provided in this way, it is possible to reduce a proportion at which the light emitted from the certain light emitting element penetrates into the adjacent light emitting element, thus it is possible to inhibit occurrence of a phenomenon in which the color mixing occurs and the chromaticity of the entire pixel deviates from a desired chromaticity. In addition, since the color mixing can be prevented, the color purity when the pixels are made to emit a single color is increased, and the chromaticity point is deepened. Therefore, the color gamut is widened, and a range of color expression of the display device is widened. In addition, the color filter layer is disposed for each pixel in order to improve the color purity, but depending on the configuration of the light emitting element, the color filter layer can be thinned or the color filter layer can be omitted and the light absorbed by the color filter layer can be taken out, and as a result, luminous efficiency is improved. Alternatively, the light absorption layer (black matrix layer) may be provided with a light shielding property.

The display device of the present disclosure can be applied to a mirrorless type digital still camera with interchangeable lenses. FIG. 29A shows a front view of the digital still camera, and FIG. 29B shows a rear view thereof. This mirrorless type digital still camera with interchangeable lenses has, for example, an interchangeable imaging lens part (an interchangeable lens) 212 on a front right side of a camera body part (a camera body) 211, and a grip part 213 on a front left side thereof for a photographer to grip. In addition, a monitor 214 is provided substantially in a center of a back surface of the camera body part 211. An electronic viewfinder (an eyepiece window) 215 is provided above the monitor 214. By looking into the electronic viewfinder 215, the photographer can visually recognize a light image of a subject guided by the imaging lens part 212 and determine the composition. In the mirrorless type digital still camera with interchangeable lenses having such a configuration, the display device of the present disclosure can be used as the electronic viewfinder 215.

Hereinafter, relationships of the normal LN passing through the center of the light emitting part, the normal LN' passing through the center of the lens member, and the normal LN" passing through the center of the wavelength selection part will be described.

Also, a size of the wavelength selection part (for example, the color filter layer) may be appropriately changed in accordance with the light emitted by the light emitting element, or in a case in which the light absorption layer (black matrix layer) is provided between the wavelength selection parts (for example, the color filter layers) of the adjacent light emitting elements, a size of the light absorption layer (black matrix layer) may be appropriately changed in accordance with the light emitted by the light emitting element. Further, the size of the wavelength selection part (for example, the color filter layer) may be appropriately changed in accordance with the distance (offset amount) do between the normal passing through the center of the light emitting part and the normal passing through the center of the color filter layer CF. A planar shape of the wavelength selection part (for example, the color filter layer) may be the same as a planar shape of the lens member, may be similar, or may be different.

Figure 30:
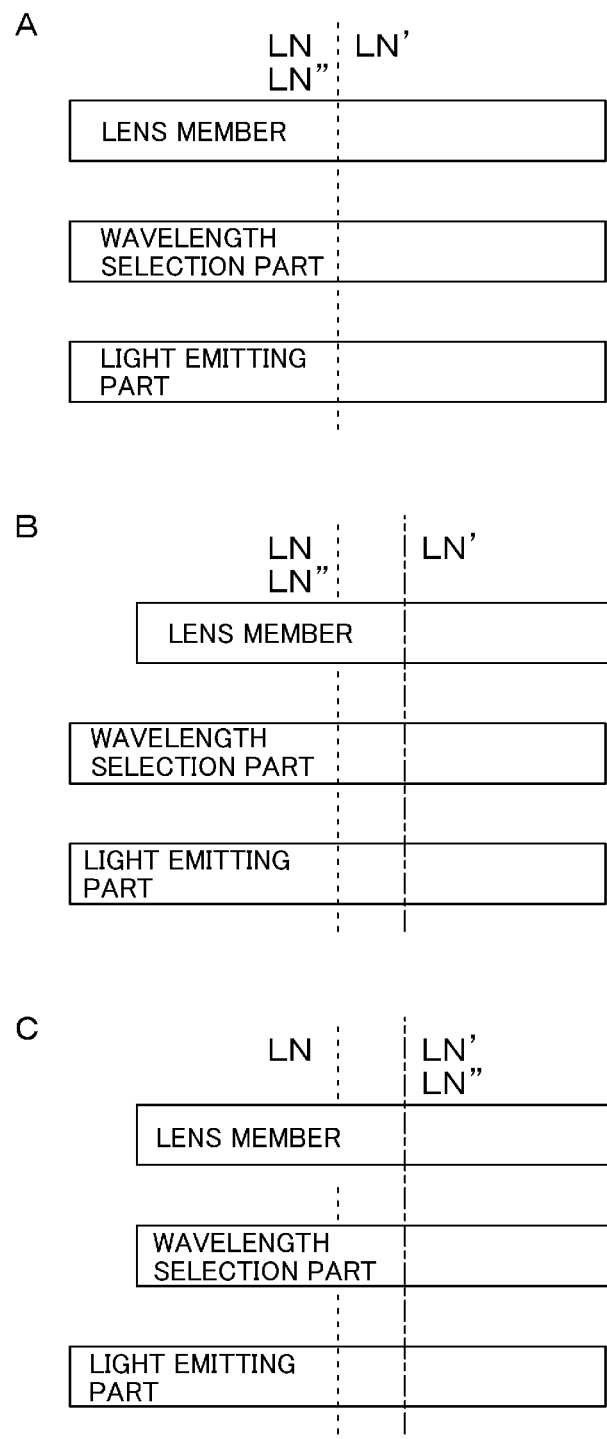
FIGS. 30A, 30B, and 30C are conceptual diagrams for explaining relationships of a normal LN passing through the center of the light emitting part, a normal LN' passing through the center of the lens member, and a normal LN" passing through a center of a wavelength selection part.

In the examples shown in FIGS. 1, 17, 19 and 21, as a conceptual diagram thereof shown in FIG. 30A, the normal LN passing through the center of the light emitting part, the normal LN" passing through the center of the wavelength selection part, and the normal LN' passing through the center of the lens member coincide with each other. That is, $D_0=d_0=0$.

Further, in the examples shown in FIGS. 2, 11, 18, and 20, as a conceptual diagram thereof shown in FIG. 30B, the normal LN passing through the center of the light emitting part and the normal LN" passing through the center of the wavelength selection part coincide with each other, but the normal LN passing through the center of the light emitting part, the normal LN" passing through the center of the wavelength selection part, and the normal LN' passing through the center of the lens member do not coincide with each other. That is, $D_0 \ne d_0=0$.

Further, in the example shown in FIG. 10, as a conceptual diagram thereof shown in FIG. 30C, the normal LN passing through the center of the light emitting part, the normal LN" passing through the center of the wavelength selection part, and the normal LN' passing through the center of the lens member do not coincide with each other, and the normal LN" passing through the center of the wavelength selection part and the normal LN' passing through the center of the lens member coincide with each other. That is, $D_0=d_0>0$.

Figure 31:
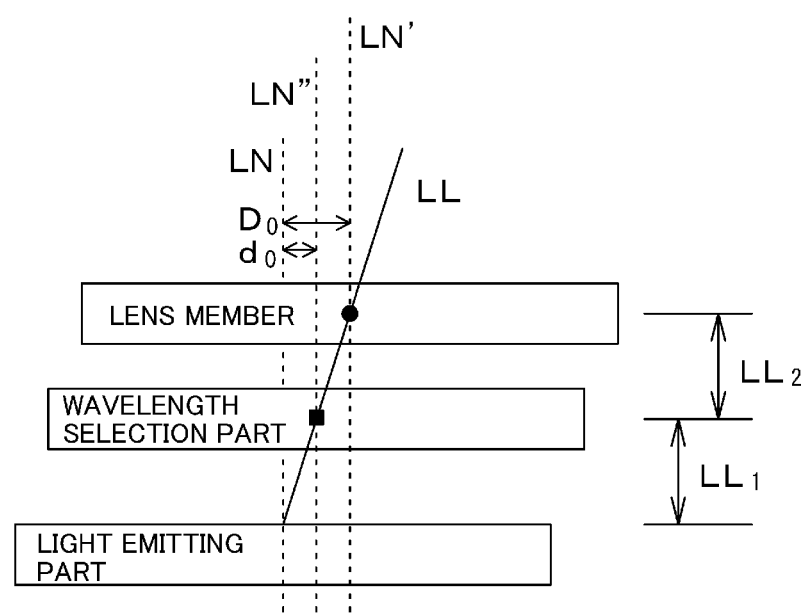
FIG. 31 is a conceptual diagram for explaining relationships of the normal LN passing through the center of the light emitting part, the normal LN' passing through the center of the lens member, and the normal LN" passing through the center of the wavelength selection part.

A form may be adopted, as a conceptual diagram thereof shown in FIG. 31, in which the normal LN passing through the center of the light emitting part, the normal LN" passing through the center of the wavelength selection part, and the normal LN' passing through the center of the lens member do not coincide with each other, and the normal LN' passing through the center of the lens member does not coincide with the normal LN passing through the center of the light emitting part and the normal LN" passing through the center of the wavelength selection part. Here, it is preferable that the center of the wavelength selection part (indicated by a black square in FIG. 31) be located on a straight line LL connecting the center of the light emitting part and the center of the lens member (indicated by a black circle in FIG. 31). Specifically, when a distance from the center of the light emitting part to the center of the wavelength selection part in a thickness direction thereof is defined as $LL_1$, and a distance from the center of the wavelength selection part to the center of the lens member in the thickness direction is defined as $LL_2$, $D_0 > d_0 > 0$, and in consideration of manufacturing variations, it is preferable to satisfy $d_0 : D_0 = LL_1 : (LL_1 + LL_2)$.

Figure 32:
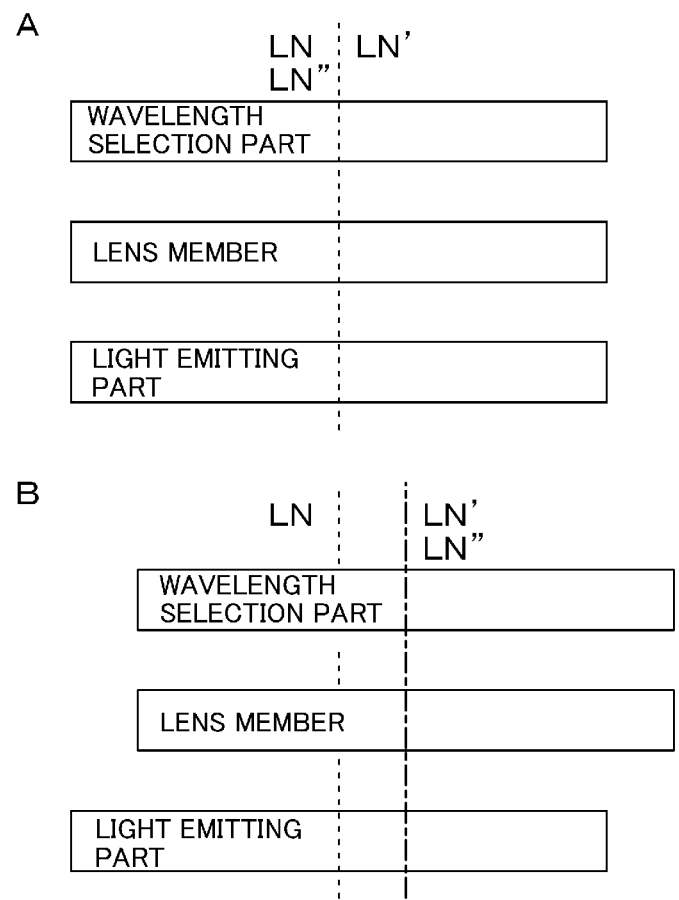
FIGS. 32A and 32B are conceptual diagrams for explaining relationships of the normal LN passing through the center of the light emitting part, the normal LN' passing through the center of the lens member, and the normal LN" passing through the center of the wavelength selection part.

In the example shown in FIG. 13, as a conceptual diagram thereof shown in FIG. 32A, the normal LN passing through the center of the light emitting part, the normal LN" passing through the center of the wavelength selection part, and the normal LN' passing through the center of the lens member coincide with each other. That is, D0=d0=0. In the example shown in FIG. 14, as a conceptual diagram thereof shown in FIG. 32B, the normal LN passing through the center of the light emitting part, the normal LN" passing through the center of the wavelength selection part, and the normal LN' passing through the center of the lens member do not coincide with each other, and the normal LN" passing through the center of the wavelength selection part and the normal LN' passing through the center of the lens member coincide with each other. That is, $D_0=d_0>0$.

Figure 33:
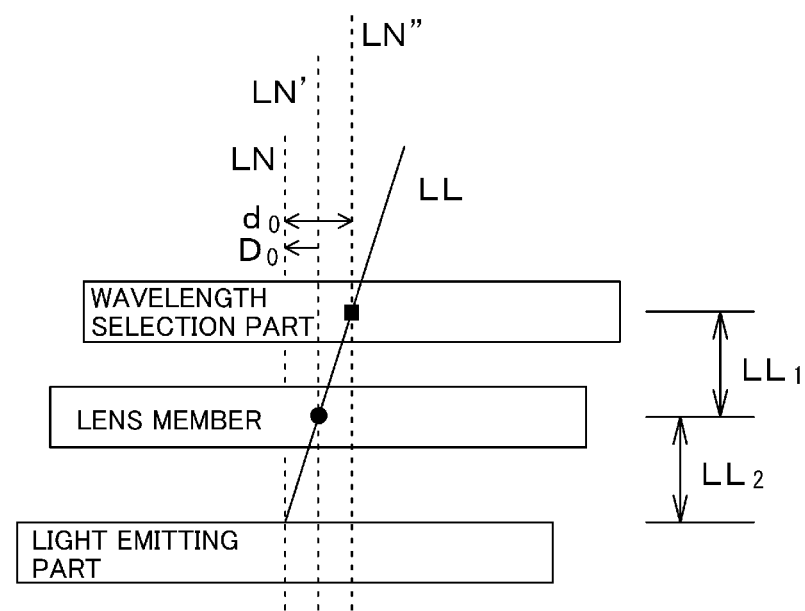
FIG. 33 is a conceptual diagram for explaining relationships of the normal LN passing through the center of the light emitting part, the normal LN' passing through the center of the lens member, and the normal LN" passing through the center of the wavelength selection part.

A form may be adopted, as a conceptual diagram thereof shown in FIG. 33, in which the normal LN passing through the center of the light emitting part, the normal LN" passing through the center of the wavelength selection part, and the normal LN' passing through the center of the lens member do not coincide with each other, and the normal LN' passing through the center of the lens member does not coincide with the normal LN passing through the center of the light emitting part and the normal LN" passing through the center of the wavelength selection part. Here, it is preferable that the center of the wavelength selection part is located on the straight line LL connecting the center of the light emitting part and the center of the lens member. Specifically, when the distance from the center of the light emitting part to the center of the wavelength selection part in the thickness direction (indicated by a black square in FIG. 33) is defined as $LL_1$, and the distance from the center of the wavelength selection part to the center of the lens member in the thickness direction (indicated by a black circle in FIG. 33) is defined as $LL_2$, $d_0 > D_0 > 0$, and in consideration of manufacturing variations, it is preferable to satisfy $D_0 : d_0 = LL_2 : (LL_1 + LL_2)$.

In the case of providing a resonator structure, as described above, the organic layer 33 may be used as a resonance part, and the resonator structure may be sandwiched between the first electrode 31 and the second electrode 32, and a light reflecting layer 37 may be formed below the first electrode 31 (on the first substrate 41 side), the organic layer 33 may be used as a resonance part, and the resonator structure may be sandwiched between the light reflecting layer 37 and the second electrode 32. That is, in a case in which the light reflecting layer 37 is provided on the substrate 26, an interlayer insulating layer 38 is provided on the light reflecting layer 37, and the first electrode 31 is provided on the interlayer insulating layer 38, the first electrode 31, the light reflecting layer 37, and the interlayer insulating layer 38 may be made of the above-mentioned materials. The light reflecting layer 37 may or may not be connected to the contact hole (contact plug) 27.

Figure 37:
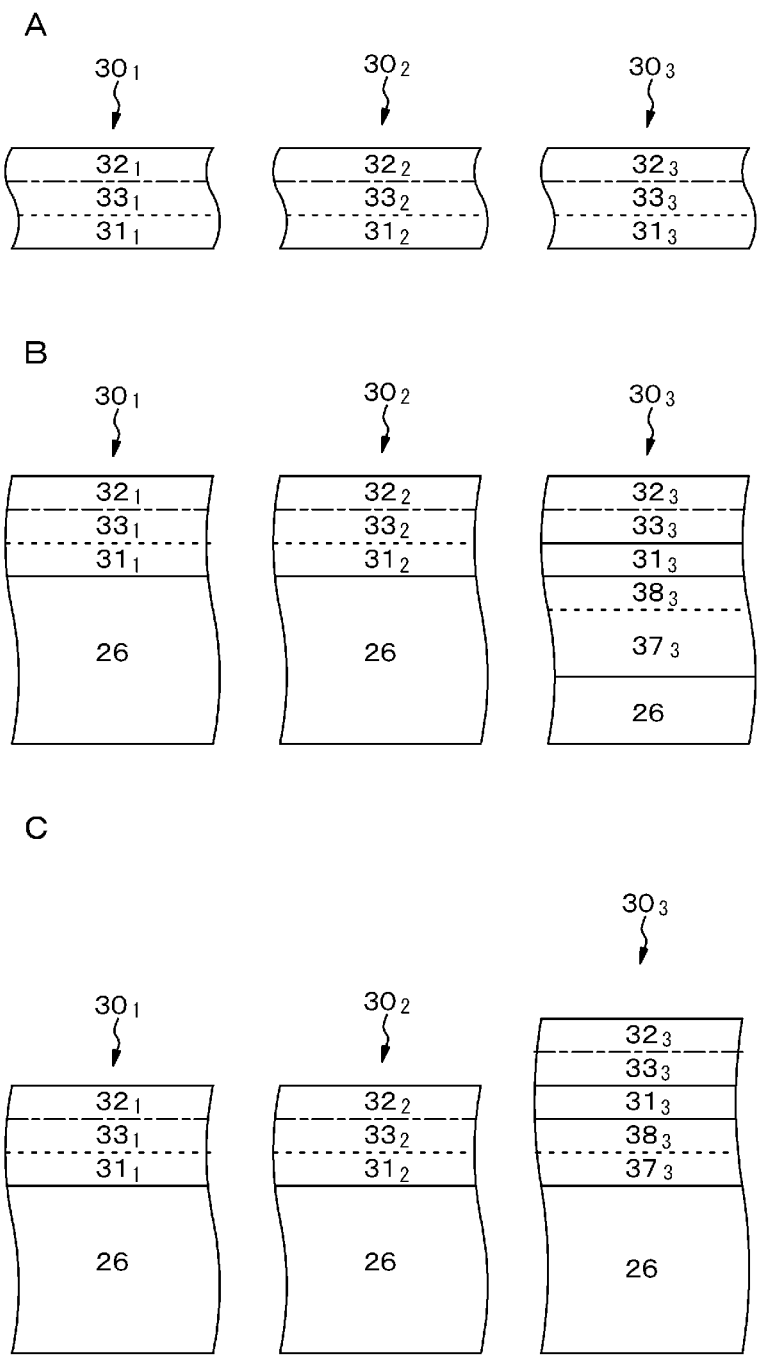
FIG. 37A is a conceptual diagram of light emitting element of a seventh example having a resonator structure.
FIGS. 37B and 37C are conceptual diagrams of light emitting elements of an eighth example having a resonator structure.

Hereinafter, with reference to FIG. 34A (a first example), FIG. 34B (a second example), FIG. 35A (a third example), FIG. 35B (a fourth example), FIG. 36A (a fifth example), FIG. 36B (a sixth example), FIG. 37A (a seventh example), and FIG. 37B and FIG. 37C (an eighth example), the resonator structure will be described on the basis of the first example to the eighth example. Here, in the first to fourth examples and the seventh example, the first electrode and the second electrode have the same thickness in each light emitting part. On the other hand, in the fifth to sixth examples, the first electrode has a different thickness in each light emitting part, and the second electrode has the same thickness in each light emitting part. Further, in the eighth example, the first electrode may have a different thickness in each light emitting part, or may have the same thickness, and the second electrode has the same thickness in each light emitting part.

Also, in the following description, the light emitting parts constituting the first light emitting element $10_1$, the second light emitting element $10_2$, and the third light emitting element $10_3$ are represented by reference numerals $30_1$, $30_2$, and $30_3$, the first electrodes are represented by reference numbers $31_1$, $31_2$, and $31_3$, the second electrodes are represented by reference numbers $32_1$, $32_2$, and $32_3$, the organic layers are represented by reference numbers $33_1$, $33_2$, and $33_3$, the light reflecting layers are represented by reference numbers $37_1$, $37_2$, and $37_3$, the interlayer insulating layers are represented by reference numerals $38_1$, $38_2$, and $38_3$, $38_{1'}$, $38_{2'}$, and $38_{3'}$. In the following description, the materials used are examples and can be appropriately changed.

In the illustrated example, resonator lengths of the first light emitting element $10_1$, the second light emitting element $10_2$, and the third light emitting element $10_3$ derived from the equations (1-1) and (1-2) are shortened from the first light emitting element $10_1$, the second light emitting element $10_2$, and the third light emitting element $10_3$ in order, that is, the value of $L_0$ was shortened from the first light emitting element $10_1$, the second light emitting element $10_2$, and the third light emitting element $10_3$ in order, but it does not be limited thereto and the optimum resonator length may be determined by appropriately setting the values of $m_1$ and $m_2$.

FIG. 34A shows a conceptual diagram of a light emitting element having the first example of the resonator structure, FIG. 34B shows a conceptual diagram of a light emitting element having the second example of the resonator structure, FIG. 35A shows a conceptual diagram of a light emitting element having the third example of the resonator structure, and FIG. 35B shows a conceptual diagram of a light emitting element having the fourth example of the resonator structure. In some of the first to sixth and eighth examples, the interlayer insulating layers 38 and 38' are formed under the first electrode 31 of the light emitting part 30, and the light reflecting layer 37 is formed under the interlayer insulating layers 38 and 38'. In the first to fourth examples, thicknesses of the interlayer insulating layers 38 and 38' are different in the light emitting parts $30_1$, $30_2$, and $30_3$. In addition, by appropriately setting the thicknesses of the interlayer insulating layers $38_1$, $38_2$, and $38_3$, $38_{1'}$, $38_{2'}$, and $38_{3'}$, it is possible to set an optical distance that causes the optimum resonance with respect to an emission wavelength of the light emitting part 30.

In the first example, first interfaces (indicated by dotted lines in the figure) are at the same level in the light emitting parts $30_1$, $30_2$, and $30_3$, while second interfaces (indicated by one dot chain lines in the figure) are at different levels in the light emitting parts $30_1$, $30_2$, and $30_3$. Further, in the second example, the first interfaces are at different levels in the light emitting parts $30_1$, $30_2$, and $30_3$, while the second interfaces are at the same level in the light emitting parts $30_1$, $30_2$, and $30_3$.

In the second example, the interlayer insulating layers $38_{1'}$, $38_{2'}$, and $38_{3'}$ are configured of an oxide film in which a surface of the light reflecting layer 37 is oxidized. The interlayer insulating layer 38' configured of an oxide film is made of, for example, aluminum oxide, tantalum oxide, titanium oxide, magnesium oxide, zirconium oxide, etc., depending on the material constituting the light reflecting layer 37. Oxidation of the surface of the light reflecting layer 37 can be performed, for example, using the following method. That is, the first substrate 41 on which the light reflecting layer 37 is formed is immersed in an electrolytic solution filled in a container. Further, a cathode is disposed to face the light reflecting layer 37. Then, the light reflecting layer 37 is anodized with the light reflecting layer 37 as an anode. A film thickness of the oxide film formed by the anodization is proportional to a difference in potential between the light reflecting layer 37, which is the anode, and the cathode. Therefore, anodizing is performed in a state in which voltages corresponding to the light emitting parts $30_1$, $30_2$, and $30_3$ are applied to the light reflecting layers $37_1$, $37_2$, and $37_3$, respectively. Thus, the interlayer insulating layers $38_{1'}$, $38_{2'}$, and $38_{3'}$ made of oxide films having different thicknesses can be collectively formed on the surface of the light reflecting layer 37. The thicknesses of the light reflecting layers $37_1$, $37_2$, and $37_3$ and the thicknesses of the interlayer insulating layers $38_{1'}$, $38_{2'}$, and $38_{3'}$ are different in the light emitting parts $30_1$, $30_2$, and $30_3$.

In the third example, a base film 39 is arranged under the light reflecting layer 37, the base film 39 has different thicknesses in the light emitting parts $30_1$, $30_2$, and $30_3$. That is, in the illustrated example, the thickness of the base film 39 is thicker from the light emitting part $30_1$, the light emitting part $30_2$, and the light emitting part $30_3$ in order.

In the fourth example, the thicknesses of the light reflecting layers $37_1$, $37_2$, and $37_3$ at the time of film formation are different from each other in the light emitting parts $30_1$, $30_2$, and $30_3$. In the third to fourth examples, the second interfaces are at the same level in the light emitting parts $30_1$, $30_2$, and $30_3$, while the first interfaces are at different levels in the light emitting parts $30_1$, $30_2$, and $30_3$.

In the fifth to sixth examples, the thicknesses of the first electrodes $31_1$, $31_2$, and $31_3$ are different from each other in the light emitting parts $30_1$, $30_2$, and $30_3$. The light reflecting layer 37 has the same thickness in each light emitting part 30.

In the fifth example, the first interfaces are at the same level in the light emitting parts $30_1$, $30_2$, and $30_3$, while the second interfaces are at different levels in the light emitting parts $30_1$, $30_2$, and $30_3$.

In the sixth example, the base film 39 is arranged under the light reflecting layer 37, and the base film 39 has different thicknesses in the light emitting parts $30_1$, $30_2$, and $30_3$. That is, in the illustrated example, the thickness of the base film 39 is thicker from the light emitting part $30_1$, the light emitting part $30_2$, and the light emitting part $30_3$ in order. In the sixth example, the second interfaces are at the same level in the light emitting parts $30_1$, $30_2$, and $30_3$, while the first interfaces are at different levels in the light emitting parts $30_1$, $30_2$, and $30_3$.

In the seventh example, the first electrodes $31_1$, $31_2$, and $31_3$ also serve as the light reflecting layer, and optical constants (specifically, an amount of phase shift) of the materials constituting the first electrodes $31_1$, $31_2$, and $31_3$ are different from each other in the light emitting parts $30_1$, $30_2$, and $30_3$. For example, the first electrode $31_1$ of the light emitting part $30_1$ may be made of copper (Cu), and the first electrode $31_2$ of the light emitting part $30_2$ and the first electrode $31_3$ of the light emitting part $30_3$ may be made of aluminum (Al).

Further, in the eighth example, the first electrodes $31_1$, $31_2$ also serve as the light reflecting layer, and the optical constants (specifically, the amount of phase shift) of the materials constituting the first electrodes $31_1$, $31_2$ are different from each other in the light emitting parts $30_1$, and $30_2$. For example, the first electrode $31_1$ of the light emitting part $30_1$ may be made of copper (Cu), and the first electrode $31_2$ of the light emitting part $30_2$ and the first electrode $31_3$ of the light emitting part $30_3$ may be made of aluminum (Al). In the eighth example, for example, the seventh example is applied to the light emitting parts $30_1$ and $30_2$, and the first example is applied to the light emitting part $30_3$. The thicknesses of the first electrodes $31_1$, $31_2$, and $31_3$ may be different or the same.

Further, the present disclosure may also have the following configurations.

[A01]<<Display Device>>

A display device having a display panel provided with a plurality of light emitting elements, each of the light emitting elements including:
- a light emitting part; and
- a lens member through which light emitted from the light emitting part passes, wherein
- when a distance between a normal passing through a center of the light emitting part and a normal passing through a center of the lens member is defined as $D_0$, a value of the distance $D_0$ is not 0 in at least some of the light emitting elements provided in the display panel.

[A02] The display device according to [A01], wherein a reference point is assumed, and the distance $D_0$ depends on a distance $D_1$ from the reference point to the normal passing through the center of the light emitting part.

[A03] The display device according to [A01] or [A02], wherein a reference point is assumed to be in the display panel.

[A04] The display device according to [A03], wherein the reference point is not located in a central region of the display panel.

[A05] The display device according to [A03] or [A04], wherein a plurality of reference points are assumed.

[A06] The display device according to [A03], wherein in a case in which one reference point is assumed, the reference point is not included in the central region of the display panel, and in a case in which a plurality of reference points are assumed, at least one reference point is not included in the central region of the display panel.

[A07] The display device according to [A01] or [A02], wherein the reference point is assumed to be outside the display panel.

[A08] The display device according to [A07], wherein a plurality of reference points reference points are assumed.

[A09] The display device according to any one of [A01] to [A08], wherein light emitted from each light emitting element and passing through the lens member converges on a certain region of a space outside the display device.

[A10] The display device according to any one of [A01] to [A08], wherein light emitted from each light emitting element and passing through the lens member is diverged in a space outside the display device.

[A11] The display device according to any one of [A01] to [A06], wherein light emitted from each light emitting element and passing through the lens member is parallel light.

[A12] The display device according to any one of [A01] to [A11], wherein a reference point is set,
a plurality of light emitting elements are arranged in a first direction and a second direction different from the first direction, and
when a distance from the reference point to a normal passing through the center of the light emitting part is defined as $D_1$, values of the distance $D_0$ in the first direction and the second direction are defined as $D_{0\text{-}X}$ and $D_{0\text{-}Y}$, and values of the distance $D_1$ in the first direction and the second direction are defined as $D_{1\text{-}X}$ and $D_{1\text{-}Y}$,
$D_{0\text{-}X}$ changes linearly with respect to a change of $D_{1\text{-}X}$, and $D_{0\text{-}Y}$ changes linearly with respect to a change of $D_{1\text{-}Y}$, or
$D_{0\text{-}X}$ changes linearly with respect to the change of $D_{1\text{-}X}$, and $D_{0\text{-}Y}$ changes non-linearly with respect to the change of $D_{1\text{-}Y}$, or
$D_{0\text{-}X}$ changes non-linearly with respect to the change of $D_{1\text{-}X}$, and $D_{0\text{-}Y}$ changes linearly with respect to the change of $D_{1\text{-}Y}$, or
$D_{0\text{-}X}$ changes non-linearly with respect to a change of $D_{1\text{-}X}$, and $D_{0\text{-}Y}$ changes non-linearly with respect to a change of $D_{1\text{-}Y}$.

[A13] The display device according to any one of [A01] to [A12], wherein a reference point is set, and
when a distance from the reference point to the normal passing through the center of the light emitting part is defined as $D_1$, the value of the distance $D_0$ increases as a value of the distance $D_1$ increases.

[A14] The display device according to any one of [A01] to [A13], wherein a color filter layer is provided on a light incident side or a light emitting side of the lens member.

[A15] The display device according to [A14], wherein an orthographic projection image of the lens member coincides with an orthographic projection image of the color filter layer, or is included in the orthographic projection image of the color filter layer.

[A16] The display device according to [A14] or [A15], wherein in the light emitting element in which the value of the distance $D_0$ is not 0, a normal passing through a center of the color filter layer and the normal passing through the center of the light emitting part coincide with each other.

[A17] The display device according to [A14] or [A15], wherein in the light emitting element in which the value of the distance $D_0$ is not 0, a normal passing through a center of the color filter layer and the normal passing through the center of the lens member coincide with each other.

[A18] The display device according to [A14], wherein
an orthographic projection image of the lens member is included in an orthographic projection image of the color filter layer, and
in the light emitting element in which the value of the distance $D_0$ is not 0, a normal passing through a center of the color filter layer and the normal passing through the center of the light emitting part coincide with each other.

[A19] The display device according to [A14], wherein
an orthographic projection image of the lens member is included in an orthographic projection image of the color filter layer, and
in the light emitting element in which the value of the distance $D_0$ is not 0, a normal passing through a center of the color filter layer and the normal passing through the center of the lens member coincide with each other.

[A20] The display device according to [A14], wherein
an orthographic projection image of the lens member coincides with an orthographic projection image of the color filter layer, and
in the light emitting element in which the value of the distance $D_0$ is not 0, a normal passing through a center of the color filter layer and the normal passing through the center of the lens member coincide with each other.

[A21] The display device according to any one of [A14] to [A17], wherein a light absorption layer is formed between the color filter layers of the adjacent light emitting elements.

[A22] The display device according to any one of [A01] to [A21], wherein a light absorption layer is formed between the adjacent lens members.

[A23] The display device according to any one of [A01] to [A22], wherein the light emitting part provided in the light emitting element includes an organic electroluminescence layer.

REFERENCE SIGNS LIST 10, 10R, 10G, 10B Light emitting element
11 First substrate
20 Transistor
21 Gate electrode
22 Gate insulating layer
23 Channel formation region
24 Source and drain region
25 Element separation region
26 Substrate
27 Contact plug
28 Insulating layer
30 Light emitting part
31 First electrode
32 Second electrode
33 Organic layer
34 Protective layer
35 Flattening layer
35' Flattening film
36 Sealing resin layer
37 Light reflecting layer
38 Interlayer insulating layer
39 Base film
41 Second substrate
50 Lens member (on-chip micro lens)
60 Lens member forming layer
61 Resist material layer
$CF_R$, $CF_G$, $CF_B$ Color filter layer
BM, BM' Black matrix layer

The invention claimed is:

1. A display device comprising:
a display panel provided with a plurality of light emitting elements, each of the light emitting elements including:
a light emitting part;
a lens member through which light emitted from the light emitting part passes,
wherein an offset region exists between the lens member and a neighboring lens member, the lens member being offset from the neighboring lens member by the offset region; and
a color filter provided on a light incidence side or a light emitting side of the lens member, wherein
a first surface of the color filter is in direct contact with a first neighboring surface of a neighboring color filter in an overlap region that corresponds to the offset region in a stacking direction, the first surface and the first neighboring surface extending in the stacking direction and a second direction, and the neighboring color filter being distinct from the color filter,
a second surface of the color filter is in direct contact with a second neighboring surface of the neighboring color filter in the overlap region that corresponds to the offset region in the stacking direction, the second surface and the second neighboring surface extending in the second direction and a first direction that is different from the stacking direction,
the lens member has a first side closest to the light emitting part and a second side farthest from the light emitting part, the second side has an apex, and
when a distance between a first normal passing through a center of the light emitting part and a second normal passing through a center of the lens member is $D_0$, a value of the distance $D_0$ is not 0 in at least some of the light emitting elements provided in the display panel.

2. The display device according to claim 1, wherein a reference point is assumed, and the distance $D_0$ depends on a distance $D_1$ from the reference point to the first normal passing through the center of the light emitting part.

3. The display device according to claim 1, wherein a reference point is assumed to be in the display panel.

4. The display device according to claim 3, wherein the reference point is not located in a central region of the display panel.

5. The display device according to claim 3, wherein a plurality of reference points are assumed.

6. The display device according to claim 3, wherein, when one reference point is assumed, the reference point is not included in a central region of the display panel, and when a plurality of reference points are assumed, at least one reference point is not included in the central region of the display panel.

7. The display device according to claim 1, wherein a reference point is assumed to be outside the display panel.

8. The display device according to claim 7, wherein a plurality of reference points are assumed.

9. The display device according to claim 1, wherein light emitted from each light emitting element and passing through the lens member converges on a certain region of a space outside the display device.

10. The display device according to claim 1, wherein light emitted from each light emitting element and passing through the lens member diverges in a space outside the display device.

11. The display device according to claim 1, wherein light emitted from each light emitting element and passing through the lens member is parallel light.

12. The display device according to claim 1, wherein
a reference point is set,
a plurality of light emitting elements are arranged in the first direction and the second direction different from the first direction, and
when a distance from the reference point to a normal passing through the center of the light emitting part is defined as $D_1$, values of the distance $D_0$ in the first direction and the second direction are defined as $D_{0-X}$ and $D_{0-Y}$, respectively, and values of the distance $D_1$ in the first direction and the second direction are defined as $D_{1-X}$ and $D_{1-Y}$, respectively,
$D_{0-X}$ changes linearly with respect to a change of $D_{1-X}$, and $D_{0-Y}$ changes linearly with respect to a change of $D_{1-Y}$, or
$D_{0-X}$ changes linearly with respect to the change of $D_{1-X}$, and $D_{0-Y}$ changes non-linearly with respect to the change of $D_{1-Y}$, or
$D_{0-X}$ changes non-linearly with respect to the change of $D_{1-X}$, and $D_{0-Y}$ changes linearly with respect to the change of $D_{1-Y}$, or $D_{0-X}$ changes non-linearly with respect to a change of $D_{1-X}$, and $D_{0-Y}$ changes non-linearly with respect to a change of $D_{1-Y}$.

13. The display device according to claim 1, wherein
a reference point is set, and
when a distance from the reference point to the first normal passing through the center of the light emitting part is defined as $D_1$, the value of the distance $D_0$ increases as a value of the distance $D_1$ increases.

14. The display device according to claim 1, wherein a color filter layer is provided on the light incidence side or the light emitting side of the lens member, and wherein the color filter layer includes the first color filter, the second color filter, and the third color filter.

15. The display device according to claim 14, wherein an orthographic projection image of the lens member coincides with an orthographic projection image of the color filter layer, or is included in the orthographic projection image of the color filter layer.

16. The display device according to claim 14, wherein, in the light emitting element in which the value of the distance $D_0$ is not 0, a normal passing through a center of the color filter layer and the first normal passing through the center of the light emitting part coincide with each other.

17. The display device according to claim 14, wherein, in the light emitting element in which the value of the distance $D_0$ is not 0, a normal passing through a center of the color filter layer and the second normal passing through the center of the lens member coincide with each other.

18. The display device according to claim 14, wherein a light absorption layer is formed between the color filter layer and adjacent light emitting elements.

19. The display device according to claim 1, wherein a light absorption layer is formed between adjacent lens members.

20. The display device according to claim 1, wherein the light emitting part provided in the light emitting element includes an organic electroluminescence layer.

\* \* \* \* \*